US008182975B2

(12) United States Patent
Hirano

(10) Patent No.: US 8,182,975 B2
(45) Date of Patent: May 22, 2012

(54) POSITIVE RESIST COMPOSITION AND PATTERN FORMING METHOD USING THE SAME

(75) Inventor: Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 583 days.

(21) Appl. No.: 12/055,413

(22) Filed: Mar. 26, 2008

(65) Prior Publication Data

US 2008/0248419 A1 Oct. 9, 2008

(30) Foreign Application Priority Data

Mar. 28, 2007 (JP) ................................ 2007-085210
Jan. 21, 2008 (JP) ................................ 2008-010428

(51) Int. Cl.
*G03F 7/004* (2006.01)
*G03F 7/038* (2006.01)

(52) U.S. Cl. ......... 430/270.1; 430/326; 526/93; 526/97; 526/100; 526/124

(58) Field of Classification Search ............... 430/270.1, 430/285.1, 326; 526/100, 124.6, 134, 149, 526/151, 166, 170, 180, 181, 93, 97
See application file for complete search history.

(56) References Cited

U.S. PATENT DOCUMENTS 4,202,834 A * 5/1980 Gruber et al. ................. 558/400
4,491,628 A 1/1985 Ito et al.
5,962,187 A * 10/1999 Takeda ....................... 430/270.1
6,022,665 A * 2/2000 Watanabe et al. .......... 430/270.1
6,384,169 B1 5/2002 Watanabe et al.
6,613,844 B2 9/2003 Watanabe et al.
6,864,325 B2 * 3/2005 Zedda et al. ............... 525/332.1
2003/0013832 A1 1/2003 Watanabe et al.
2004/0171777 A1 9/2004 Le et al.
2006/0166136 A1 7/2006 Kanda
2006/0172228 A1 8/2006 Wada
2006/0217519 A1 * 9/2006 Benoit et al. .................. 528/176
2006/0247400 A1 * 11/2006 Sounik et al. .............. 526/218.1
2008/0085464 A1 * 4/2008 Shibuya et al. ............ 430/270.1

FOREIGN PATENT DOCUMENTS

EP 0908473 A1 4/1999
EP 1684119 A2 7/2006
EP 1736824 A2 12/2006
EP 1972641 A2 9/2008
JP 5-249682 A 9/1993
JP 9-211866 A 8/1997
JP 11236416 A 8/1999
JP 2000-352822 A 12/2000
JP 2002-49156 A 2/2002
JP 2003 342306 A 3/2003
JP 2003 301006 A 10/2003
JP 2005-156726 A 6/2005
JP 2006 208781 A 8/2006
JP 2006 227608 A 8/2006
JP 2007-65504 A 3/2007
WO 98/01478 A1 1/1998
WO 2005003198 A1 1/2005

OTHER PUBLICATIONS

Partial European Search Report issued in European patent Application No. 08005790.4-2222 dated Jan. 7, 2010.
Office Action dated Feb. 21, 2012 in Japanese Patent Application No. 2008-010428.

* cited by examiner

*Primary Examiner* — Anca Eoff
(74) *Attorney, Agent, or Firm* — Sughrue Mion, PLLC

(57) ABSTRACT

A positive resist composition, includes: (A) a resin that has a group having absorption at 248 nm at a main chain terminal of the resin (A), and a pattern forming method uses the composition.

21 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitably usable in the production of a resist for implantation, a semiconductor integrated circuit device, a mask for integrated circuit production, a printed wiring board, a liquid crystal panel, and the like.

2. Description of the Related Art

An early chemical amplification-type positive composition comprising a photoacid generator and a resin protected by an acid-decomposable group is disclosed, for example, in U.S. Pat. No. 4,491,628. This chemical amplification-type positive resist composition is a pattern forming material of forming a pattern on a substrate by producing an acid in the exposed area upon irradiation with radiation such as far ultraviolet light and through a reaction using the acid as the catalyst, causing the area irradiated with actinic radiation and the area not irradiated therewith to change the solubility in a developer.

Various positive resist compositions containing a resin protected by an acid-decomposable group have been heretofore known, and for example, JP-A-5-249682 (the term "JP-A" as used herein means an "unexamined published Japanese patent application") discloses a resist composition using a polyhydroxystyrene resin protected by an alkoxy (acetal) group, JP-A-9-211866 discloses a resist composition using a polyhydroxystyrene resin protected by two different acid-decomposable groups, JP-A-2000-352822 discloses a resist composition using a resin protected by an acetal group having a heterocyclic group at the terminal through a linking group, and JP-A-2002-49156 discloses a resist composition using a polyhydroxystyrene resin protected by two different acetal groups.

However, in the case of using a high-reflection substrate as it is without applying an antireflection film, for example, in the case of forming a pattern for implantation such as ion injection, the positive resist composition in general produces a strong standing wave and is demanded to be improved in this respect. Improvements are demanded also in the sensitivity and resolution.

SUMMARY OF THE INVENTION

An object of the present invention is to provide a chemical amplification-type positive resist composition with high sensitivity and high resolution, ensuring that even when a high-reflection substrate is used as it is without applying an anti-reflection film, generation of a standing wave is suppressed and a rectangular profile is obtained.

The present inventors have made intensive studies, as a result, the object of the present invention has been achieved by the following constructions.

(1) A positive resist composition, comprising:

(A) a resin that has a group having absorption at 248 nm at a main chain terminal of the resin (A).

(2) The positive resist composition as described in (1) above, wherein the resin (A) has a molar extinction coefficient ϵ at 248 nm of 200 or more in a tetrahydrofuran solution at 23° C.

(3) The positive resist composition as described in (1) or (2) above, wherein the main chain terminal of the resin (A) is represented by any of formulae (M'-1) to (M'-5):

(M'-1)

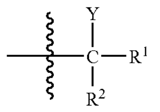

(M'-2)

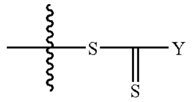

(M'-3)

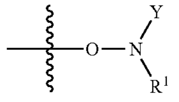

(M'-4)

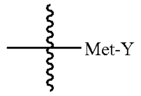

(M'-5)

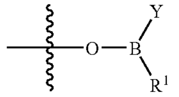

wherein Y represents a group having absorption at 248 nm;

$R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Met represents a metal atom.

(4) The positive resist composition as described in any of (1) to (3) above, wherein the group having absorption at 248 nm has at least one benzene ring.

(5) The positive resist composition as described in any of (1) to (4) above, wherein the group having absorption at 248 nm has at least two benzene rings.

(6) The positive resist composition as described in any of (1) to (5) above, wherein the resin (A) decomposes under an action of an acid to increase a solubility of the resin (A) in an alkali developer.

(7) The positive resist composition as described in any of (1) to (6) above, wherein the resin (A) contains at least one of a repeating unit represented by formula (A1) and a repeating unit represented by formula (A2):

(A1)

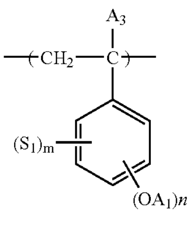

-continued (A2)

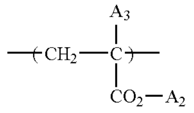

wherein in formula (A1), n represents an integer of 0 to 5, m represents an integer of 0 to 5, provided that m+n≦5;

$A_1$ represents a hydrogen atom or a group containing a group capable of decomposing under an action of an acid, and when a plurality of $A_1$'s are present, the plurality of $A_1$'s may be the same or different; and $S_1$ represents a substituent, and when a plurality of $S_1$'s are present, the plurality of $S_1$'s may be the same or different;

in formula (A2), $A_2$ represents a group containing a group capable of decomposing under an action of an acid; and in formulae (A1) and (A2), $A_3$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

(8) The positive resist composition as described in any of (1) to (7) above, which further comprises:

(B) a compound capable of generating an acid upon irradiation with actinic rays or radiation.

(9) The positive resist composition as described in any of (1) to (8) above, which further comprises:

a compound having a proton acceptor functional group and undergoing decomposition upon irradiation with actinic rays or radiation to generate a compound reduced in or deprived of a proton acceptor property or changed to be acidic from being proton acceptor-functioning.

(10) The positive resist composition as described in any of (1) to (9) above, wherein the resin (A) has a weight average molecular weight (Mw) of from 1,000 to 200,000.

(11) The positive resist composition as described in any of (1) to (10) above, wherein the resin (A) has a weight average molecular weight (Mw) of from 1,000 to 100,000.

(12) The positive resist composition as described in any of (1) to (11) above, wherein the resin (A) has a weight average molecular weight (Mw) of from 1,000 to 50,000.

(13) The positive resist composition as described in any of (1) to (12) above, wherein the resin (A) has a weight average molecular weight (Mw) of from 1,000 to 25,000.

(14) The positive resist composition as described in any of (1) to (13) above, which further comprises:

(C) an organic basic compound.

(15) The positive resist composition as described in any of (1) to (14) above, which further comprises:

(D) a surfactant.

(16) The positive resist composition as described in any of (1) to (15) above, which further comprises:

a solvent.

(17) The positive resist composition as described in (16) above, wherein the solvent contains propylene glycol monomethyl ether acetate.

(18) The positive resist composition as described in (17) above, wherein the solvent further contains propylene glycol monomethyl ether.

(19) The positive resist composition as described in any of (1) to (18) above, which is exposed by an irradiation with KrF, electron beam, X-ray or EUV.

(20) A pattern forming method, comprising:

forming a resist film from the positive resist composition as described in any of (1) to (19) above; and exposing and developing the resist film.

DETAILED DESCRIPTION OF THE INVENTION

The present invention is described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The positive resist composition of the present invention comprises (A) a resin having at the main chain terminal thereof a group having absorption at 248 nm.

The components blended in the positive resist composition of the present invention are described below.

[1] Resin (A)

The resist composition of the present invention comprises (A) a resin having at the main chain terminal thereof a group having absorption at 248 nm.

The group having absorption at 248 nm may be any group as long as it has absorption at 248 nm to a certain extent, but higher absorption is preferred.

The group having at least absorption at 248 nm indicates, for example, a group having at least one benzene ring or at least a hetero ring and is preferably a group further having a conjugated double bond (including a carbonyl group) or a group having two or more benzene rings.

The group having at least absorption at 248 nm is more preferably a group having from one to three benzene rings.

Incidentally, the number of benzene rings corresponds to the number of benzene rings appearing in the structural formula and, for example, the number of benzene rings is 2 in naphthalene, 3 in anthracene, 1 in phthalimide ring and 1,4-naphthoquinone ring, 2 in biphenyl structure, benzophenone structure, diphenylether structure and phenyl benzoate structure, and 3 in terphenyl structure.

The resin may have an arbitrary substituent on the benzene ring, and the substituent is preferably a substituent conjugated with the benzene ring (hereinafter referred to as a conjugated substituent).

The conjugated substituent is preferably a group represented by any one of the following formulae (a) to (e).

(a)

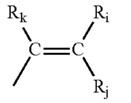

(b)

(c)

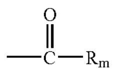

-continued

—CN (d)

—$NO_2$ (e)

In formulae (a) to (e), $R_i$, $R_j$, $R_k$, $R_l$ and $R_m$, which may be the same or different, each represents an arbitrary substituent, and examples thereof include an alkyl group, an alkoxy group, an acyl group, an acyloxy group, an aryl group, an aryloxy group, an aralkyl group, an aralkyloxy group, a hydroxy group, a halogen atom, a cyano group, a nitro group, a sulfonylamino group, an alkylthio group, an arylthio group, and an aralkylthio group. For example, the alkyl group and cycloalkyl group are preferably a linear or branched alkyl group and a cycloalkyl group each having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group, and dodecyl group. These groups each may further has a substituent.

Examples of the substituent which these groups each may further have include an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. The substituent is preferably a substituent having a carbon number of 12 or less.

Examples of the alkyl group having a substituent include a cyclohexylethyl group, an alkylcarbonyloxymethyl group, an alkylcarbonyloxyethyl group, a cycloalkyl-carbonyloxymethyl group, a cycloalkylcarbonyloxyethyl group, an arylcarbonyloxyethyl group, an aralkylcarbonyloxyethyl group, an alkyloxymethyl group, a cycloalkyloxymethyl group, an aryloxymethyl group, an aralkyloxymethyl group, an alkyloxyethyl group, a cycloalkyloxyethyl group, an aryloxyethyl group, an aralkyloxyethyl group, an alkylthiomethyl group, a cycloalkylthiomethyl group, an arylthiomethyl group, an aralkylthiomethyl group, an alkylthioethyl group, a cycloalkylthioethyl group, an arylthioethyl group and an aralkylthioethyl group.

The alkyl group and cycloalkyl group in these groups are not particularly limited and each may further have the above-described substituent such as alkyl group, cycloalkyl group and alkoxy group.

Examples of the alkylcarbonyloxyethyl group and cycloalkylcarbonyloxyethyl group include a cyclohexylcarbonyloxyethyl group, a tert-butylcyclohexylcarbonyloxyethyl group and an n-butylcyclohexylcarbonyloxyethyl group.

The aryl group is also not particularly limited but generally includes an aryl group having a carbon number of 6 to 14, such as phenyl group, xylyl group, toluyl group, cumenyl group, naphthyl group and anthracenyl group, and may further have the above-described substituent such as alkyl group, cycloalkyl group and alkoxy group.

Examples of the aryloxyethyl group include a phenyloxyethyl group and a cyclohexylphenyloxyethyl group. These groups each may further have a substituent.

The aralkyl group is also not particularly limited but examples thereof include a benzyl group.

Examples of the aralkylcarbonyloxyethyl group include a benzylcarbonyloxyethyl group. These groups each may further have a substituent.

Among the conjugated substituents (a) to (e), preferred are (a), (b) and (c), and more preferred is (c).

The number of atoms constituting the group containing a group having absorption at 248 nm is preferably 100 or less, more preferably 50 or less.

Examples of the group include an arylcarbonyl group, a heteroarylcarbonyl group, a condensed aryl group, a condensed heteroaryl group, a condensed arylcarbonyl group, a condensed heteroarylcarbonyl group, an arylcarbonyl group-containing alkyl group, a condensed aryl group-containing alkyl group, a condensed arylcarbonyl group-containing alkyl group, a heteroarylcarbonyl group-containing alkyl group, a condensed heteroaryl group-containing alkyl group, and a condensed heteroarylcarbonyl group-containing alkyl group.

Also, the group is not limited to an aromatic ring such as phenyl group, and even a hetero ring or the like may be used if it is a group having absorption at 248 nm. Also in this case, the group preferably further has a conjugated double bond (including a carbonyl group).

To speak specifically about the property of having absorption at 248 nm, the molar extinction coefficient $\epsilon$ at 248 nm of a compound containing a group having absorption at 248 nm is preferably 200 or more, more preferably from 200 to 500,000, still more preferably from 300 to 300,000, yet still more preferably from 500 to 200,000, and most preferably from 1,000 to 100,000. The molar extinction coefficient $\epsilon$ as used herein indicates a value in a tetrahydrofuran solution (23° C.).

In the present invention, the resin contains a group having absorption at 248 nm, so that the transmittance of a film after coating on a substrate for light at 248 nm can be controlled to a desired value. This allows to change the film thickness at the coating, and the transmittance can be controlled independent of the film thickness.

For example, the transmittance at 248 nm with a film thickness of 4,000 Å is 90% or less, preferably from 30 to 85%, more preferably from 35 to 80%, still more preferably from 38 to 78%, and most preferably from 40 to 75%.

Also, for example, the transmittance at 248 nm with a film thickness of 1,900 Å is 90% or less, preferably from 30 to 88%, more preferably from 40 to 85%, still more preferably from 50 to 83%, and most preferably from 60 to 80%.

The transmittance is preferably larger in view of resolution and sensitivity and is preferably smaller in the light of preventing standing waves. The film thickness is not limited to the above-described examples.

Examples of the method for introducing a group having at least absorption at 248 nm into the main chain include a method using an initiator having previously introduced thereinto a group having at least absorption at 248 nm, a method of treating the main chain terminal after polymerization to introduce a group having at least absorption at 248 nm, and a method of introducing a group having at least absorption at 248 nm after polymerization by utilizing a functional group at the main chain terminal.

There may be used a method of introducing a group having at least at 248 nm by utilizing a functional group of an azo-based initiator such as (2-(carbamoylazo)-isobutyronitrile) (V-30), 2,2'-azobis{2-methyl-N-[1,1-bis(hydroxymethyl)-2-hydroxyethyl]propionamide} (VA-080), 2,2'-azobis{2-methyl-N-[2-(1-hydroxybutyl)]propionamide (VA-085), 2,2'-azobis[2-methyl-N-(2-hydroxyethyl)-propion-amide] (VA-086), dimethyl 2,2'-azobis(2-methylpropionate) (V-601) and 4,4'-azobis(4-cyanobenzoic acid) (V-501). In these examples, trade names of Wako Pure Chemical Industries, Ltd. are shown in the parentheses.

The method using an initiator having previously introduced thereinto a group having at least absorption at 248 nm includes, for example, the following method using an azo-based initiator.

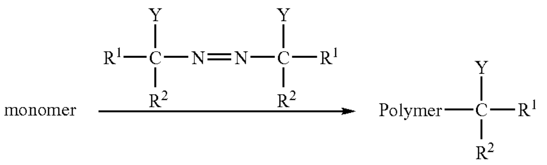

Y represents a group having at least absorption at 248 nm. $R^1$ and $R^2$ each represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

Details of the groups as $R^1$ and $R^2$ are the same as those of the groups as $A_3$ in formulae (A1) and (A2).

The method of treating the main chain terminal after polymerization to introduce a group having at least absorption at 248 nm includes the following method.

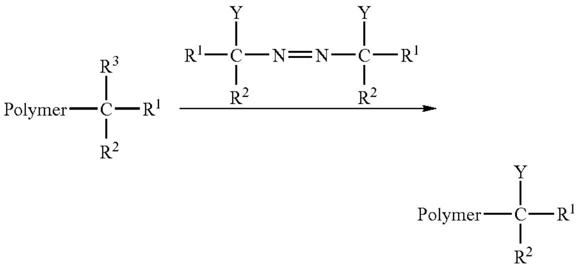

Y, $R^1$ and $R^2$ are the same as above, and $R^3$ is a group having the same meaning as $R^1$ and $R^2$.

The method of introducing a group having at least absorption at 248 nm after polymerization by utilizing a functional group at the main chain terminal includes, for example, the following method.

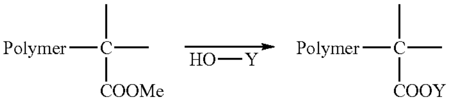

Y represents a group having at least absorption at 248 nm.

The group having at least absorption at 248 nm may also be introduced by using, for example, a dissociation-bonding type SFRP (Stable Free Radical Polymerization) agent or exchange-chain transfer type RAFT (Reversible Addition-Fragmentation Chain Transfer) agent containing a group having absorption at 248 nm. In general, when an SFRP agent or an RAFT agent is used for the polymerization, an SFRP agent or an RAFT agent is introduced into the main chain terminal of the polymer chain.

As for the synthesis of the RAFT agent or the like, various methods are known, and a desired compound can be synthesized using the method described, for example, in Japanese Patent 3,639,859.

Specific examples of the polymerization include, but are not limited to, radical polymerization, anionic polymerization, radical polymerization and living radical polymerization.

Examples of the initiator, SFRP agent and RAFT agent each containing a group having absorption at 248 nm are set forth below.

(I-1)

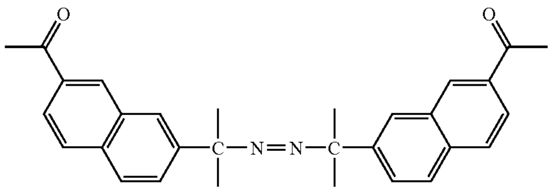

(I-2)

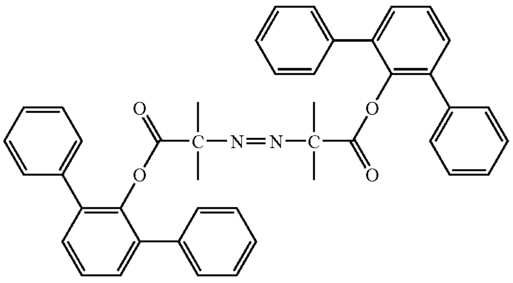

(I-3)

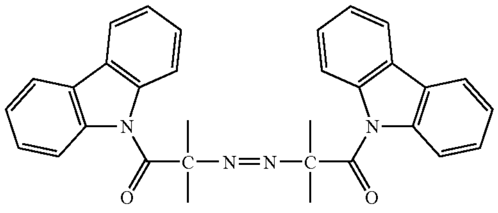

(I-4)

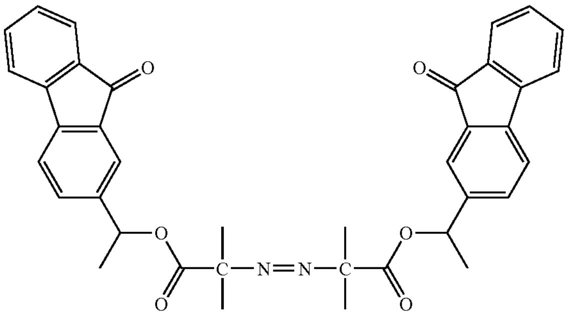

-continued
(I-5)
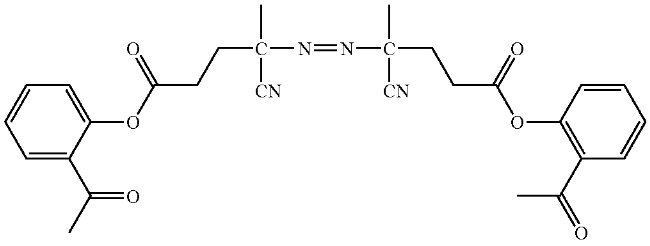
(I-6)
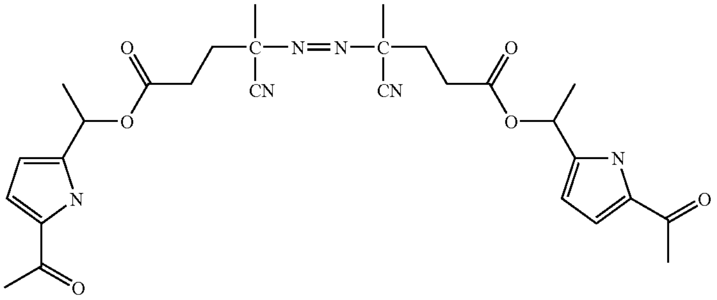
(I-7)
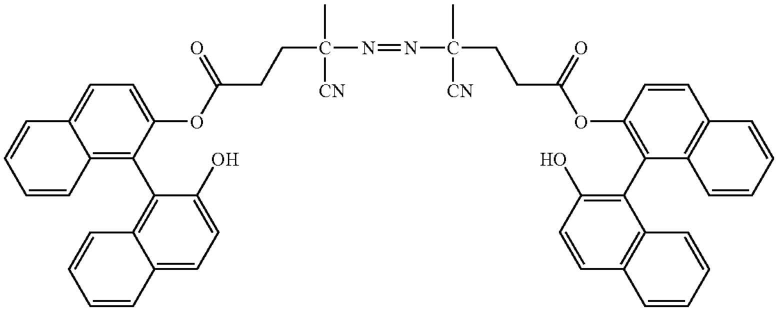
(I-8)
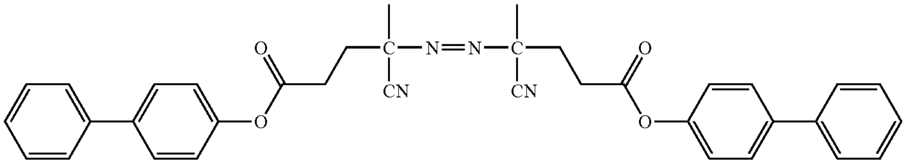
(I-9)
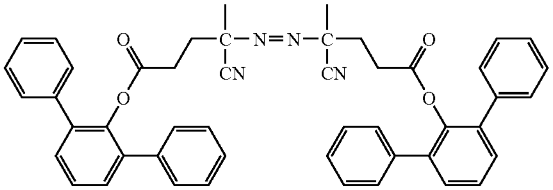
(I-10)
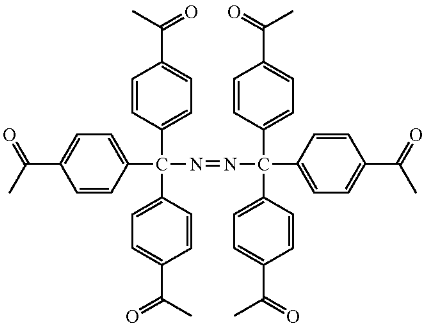
(I-11)
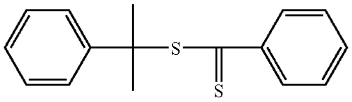
(I-12)
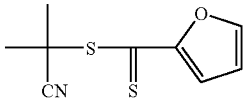
(I-13)
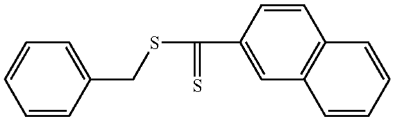
(I-14)
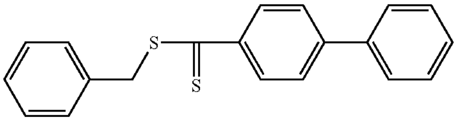

-continued
(I-15)
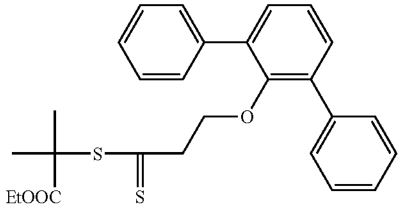
(I-16)
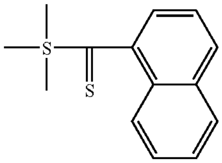
(I-17)
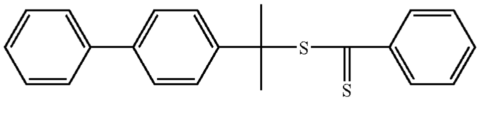
(I-18)
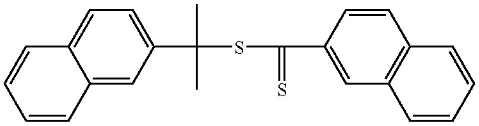
(I-19)
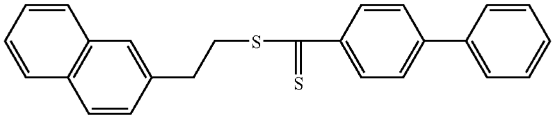
(I-20)
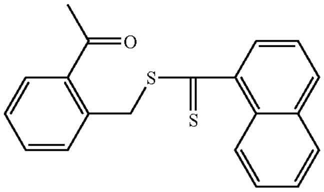
(I-21)
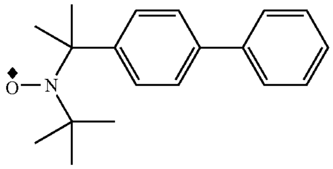
(I-22)
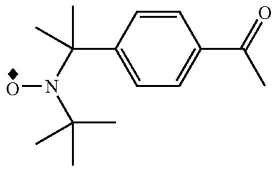
(I-23)
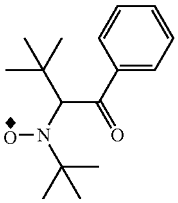
(I-24)
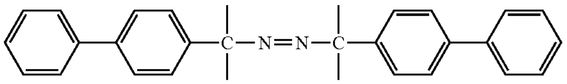
(I-25)
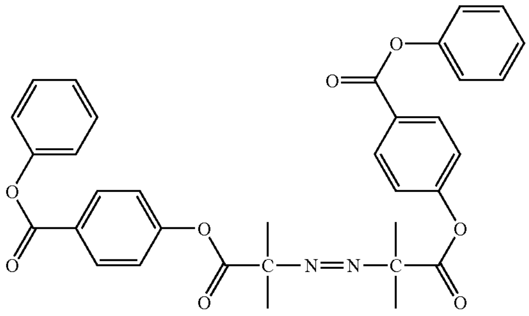
(I-26)
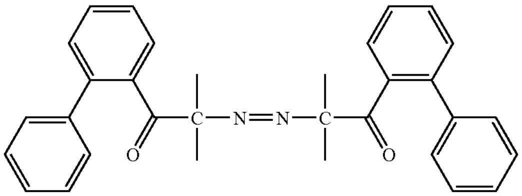
(I-27)
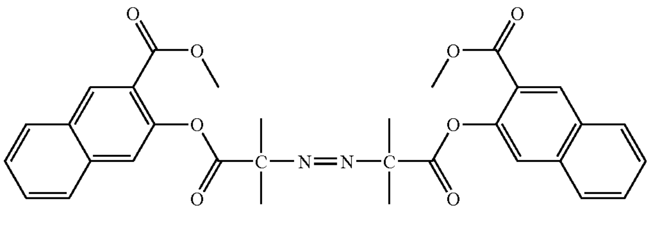

-continued
(I-28)
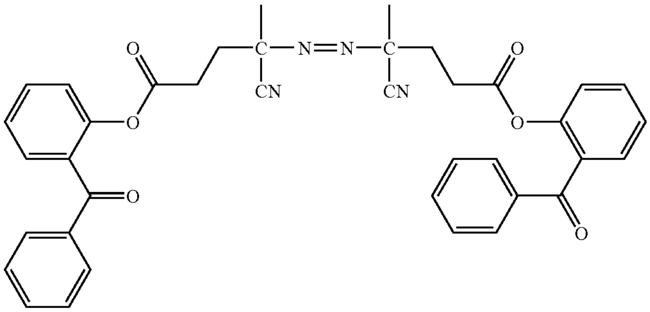
(I-29)
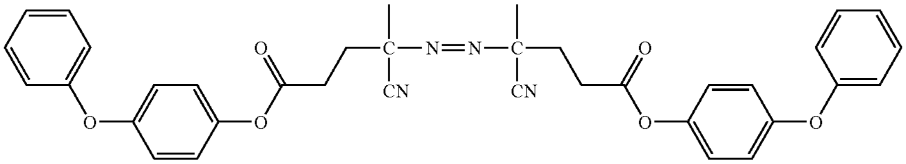
(I-30)
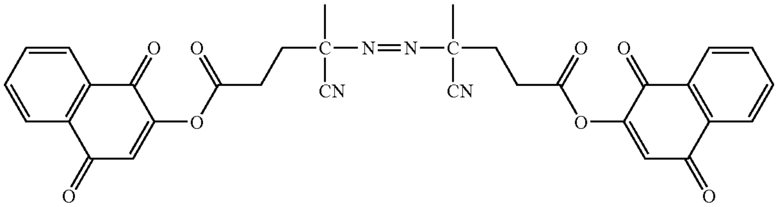
(I-31)
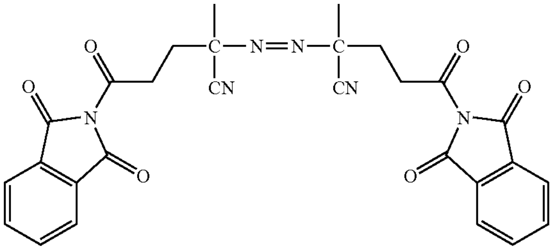
(I-32)
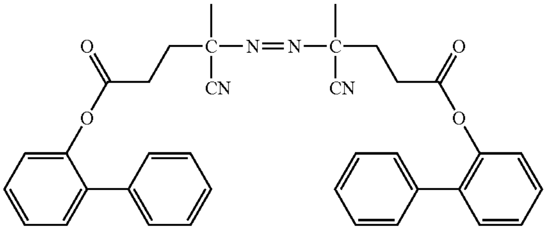
(I-33)
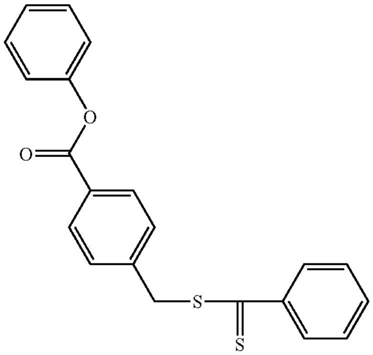
(I-34)
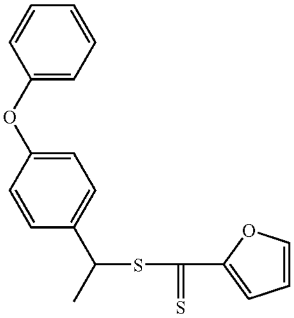
(I-35)
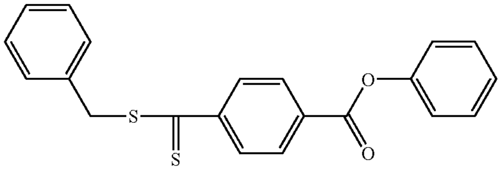
(I-36)
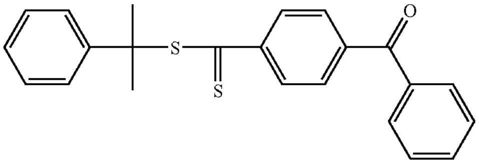

-continued
(I-37)
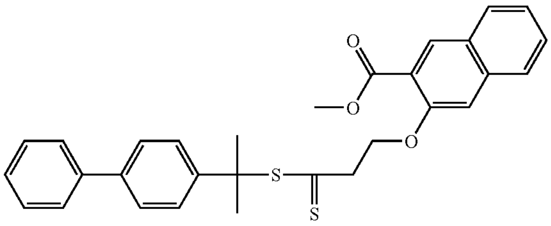
(I-38)
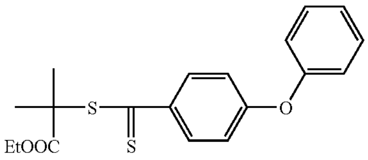
(I-39)
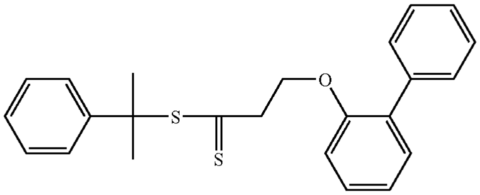
(I-40)
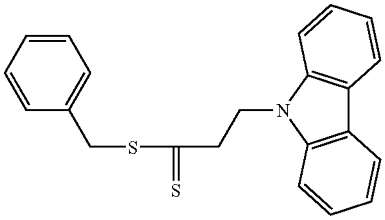
(I-41)
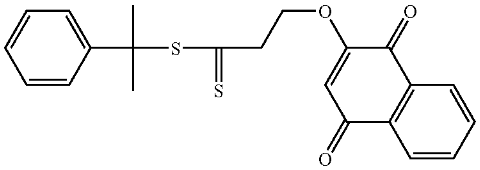
(I-42)
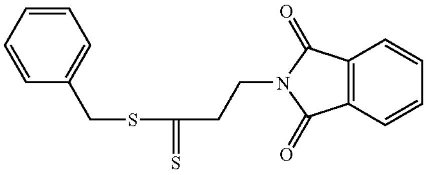
(I-43)
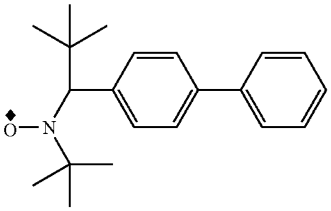
(I-44)
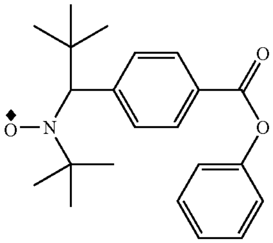
(I-45)
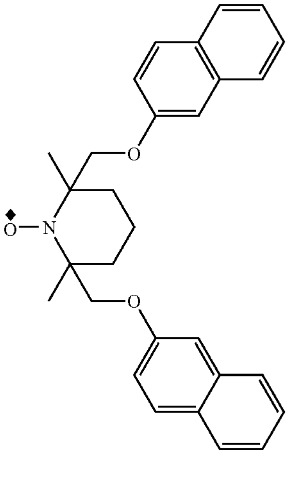

Examples of the formula of the main chain terminal include, but are not limited to, (M'-1) to (M'-5).

(M'-1)

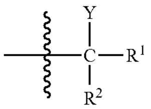

(M'-2)

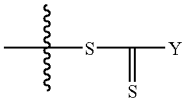

(M'-3)

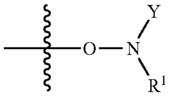

(M'-4)

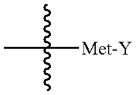

(M'-5)

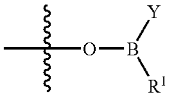

Y represents a group having at least absorption at 248 nm.

$R^1$ and $R^2$ each represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

Details of the groups as $R^1$ and $R^2$ are the same as those of the groups as $A_3$ in formulae (A1) and (A2).

Met represents a metal atom and is preferably Se, Te, Sb or Bi.

Among these formulae, (M'-1), (M'-2) and (M'-3) are preferred, and (M'-1) and (M'-2) are more preferred.

Specific examples of the main chain terminal are set forth below, but the present invention is not limited thereto.

(M-1)

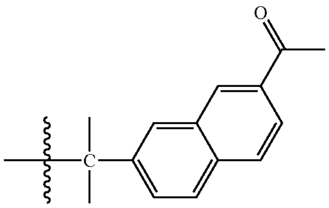

(M-2)

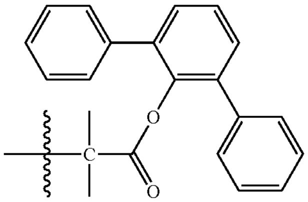

-continued (M-3)

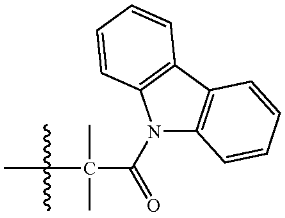

(M-4)

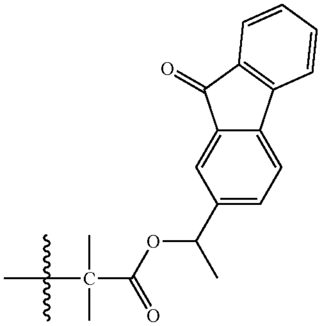

(M-5)

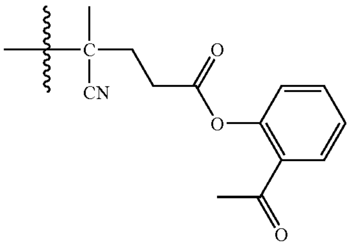

(M-6)

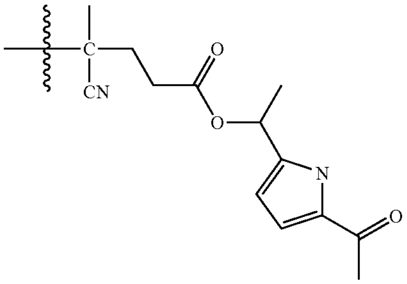

(M-7)

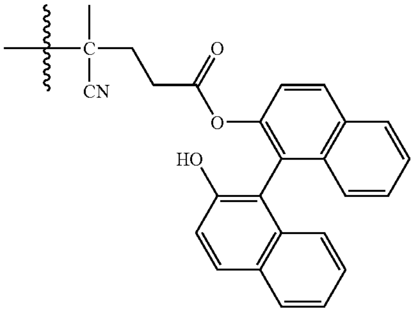

(M-8)

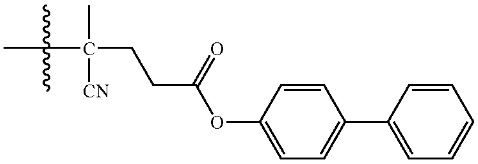

-continued
(M-9)
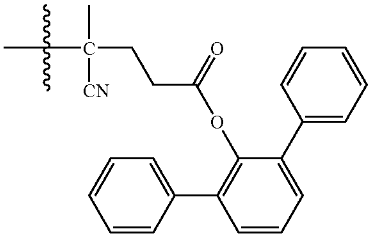
(M-10)
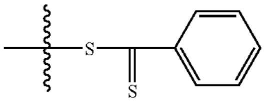
(M-11)
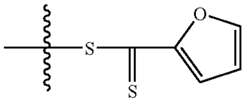
(M-12)
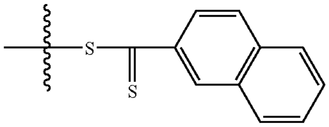
(M-13)
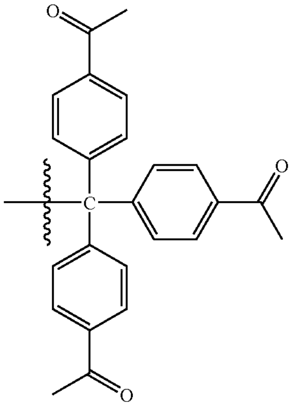
(M-14)
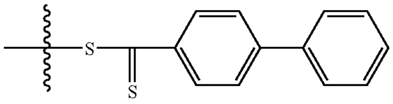
(M-15)
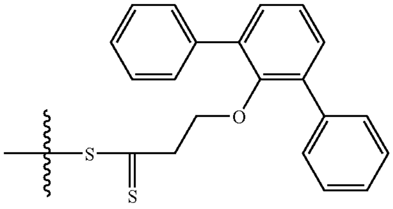
(M-16)
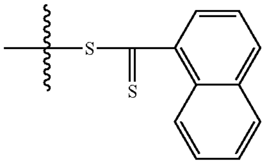
-continued
(M-17)
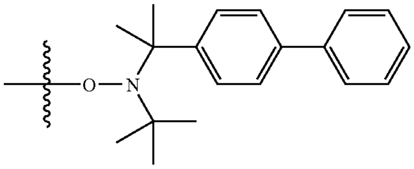
(M-18)
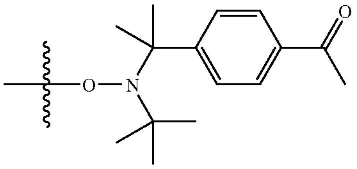
(M-19)
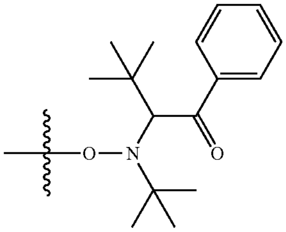
(M-20)
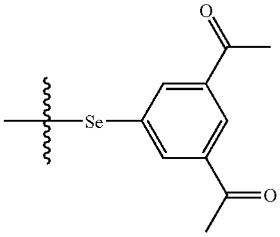
(M-21)
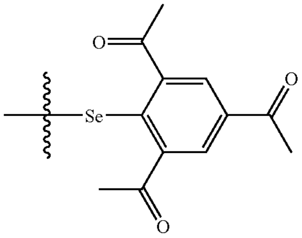
(M-22)
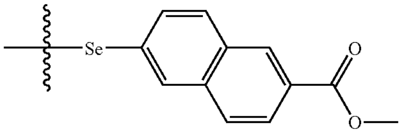
(M-23)
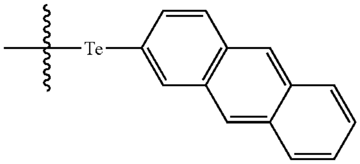
(M-24)
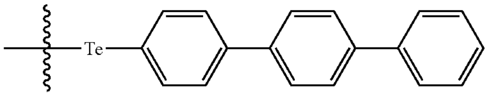

-continued
(M-25)
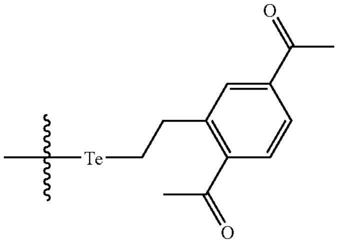
(M-26)
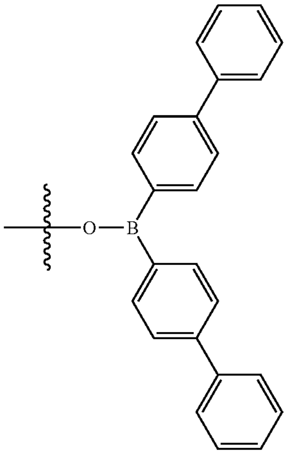
(M-27)
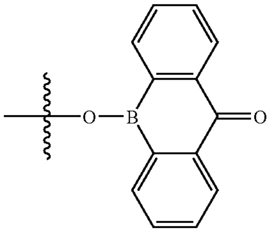
(M-28)
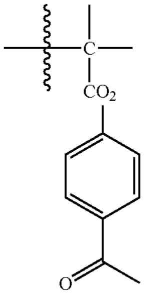
(M-29)
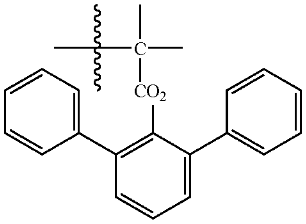
-continued
(M-30)
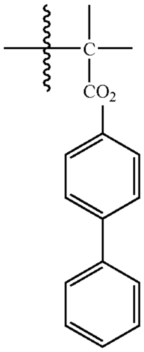
(M-31)
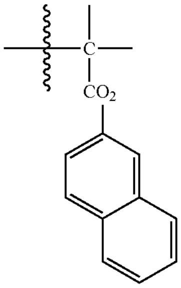
(M-32)
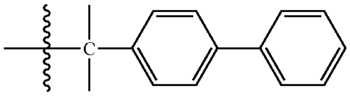
(M-33)
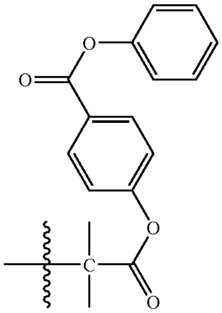
(M-34)
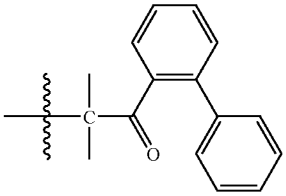
(M-35)
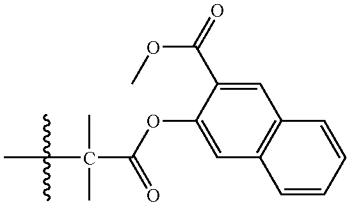

-continued
(M-36)
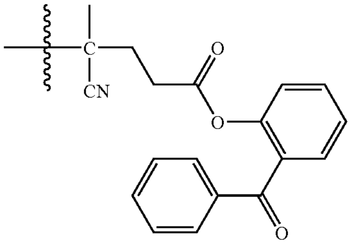
(M-37)
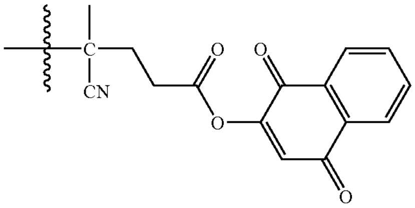
(M-38)
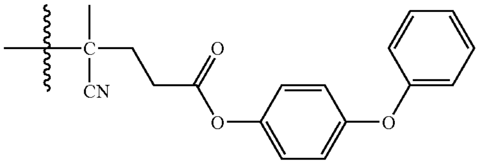
(M-39)
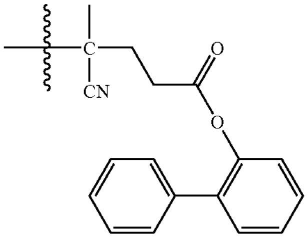
(M-40)
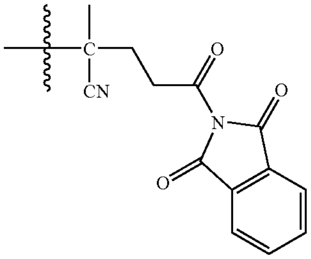
(M-41)
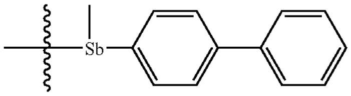
(M-42)
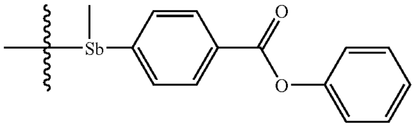
(M-43)
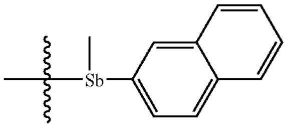
(M-44)
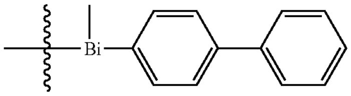
-continued
(M-45)
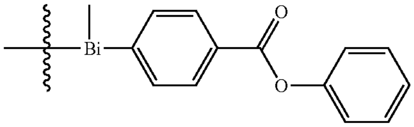
(M-46)
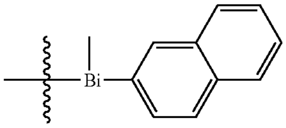
(M-47)
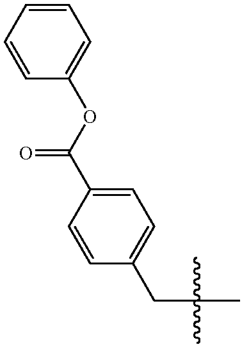
(M-48)
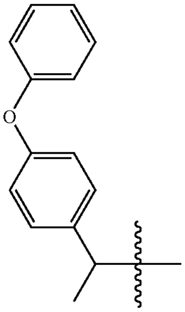
(M-49)
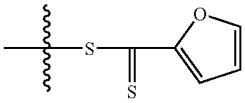
(M-50)
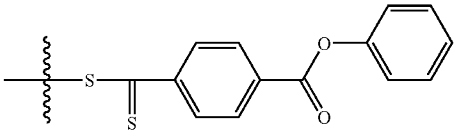
(M-51)
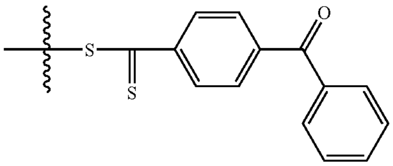
(M-52)
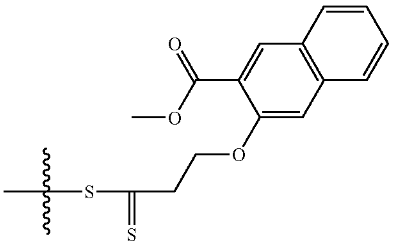

-continued (M-53)

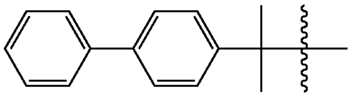

(M-54)

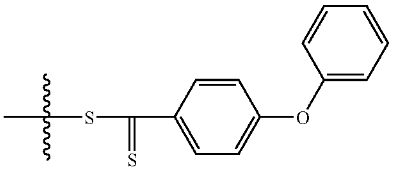

(M-55)

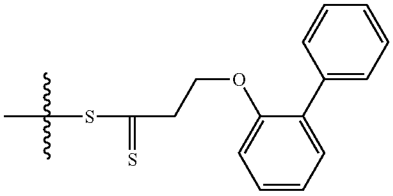

(M-56)

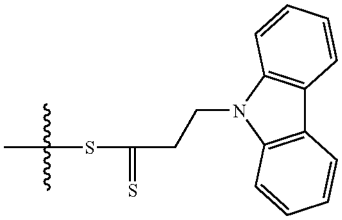

(M-57)

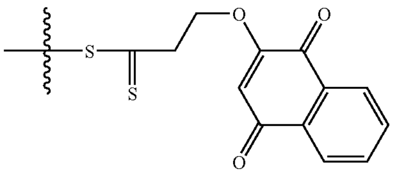

(M-58)

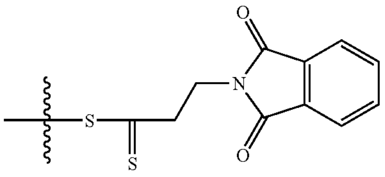

(M-59)

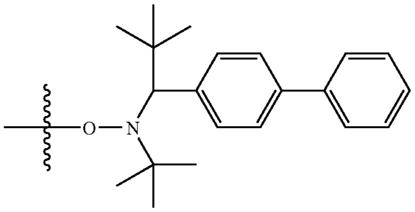

(M-60)

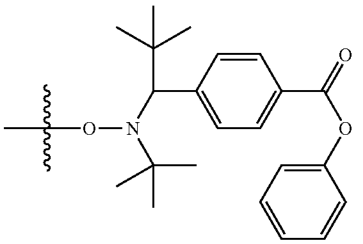

-continued (M-61)

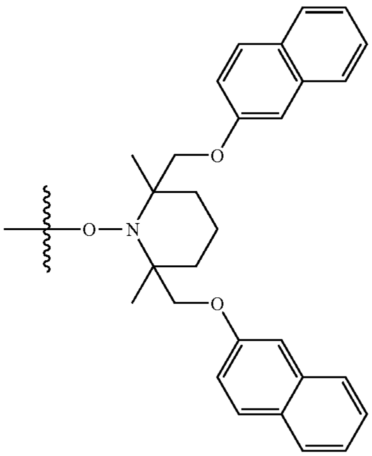

The resin (A) preferably contains at least one repeating unit out of a repeating unit represented by formula (A1) and a repeating unit represented by formula (A2)

(A1)

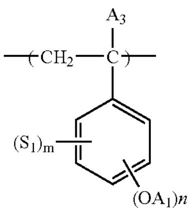

(A2)

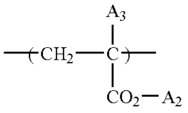

In formula (A1), n represents an integer of 0 to 5, and m represents an integer of 0 to 5, provided that m+n≦5.

$A_1$ represents a hydrogen atom or a group containing a group capable of decomposing under the action of an acid and when a plurality of $A_1$'s are present, these may be the same or different.

The group containing a group capable of decomposing under the action of an acid may be a group where as a result of leaving of $A_1$, a hydroxyl group is produced in the repeating unit represented by formula (A1), that is, an acid-decomposable group itself, or may be a group containing an acid-decomposable group, that is, a group which decomposes under the action of an acid to produce an alkali-soluble group such as hydroxyl group or carboxyl group in the residue bonded to the repeating unit.

Specific examples thereof include a tertiary alkyl group such as tert-butyl group and tert-amyl group, a tert-butoxycarbonyl group, a tert-butoxycarbonylmethyl group, and an acetal group as represented by —C($L_1$)($L_2$)-O—Z.

$L_1$ and $L_2$, which may be the same or different, each represents a hydrogen atom, an alkyl group, a cycloalkyl group or an aralkyl group.

Z represents an alkyl group, a cycloalkyl group or an aralkyl group.

Z and $L_1$ may combine with each other to form a 5- or 6-membered ring.

$S_1$ represents an arbitrary substituent and when a plurality of $S_1$'s are present, these may be the same or different. Examples thereof include an alkyl group, an alkoxy group, an acyl group, an acyloxy group, an aryl group, an aryloxy group, an aralkyl group, an aralkyloxy group, a hydroxy group, a halogen atom, a cyano group, a nitro group, a sulfonylamino group, an alkylthio group, an arylthio group and an aralkylthio group.

The alkyl group and cycloalkyl group are preferably a linear or branched alkyl group and a cycloalkyl group each having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group. These groups each may further have a substituent.

Preferred examples of the substituent which these groups each may further have include an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. The substituent is preferably a substituent having a carbon number of 12 or less.

Examples of the alkyl group having a substituent include a cyclohexylethyl group, an alkylcarbonyloxymethyl group, an alkylcarbonyloxyethyl group, a cycloalkyl-carbonyloxymethyl group, a cycloalkylcarbonyloxyethyl group, an arylcarbonyloxyethyl group, an aralkylcarbonyloxyethyl group, an alkyloxymethyl group, a cycloalkyloxymethyl group, an aryloxymethyl group, an aralkyloxymethyl group, an alkyloxyethyl group, a cycloalkyloxyethyl group, an aryloxyethyl group, an aralkyloxyethyl group, an alkylthiomethyl group, a cycloalkylthiomethyl group, an arylthiomethyl group, an aralkylthiomethyl group, an alkylthioethyl group, a cycloalkylthioethyl group, an arylthioethyl group and an aralkylthioethyl group.

The alkyl group and cycloalkyl group in these groups are not particularly limited and each may further have the above-described substituent such as alkyl group, cycloalkyl group and alkoxy group.

Examples of the alkylcarbonyloxyethyl group and cycloalkylcarbonyloxyethyl group include a cyclohexylcarbonyloxyethyl group, a tert-butylcyclohexylcarbonyloxyethyl group and an n-butylcyclohexylcarbonyloxyethyl group.

The aryl group is also not particularly limited but generally includes an aryl group having a carbon number of 6 to 14, such as phenyl group, xylyl group, toluyl group, cumenyl group, naphthyl group and anthracenyl group, and may further have the above-described substituent such as alkyl group, cycloalkyl group and alkoxy group.

Examples of the aryloxyethyl group include a phenyloxyethyl group and a cyclohexylphenyloxyethyl group. These groups each may further have a substituent.

The aralkyl group is also not particularly limited but examples thereof include a benzyl group.

Examples of the aralkylcarbonyloxyethyl group include a benzylcarbonyloxyethyl group. These groups each may further have a substituent.

The aralkyl group of $L_1$, $L_2$ and Z includes an aralkyl group having a carbon number of 7 to 15, such as benzyl group and phenethyl group. These groups each may further have a substituent.

Preferred examples of the substituent of the aralkyl group include an alkoxy group, a hydroxyl group, a halogen atom, a nitro group, an acyl group, an acylamino group, a sulfonylamino group, an alkylthio group, an arylthio group and an aralkylthio group. Examples of the aralkyl group having a substituent include an alkoxybenzyl group, a hydroxybenzyl group and a phenylthiophenethyl group.

The carbon number of the substituent which the aralkyl group of $L_1$, $L_2$ and Z may have is preferably 12 or less.

Examples of the 5- or 6-membered ring formed by combining Z and $L_1$ with each other include a tetrahydropyran ring and a tetrahydrofuran ring.

In the present invention, Z is preferably a linear or branched alkyl group. By virtue of this construction, the effect of the present invention is brought out more prominently.

$A_3$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group.

In formula (A2), $A_2$ represents a group containing a group capable of decomposing under the action of an acid.

The group containing a group capable of decomposing under the action of an acid may be a group where as a result of leaving of $A_2$, a carboxyl group is produced in the repeating unit represented by formula (A2), that is, an acid-decomposable group itself, or may be a group containing an acid-decomposable group, that is, a group which decomposes under the action of an acid to produce an alkali-soluble group such as hydroxyl group or carboxyl group in the residue bonded to the repeating unit.

$A_2$ is preferably a hydrocarbon group (preferably having a carbon number of 20 or less, more preferably from 4 to 12), more preferably a tert-butyl group, a tert-amyl group or an alicyclic structure-containing hydrocarbon group (for example, an alicyclic group itself, or a group with the alkyl group being substituted by an alicyclic group).

The alicyclic structure may be monocyclic or polycyclic. Specific examples thereof include a monocyclo, bicyclo, tricyclo or tetracyclo structure having a carbon number of 5 or more. The carbon number of the alicyclic structure is preferably from 6 to 30, more preferably from 7 to 25. These alicyclic structure-containing hydrocarbon groups each may have a substituent.

Examples of the alicyclic structure are set forth below.

(1)

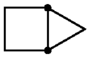

(2)

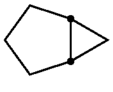

(3)

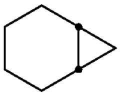

(4)

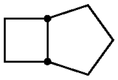

(5)

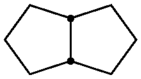

-continued
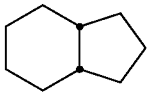
(6)
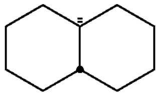
(7)
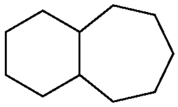
(8)
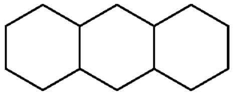
(9)
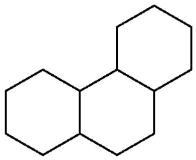
(10)
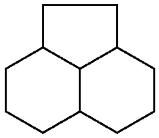
(11)
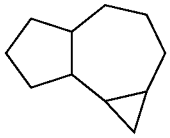
(12)
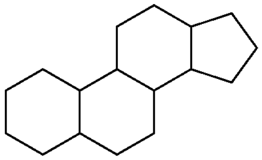
(13)
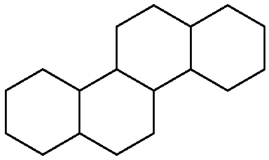
(14)
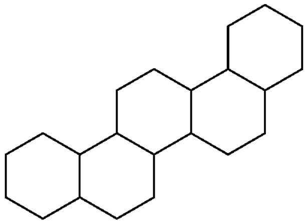
(15)
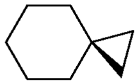
(16)
-continued
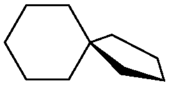
(17)
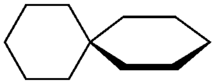
(18)
(19)
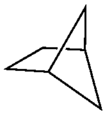
(20)
(21)
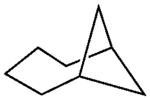
(22)
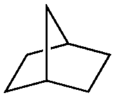
(23)
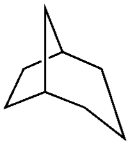
(24)
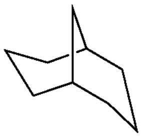
(25)
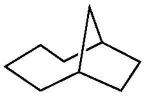
(26)
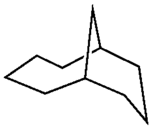
(27)
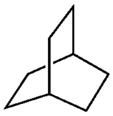
(28)
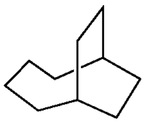
(29)

-continued (30)

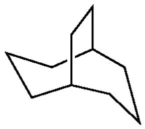

(31)

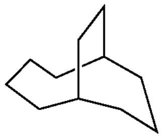

(32)

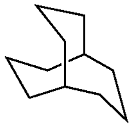

(33)

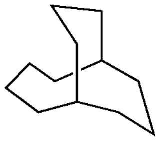

(34)

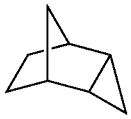

(35)

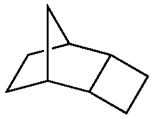

(36)

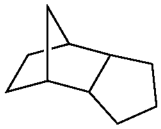

(37)

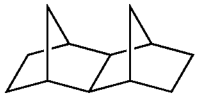

(38)

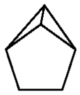

(39)

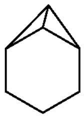

(40)

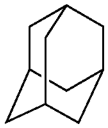

(41)

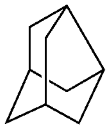

-continued (42)

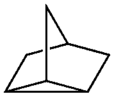

(43)

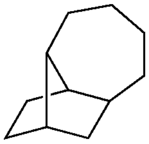

(44)

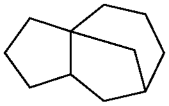

(45)

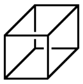

(46)

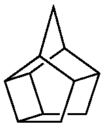

(47)

(48)

(49)

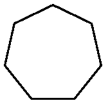

(50)

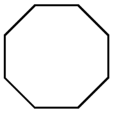

In the present invention, the preferred alicyclic structure includes, as denoted in terms of the monovalent alicyclic group, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, an adamantyl group, a decalin residue, a norbornyl group, a cedrol group, a cyclohexyl group, a cycloheptyl group, a cyclooctyl group, a cyclodecanyl group and a cyclododecanyl group are more preferred.

The substituent which the alicyclic ring in these groups may have includes an alkyl group, a halogen atom, a hydroxyl group, an alkoxy group, a carboxyl group, and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group includes an alkoxy group having a carbon number of 1 to 4, such as methoxy group, ethoxy group, propoxy group and butoxy group. The alkyl group and alkoxy group each may further have a substituent. The substituent which the alkyl group and alkoxy group each may further have includes a hydroxyl group, a halogen atom and an alkoxy group.

The alicylcic structure-containing acid-decomposable group is preferably a group represented by any one of the following formulae (pI) to (pV):

(pI)

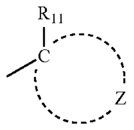

(pII)

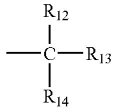

(pIII)

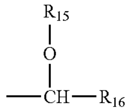

(pIV)

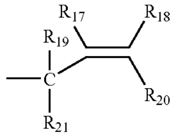

(pV)

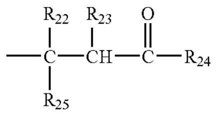

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming an alicyclic hydrocarbon group together with the carbon atom.

$R_{12}$ to $R_{16}$ each independently represents a linear or branched alkyl group having a carbon number of 1 to 4, or an alicyclic hydrocarbon group, provided that at least one of $R_{12}$ to $R_{14}$, or either $R_{15}$ or $R_{16}$, represents an alicyclic hydrocarbon group.

$R_{17}$ to $R_{21}$ each independently represents a hydrogen atom, a linear or branched alkyl group having a carbon number of 1 to 4, or an alicyclic hydrocarbon group, provided that at least one of $R_{17}$ to $R_{21}$ represents an alicylcic hydrocarbon group. Also, either $R_{19}$ or $R_{21}$ represents a linear or branched alkyl group having a carbon number of 1 to 4, or an alicyclic hydrocarbon group.

$R_{22}$ to $R_{25}$ each independently represents a hydrogen atom, a linear or branched alkyl group having a carbon number of 1 to 4, or an alicyclic hydrocarbon group, provided that at least one of $R_{22}$ to $R_{25}$ represents an alicyclic hydrocarbon group. $R_{23}$ and $R_{24}$ may combine with each other to form a ring.

In formulae (pI) to (pV), the alkyl group of $R_{12}$ to $R_{25}$ is a linear or branched alkyl group having a carbon number of 1 to 4, which may be substituted or unsubstituted. Examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$ to $R_{25}$ and the alicyclic hydrocarbon group formed by Z together with the carbon atom include those described above as the alicyclic structure.

Specific examples of the alicyclic structure-containing group capable of decomposing under the action of an acid or the group (acid-decomposable group) containing a group capable of decomposing under the action of an acid, as $A_2$, are set forth below.

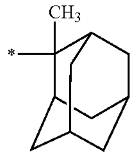

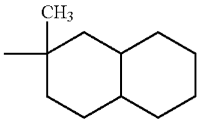

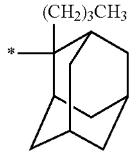

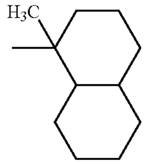

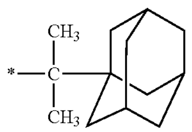

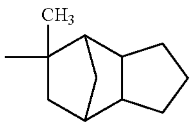

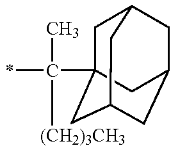

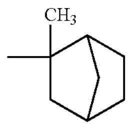

In the present invention, the group containing a group capable of decomposing under the action of an acid may be a group where as a result of leaving of $A_1$ or $A_2$, a hydroxyl group is produced in the repeating unit represented by formula (A1) or (A2), that is, an acid-decomposable group itself, or may be a group containing an acid-decomposable group, that is, a group which decomposes under the action of an acid to produce an alkali-soluble group such as hydroxyl group or carboxyl group in the residue bonded to the repeating unit.

The monomer corresponding to the repeating unit represented by formula (A2) may be synthesized by esterifying a (meth)acrylic acid chloride and an alcohol compound in a solvent such as THF, acetone and methylene chloride in the presence of a basic catalyst such as triethylamine, pyridine and DBU. A commercially available product may also be used.

The monomer corresponding to the repeating unit represented by formula (A1) may be synthesized by acetalizing a hydroxy-substituted styrene monomer and a vinyl ether compound in a solvent such as THF and methylene chloride in the presence of an acidic catalyst such as p-toluenesulfonic acid and pyridine p-toluenesulfonate, or by effecting tert-Boc protection using tert-butyl dicarboxylate in the presence of a basic catalyst such as triethylamine, pyridine and DBU. A commercially available product may also be used.

Specific examples of the repeating unit represented by formula (A1) are set forth below, but the present invention is not limited thereto.

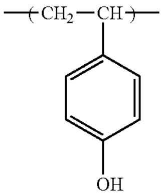
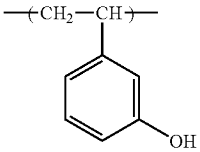
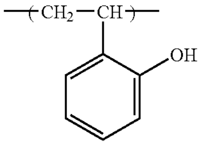
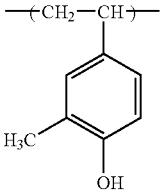
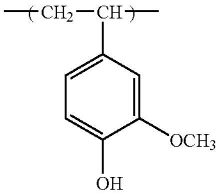
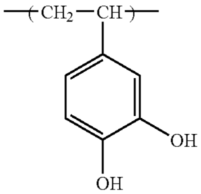
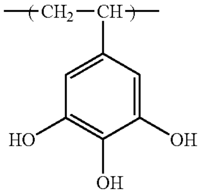
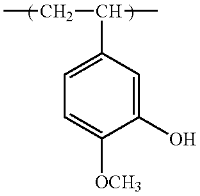
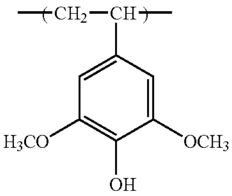
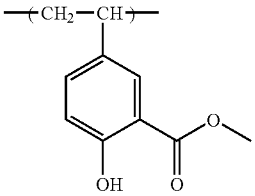
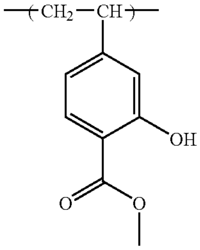
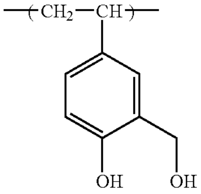
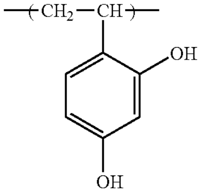
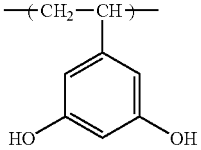
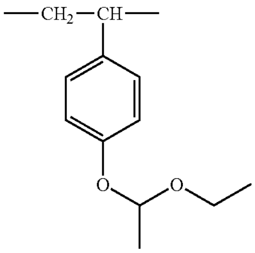
-continued
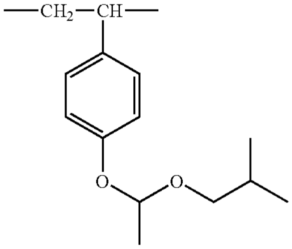
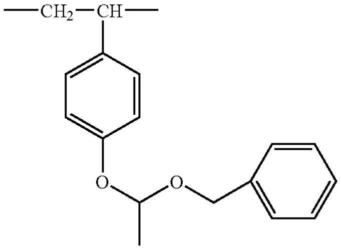
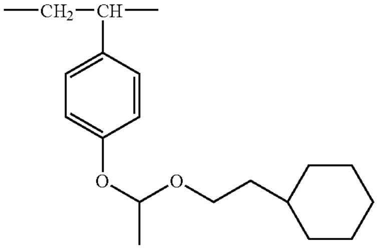
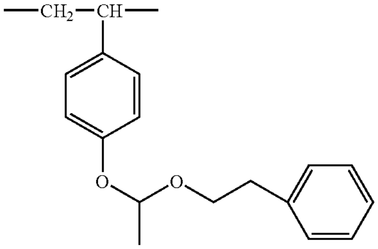
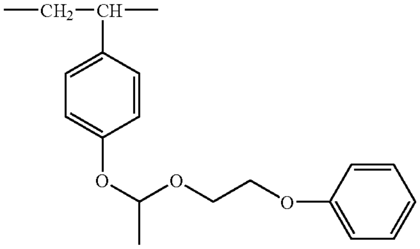
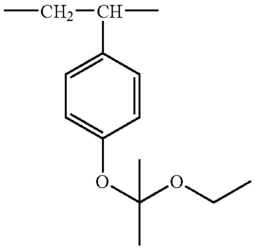
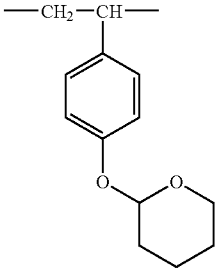
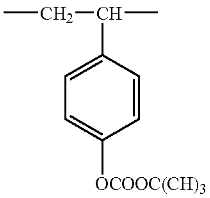
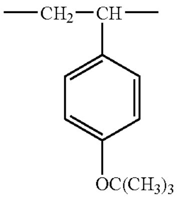

-continued
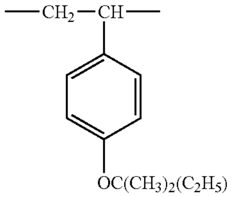
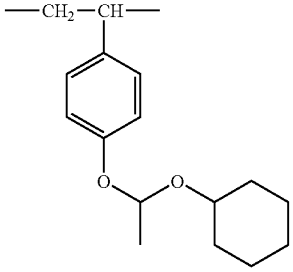
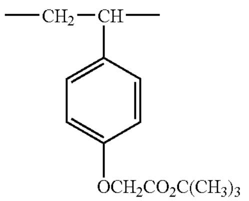
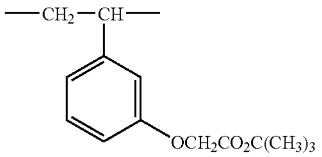
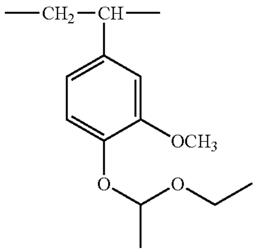
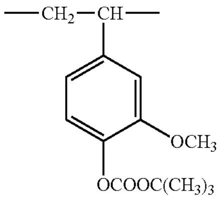
Specific examples of the monomer corresponding to the repeating unit represented by formula (A2) are set forth below, but the present invention is not limited thereto.
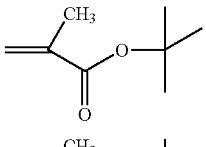
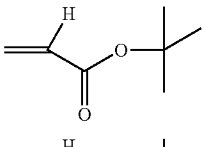
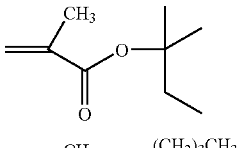
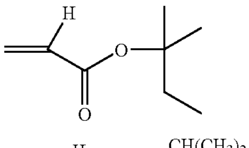
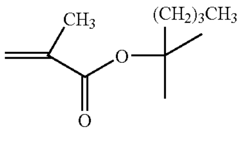
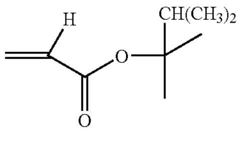
-continued
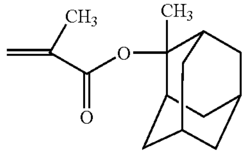
1
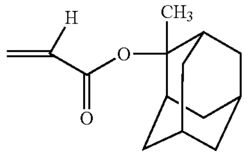
2
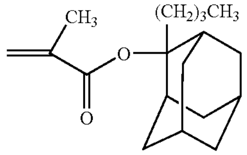
3
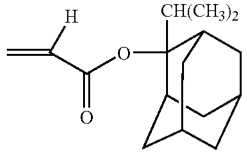
4
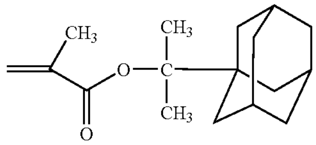
5
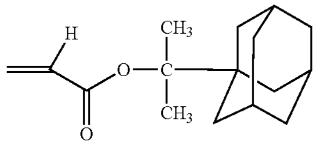
6
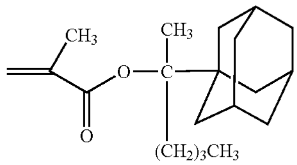
7
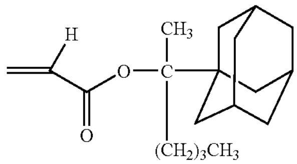
8
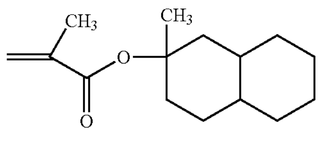
9
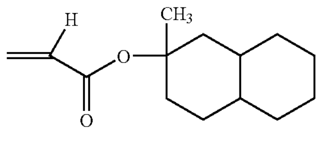
10

-continued
11
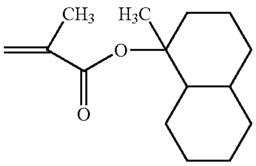
12
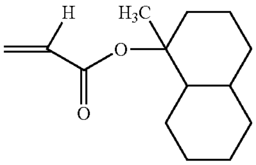
13
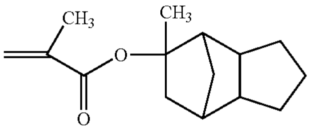
14
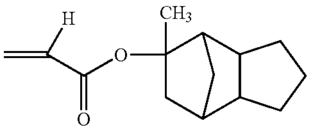
15
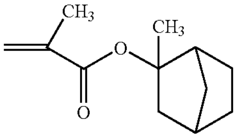
16
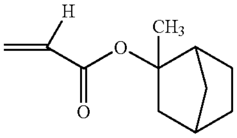
17
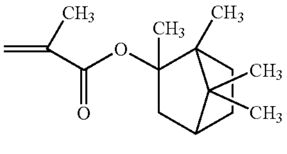
18
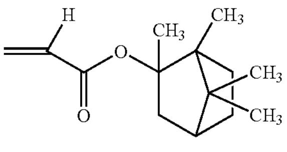
19
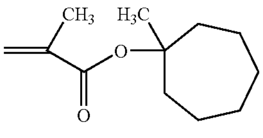
20
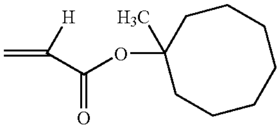
-continued
21
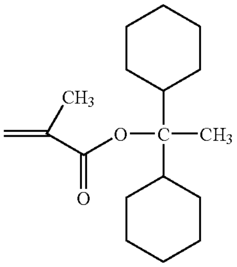
22
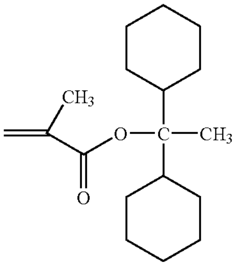
23
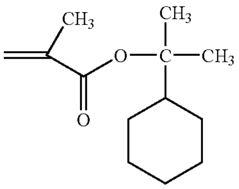
24
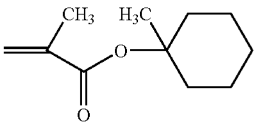
25
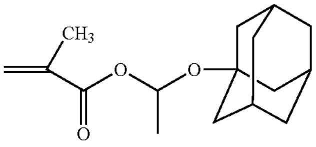
26
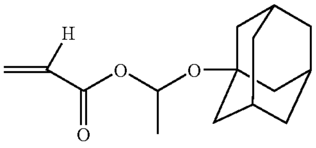
27
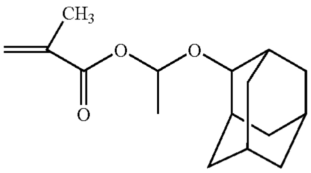
28
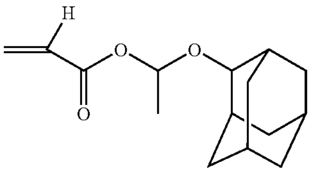

-continued

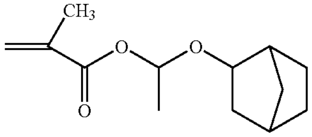

29

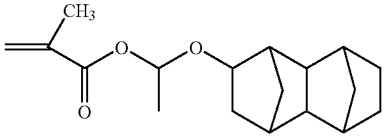

30

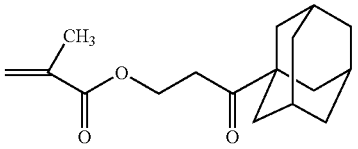

31

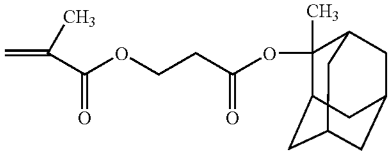

32

The repeating unit represented by formula (A2) is more preferably a repeating unit represented by formula (A2').

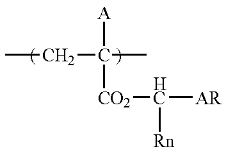

(A2')

In formula (A2'), AR represents a benzene ring, a naphthalene ring or an anthracene ring.

Rn represents an alkyl group or an aryl group.

AR and Rn may combine to form a ring.

A represents a hydrogen atom, an alkyl group, a halogen atom, a cyano group or an alkyloxycarbonyl group.

AR represents a benzene ring, a naphthalene ring or an anthracene ring, and these rings each may have one or more substituents. Examples of the substituent include a linear or branched alkyl group having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group, an alkoxy group, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. Among these, a linear or branched alkyl group having a carbon number of 1 to 5 and an alkoxy group are preferred in view of resolving power, and benzene, p-methylbenzene and p-methoxybenzene are more preferred.

The alkyl group of Rn is preferably a linear or branched alkyl group having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group.

The aryl group of Rn is preferably an aryl group having a carbon number of 6 to 14, such as phenyl group, xylyl group, toluyl group, cumenyl group, naphthyl group and anthracenyl group.

Preferred examples of the substituent which the groups of Rn each may have include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. Among these, preferred are an alkoxy group, a hydroxyl group, a halogen atom, a nitro group, an acyl group, an acyloxy group, an acylamino group and a sulfonylamino group.

The alkyl group of A is preferably a linear or branched alkyl group having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group. These groups each may have a substituent, and preferred examples of the substituent which these groups each may have include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. Among these, preferred are a $CF_3$ group, an alkyloxycarbonylmethyl group, an alkylcarbonyloxymethyl group, a hydroxymethyl group and an alkoxymethyl group.

The halogen atom in A includes a fluorine atom, a chlorine atom, a bromine atom and an iodine atom and is preferably a fluorine atom.

Examples of the alkyl contained in the alkyloxycarbonyl group of A are the same as those of the alkyl group of A above.

Specific examples of the repeating unit represented by formula (A2') are set forth below, but the present invention is not limited thereto.

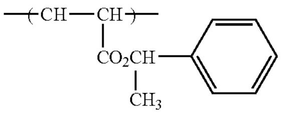

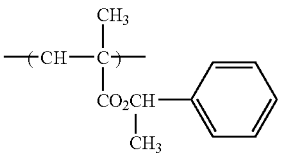

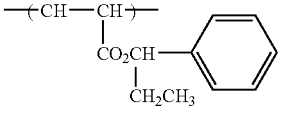

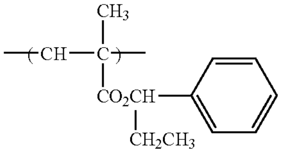

-continued
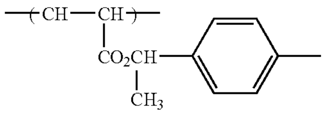
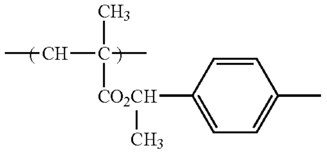
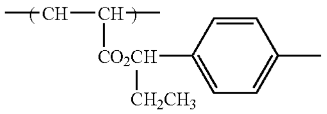
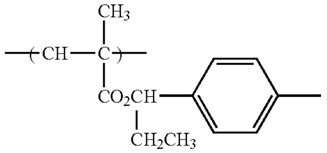
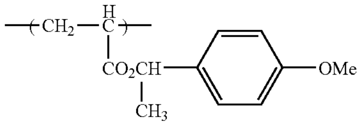
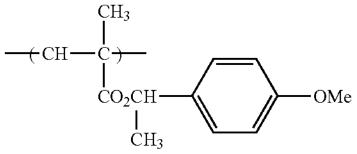
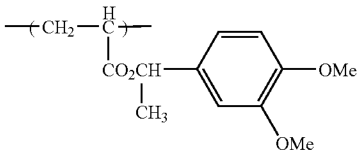
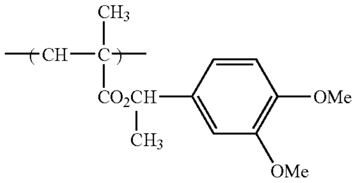
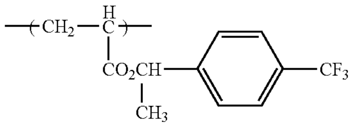
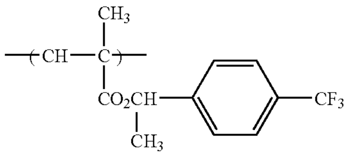
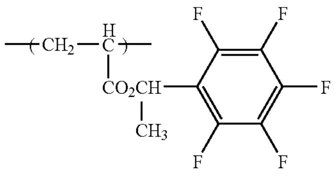
-continued
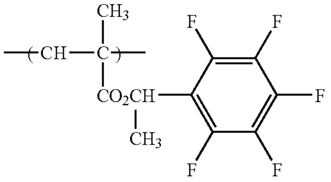
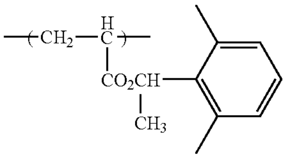
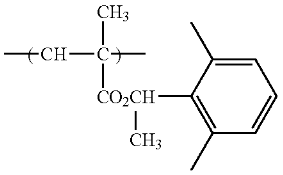
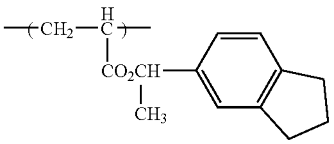
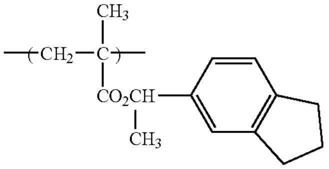
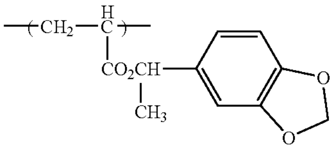
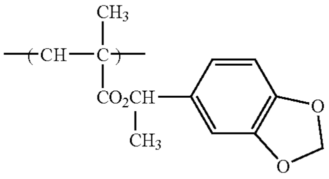
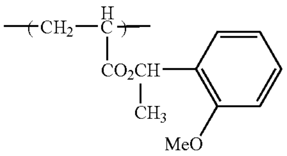
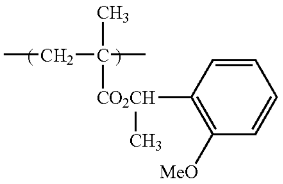
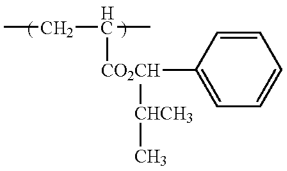

-continued
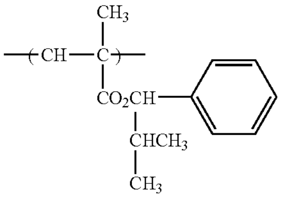
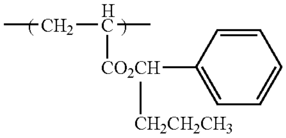
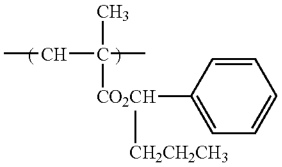
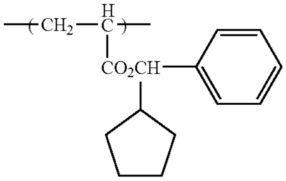
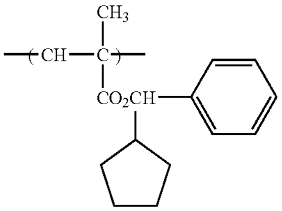
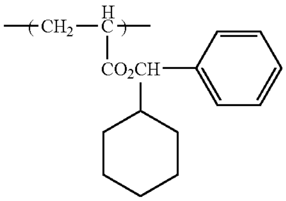
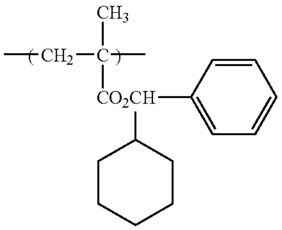
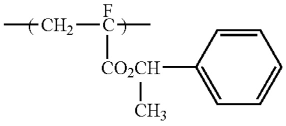
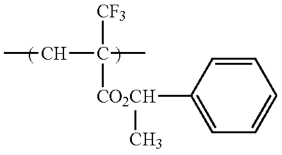
-continued
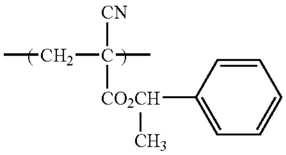
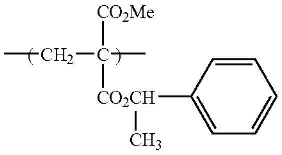
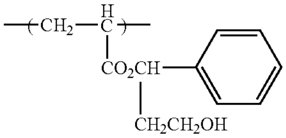
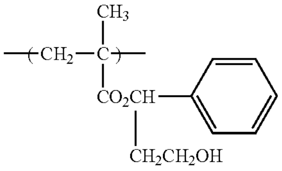
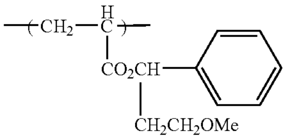
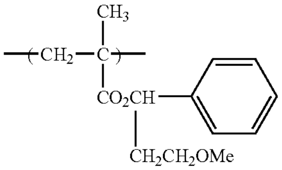
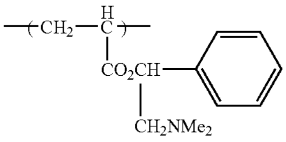
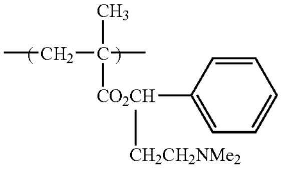
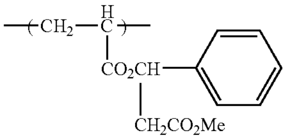
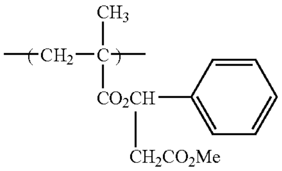
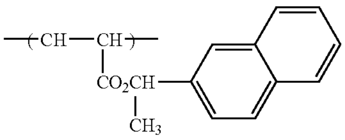

-continued
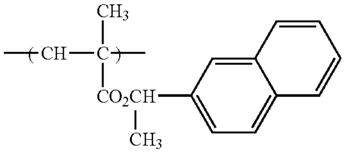
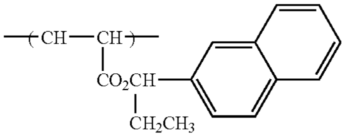
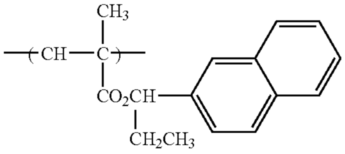
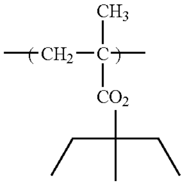
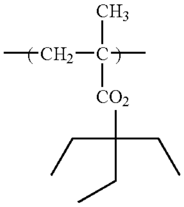
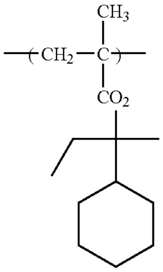
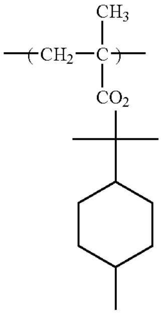
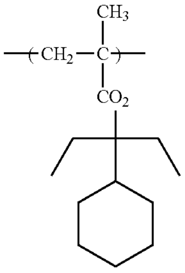
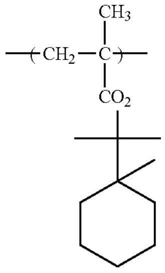
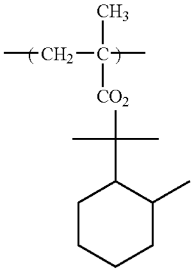
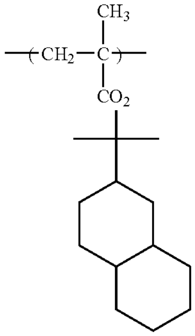
-continued
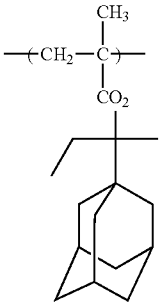
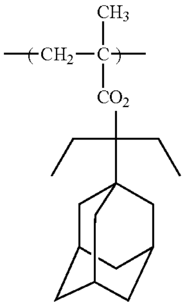
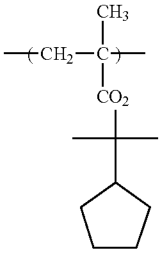
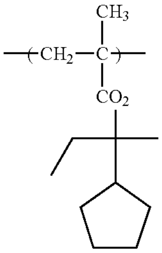
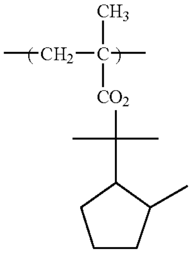
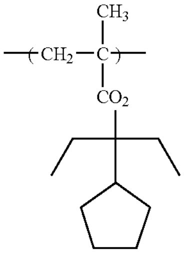
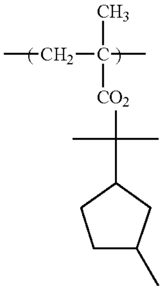
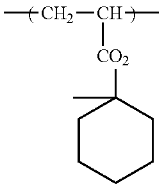
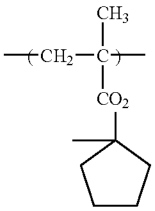
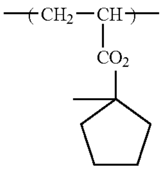
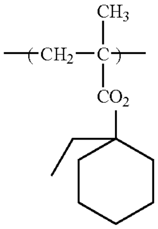
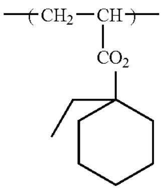

-continued

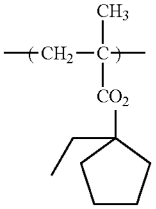

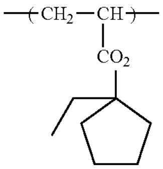

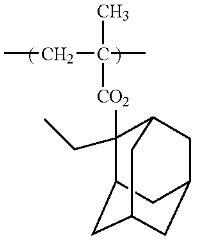

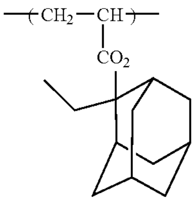

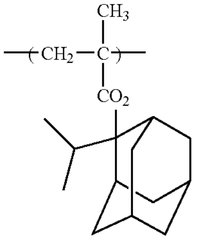

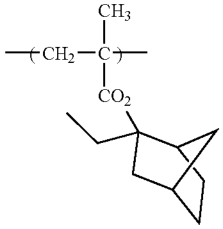

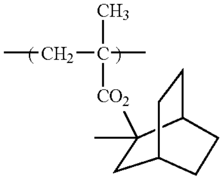

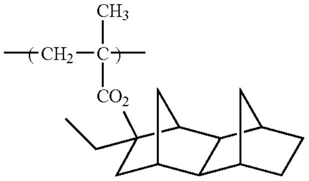

The resin (A) may further contain a repeating unit represented by formula (A4) and this is preferred from the standpoint of, for example, enhancing the film quality and reducing the film loss in the unexposed area.

(A4)

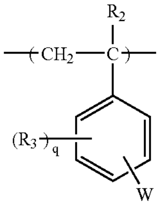

In formula (A4), $R_2$ represents a hydrogen atom, a methyl group, a cyano group, a halogen atom or a perfluoro group having a carbon number of 1 to 4.

$R_3$ represents a hydrogen atom, an alkyl group, a halogen atom, an aryl group, an alkoxy group or an acyl group.

q represents an integer of 0 to 4.

W represents a group incapable of decomposing under the action of an acid.

W represents a group incapable of decomposing under the action of an acid (sometimes referred to as an "acid-stable group"), and specific examples thereof include a hydrogen atom, a halogen atom, an alkyl group, a cycloalkyl group, an alkenyl group, an aryl group, an acyl group, an alkylamido group, an arylamidomethyl group and an arylamido group. The acid-stable group is preferably an acyl group or an alkylamido group, more preferably an acyl group, an alkylcarbonyloxy group, an alkyloxy group, a cycloalkyloxy group or an aryloxy group.

In the acid-stable group represented by W, the alkyl group is preferably an alkyl group having a carbon number of 1 to 4, such as methyl group, ethyl group, propyl group, n-butyl group, sec-butyl group and tert-butyl group; the cycloalkyl group is preferably a cycloalkyl group having a carbon number of 3 to 10, such as cyclopropyl group, cyclobutyl group, cyclohexyl group and adamantyl group; the alkenyl group is preferably an alkenyl group having a carbon number of 2 to 4, such as vinyl group, propenyl group, allyl group and butenyl group; the alkenyl group is preferably an alkenyl group having a carbon number of 2 to 4, such as vinyl group, propenyl group, allyl group and butenyl group; and the aryl group is preferably an aryl group having a carbon number of 6 to 14, such as phenyl group, xylyl group, toluyl group, cumenyl group, naphthyl group and anthracenyl group. W may be present at any position on the benzene ring but is preferably present at the meta-position or para-position, more preferably at the para-position, of the styrene skeleton.

Specific examples of the repeating unit represented by formula (A4) are set forth below, but the present invention is not limited thereto.

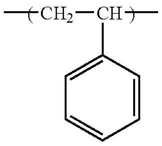

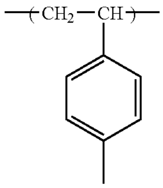

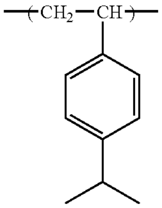

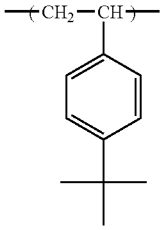

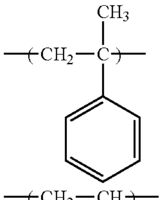

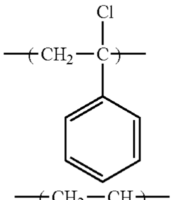

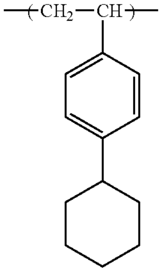

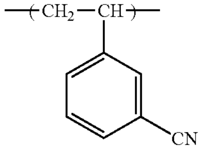

-continued
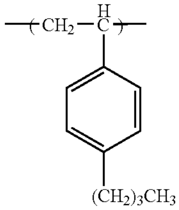 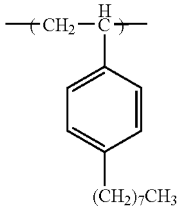
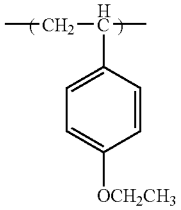 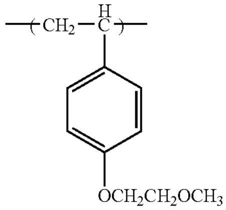
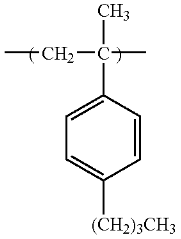 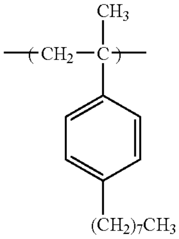
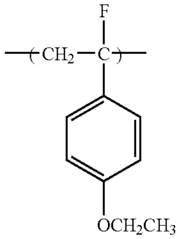 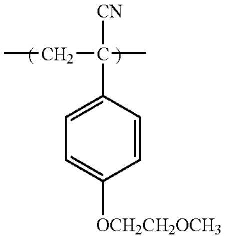
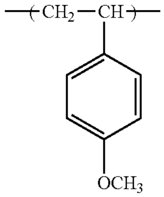 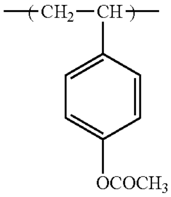
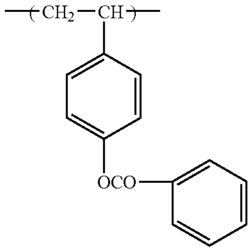 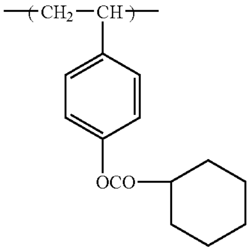
The resin (A) preferably further contains a repeating unit comprising a (meth)acrylic acid derivative incapable of decomposing under the action of an acid. Specific examples thereof are set forth below, but the present invention is not limited thereto.
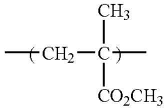 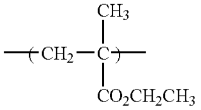
-continued
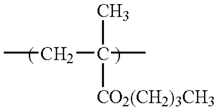 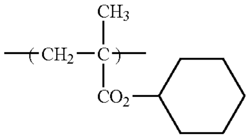
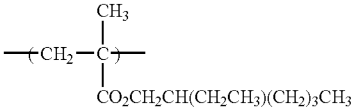
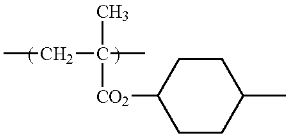
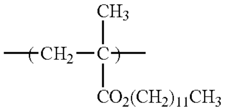 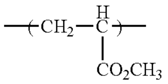
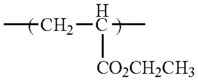 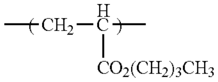
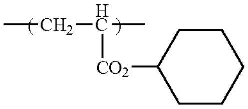
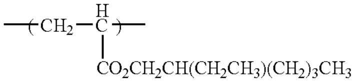
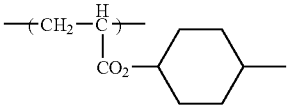 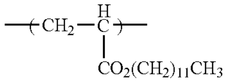
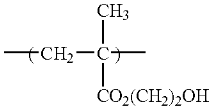 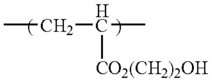
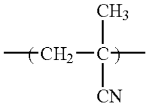 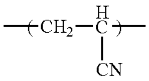
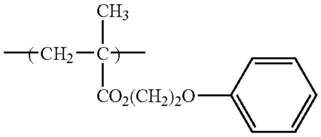
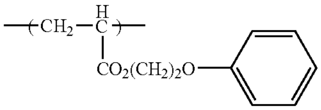
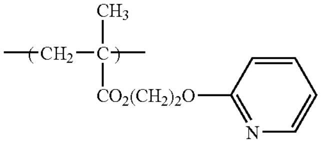
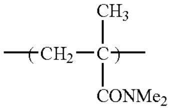 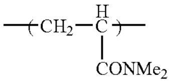

-continued

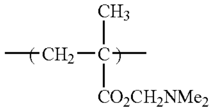

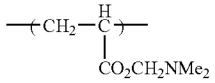

The resin (A) is preferably a resin of which solubility in an alkali developer increases under the action of an acid (acid-decomposable resin), and preferably contains a group capable of decomposing under the action of an acid to produce an alkali-soluble group (acid-decomposable group), in an arbitrary repeating unit.

As described above, the acid-decomposable group may be contained in the repeating unit represented by formula (A1) or (A2) or in other repeating units.

Examples of the acid-decomposable group include, in addition to those described above, a group represented by $-C(=O)-X_1-R_0$.

In the formula above, $R_0$ represents, for example, a tertiary alkyl group such as tert-butyl group and tert-amyl group, a 1-alkoxyethyl group such as isobornyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone group. $X_1$ represents an oxygen atom, a sulfur atom, $-NH-$, $-NHSO_2-$ or $-NHSO_2NH-$.

The content of the repeating unit having an acid-decomposable group in the resin (A) is preferably from 5 to 95 mol %, more preferably from 10 to 60 mol %, still more preferably from 10 to 50 mol %, based on all repeating units.

The content of the repeating unit represented by formula (A1) in the resin (A) is preferably from 40 to 100 mol %, more preferably from 45 to 100 mol %, still more preferably from 50 to 100 mol %, based on all repeating units.

The content of the repeating unit represented by formula (A2) or (A2') in the resin (A) is preferably from 5 to 60 mol %, more preferably from 10 to 50 mol %, still more preferably from 10 to 40 mol %, based on all repeating units.

The content of the repeating unit represented by formula (A4) in the resin (A) is preferably from 0 to 50 mol %, more preferably from 0 to 40 mol %, still more preferably from 0 to 30 mol %, based on all repeating units.

In the resin (A), an appropriate other polymerizable monomer may be copolymerized to introduce an alkali-soluble group such as phenolic hydroxyl group and carboxyl group and thereby maintain good developability with an alkali developer, or a hydrophobic other polymerizable monomer such as alkyl acrylate and alkyl methacrylate may be copolymerized so as to enhance the film quality.

The weight average molecular weight (Mw) of the resin (A) is from 1,000 to 200,000. The weight average molecular weight is preferably 200,000 or less in view of dissolution rate of the resin itself in an alkali and sensitivity. The dispersity (Mw/Mn) is preferably from 1.0 to 3.0, more preferably from 1.0 to 2.5, still more preferably from 1.0 to 2.0. Above all, the weight average molecular weight (Mw) is preferably from 1,000 to 200,000, more preferably from 1,000 to 100,000, still more preferably from 1,000 to 50,000, and most preferably from 1,000 to 25,000.

Here, the weight average molecular weight is defined as a polystyrene-reduced value determined by gel permeation chromatography.

The resin (A) having a dispersity of 1.5 to 2.0 can be synthesized by radical polymerization using an azo-based polymerization initiator. Also, the resin (A) having a still more preferred dispersity of 1.0 to 1.5 can be synthesized by living radical polymerization.

Two or more species of the resin (A) may be used in combination.

The amount of the resin (A) added is, as the total amount, usually from 10 to 96 mass %, preferably from 15 to 96 mass %, more preferably from 20 to 95 mass %, based on the entire solid content of the positive resist composition. (In this specification, mass ratio is equal to weight ratio.)

Specific examples of the repeating unit in the main chain of the resin (A) are set forth below, but the present invention is not limited thereto.

(A-1)

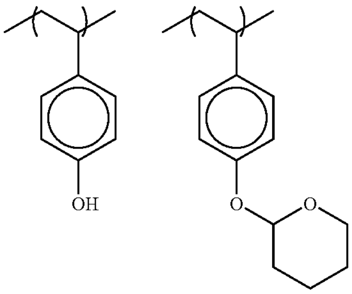

(A-2)

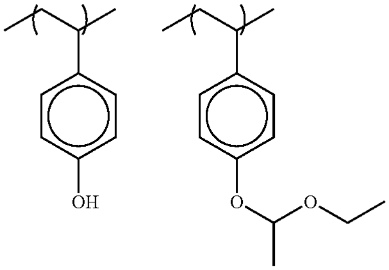

(A-3)

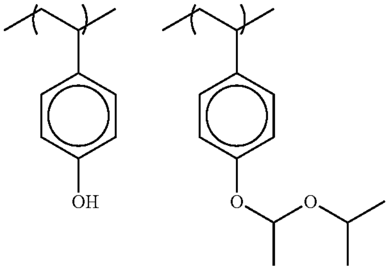

(A-4)

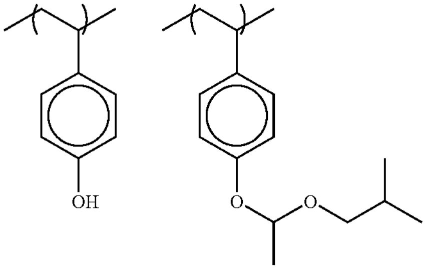

-continued
(A-5)
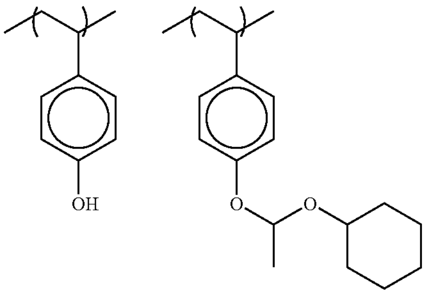
(A-6)
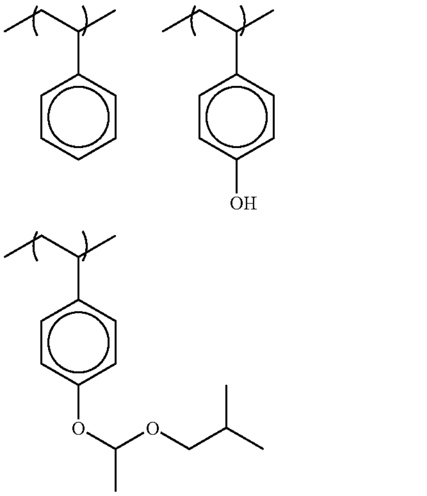
(A-7)
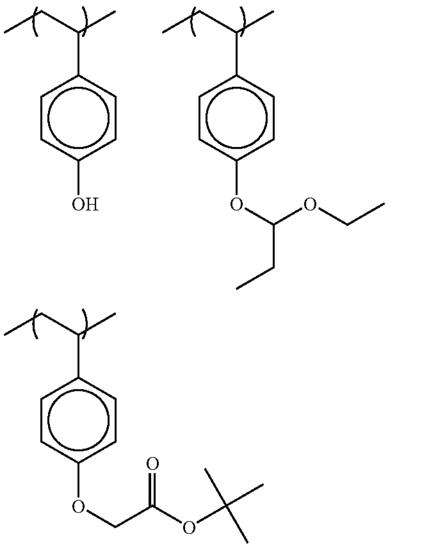
(A-8)
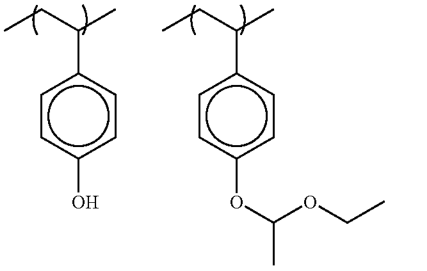
-continued
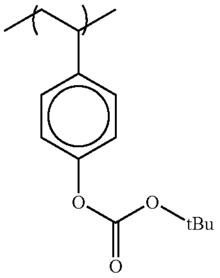
(A-9)
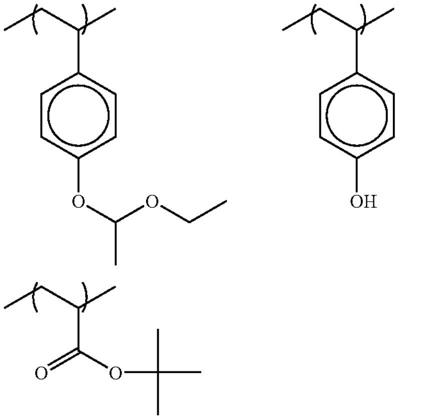
(A-10)
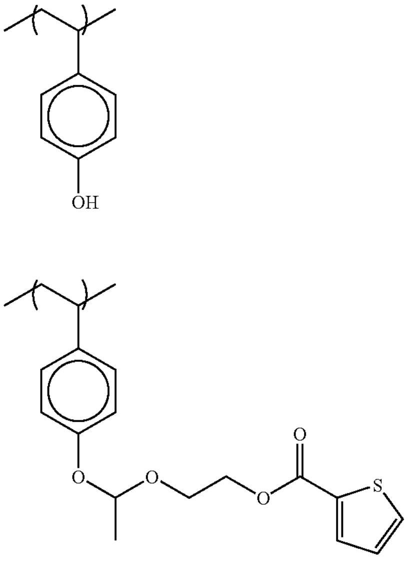
(A-11)
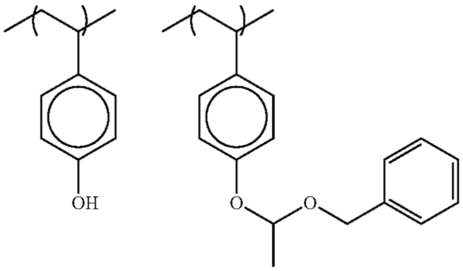

-continued
(A-12)
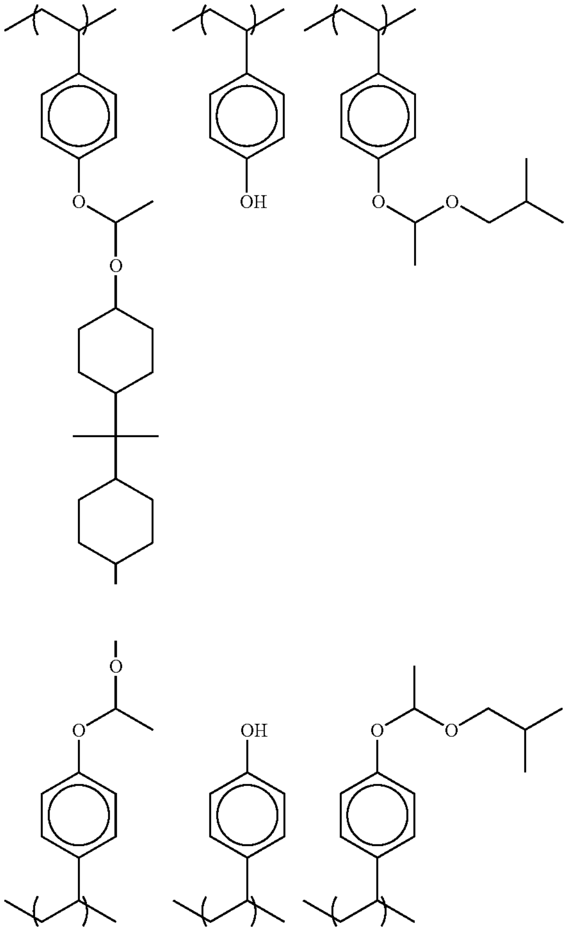
(A-13)
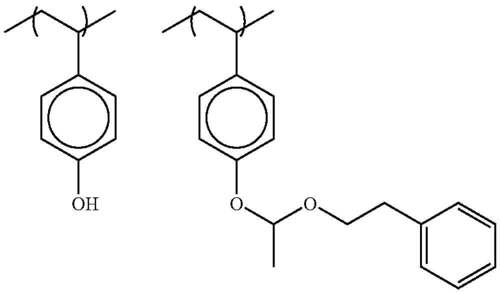
(A-14)
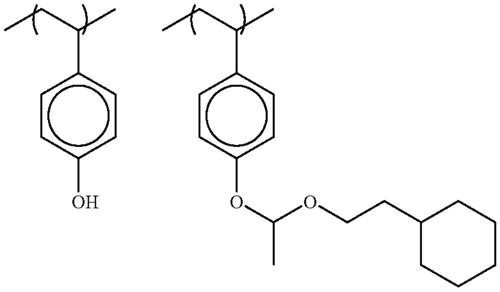
-continued
(A-15)
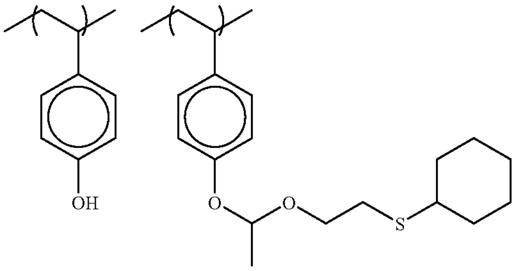
(A-16)
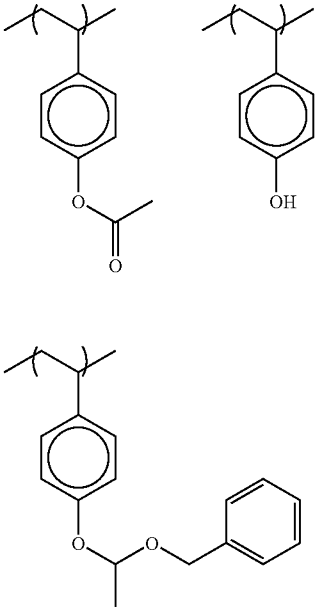
(A-17)
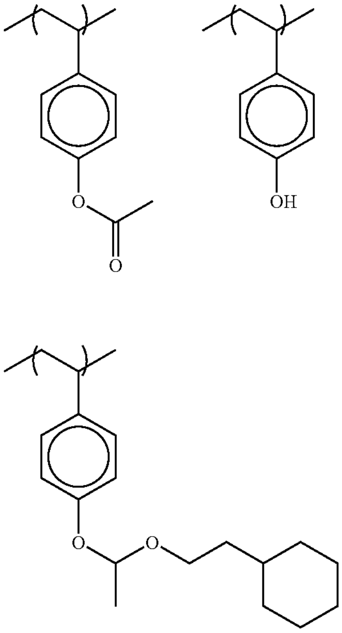

-continued
(A-18)
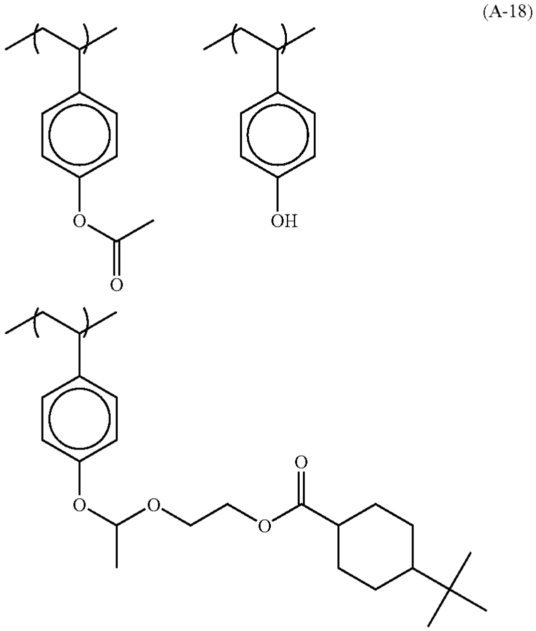
(A-19)
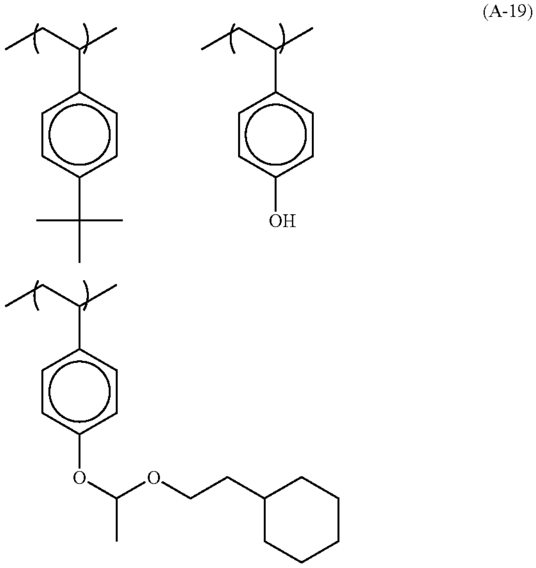
(A-20)
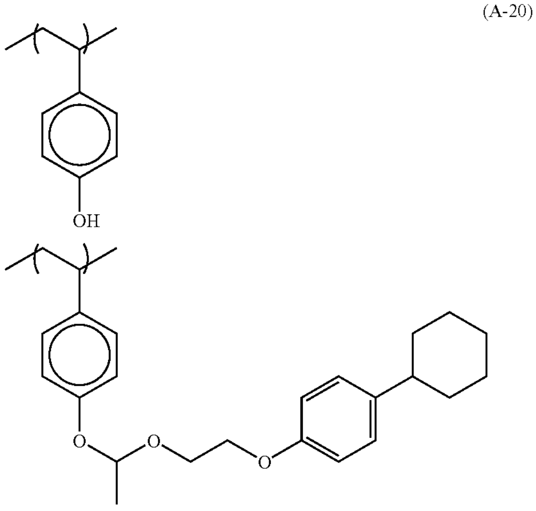
-continued
(A-21)
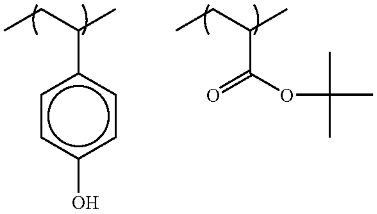
(A-22)
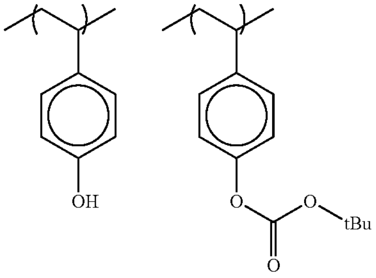
(A-23)
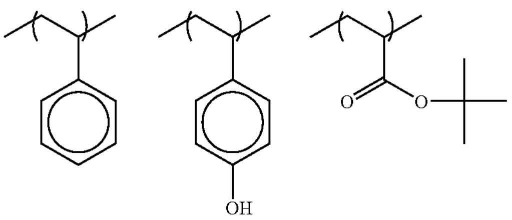
(A-24)
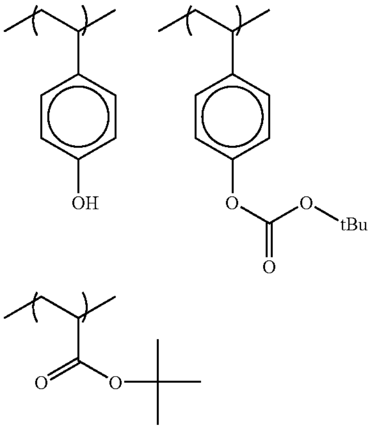
(A-25)
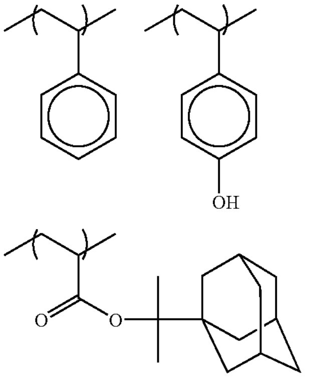

-continued
(A-26)
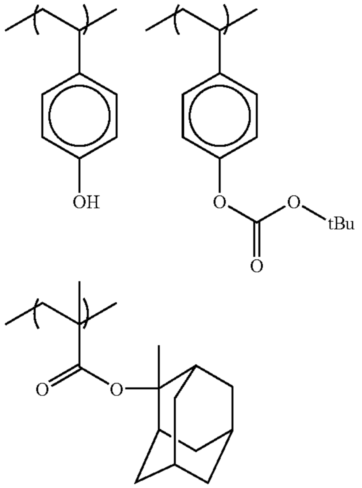
(A-27)
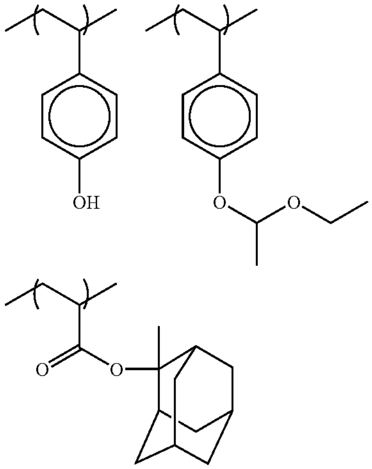
(A-28)
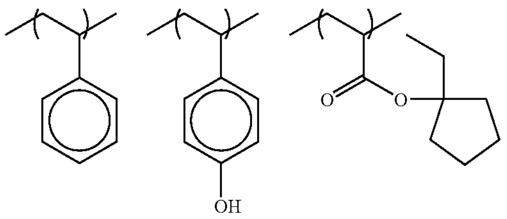
(A-29)
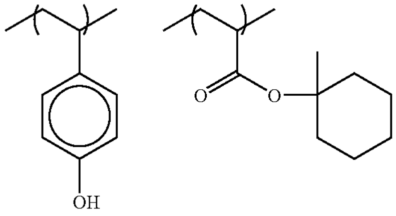
(A-30)
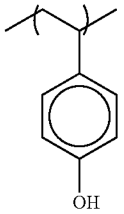
-continued
(A-31)
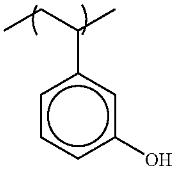
(A-32)
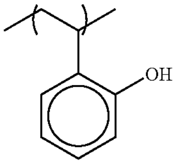
(A-33)
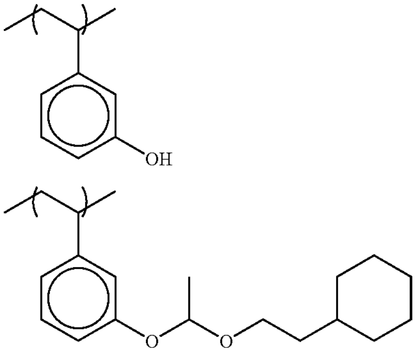
(A-34)
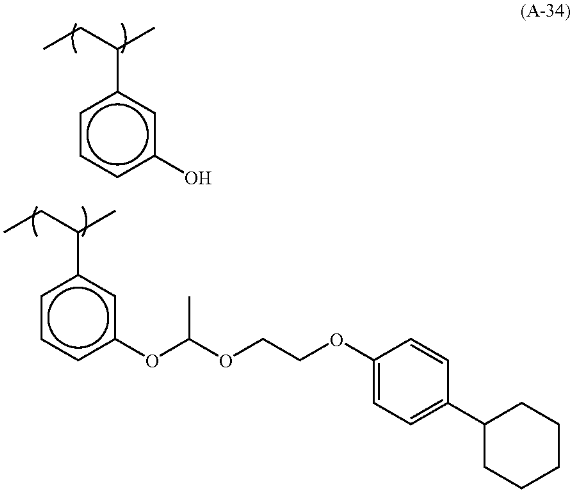
(A-35)
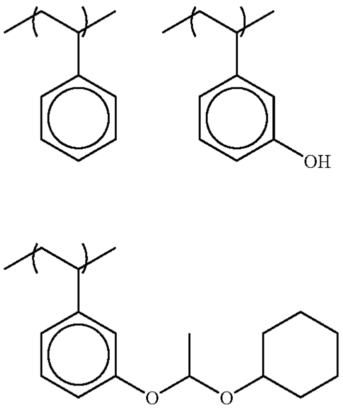

-continued
(A-36)
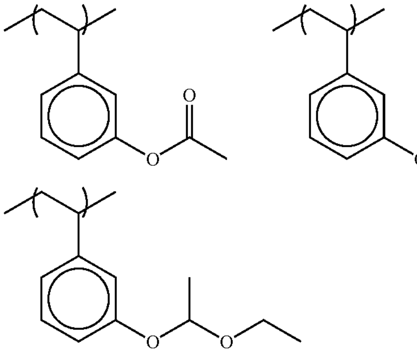
(A-37)
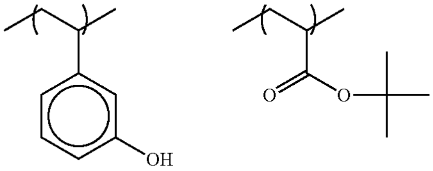
(A-38)
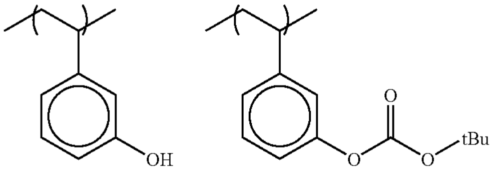
(A-39)
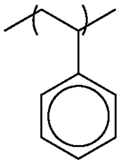
(A-40)
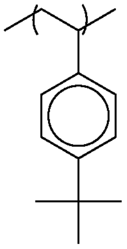
(A-41)
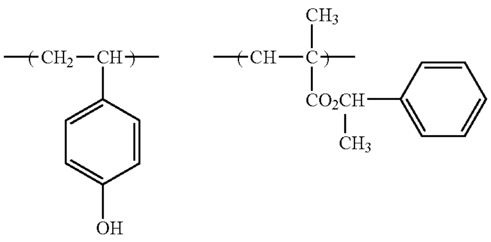
-continued
(A-42)
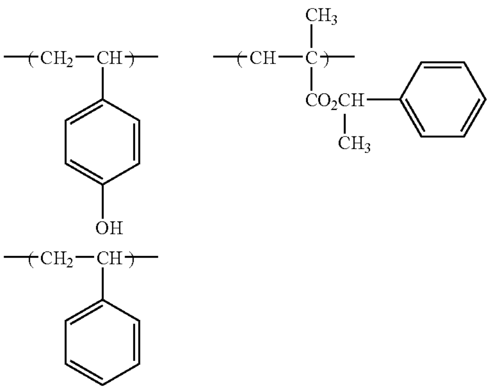
(A-43)
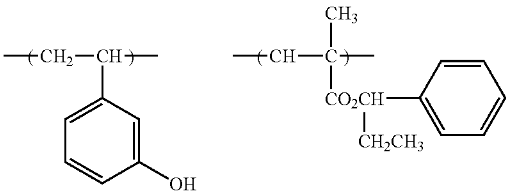
(A-44)
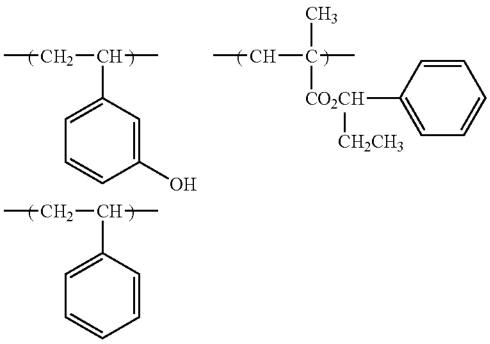
(A-45)
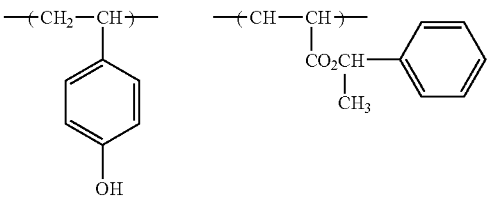
(A-46)
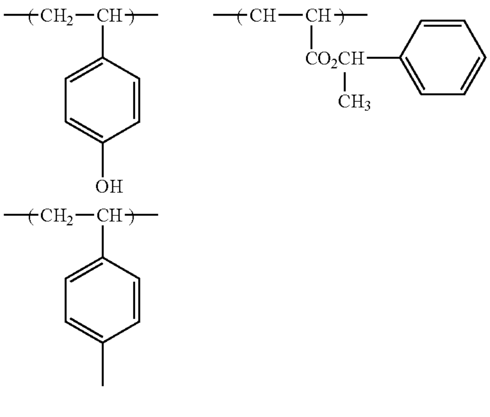

-continued
(A-47)
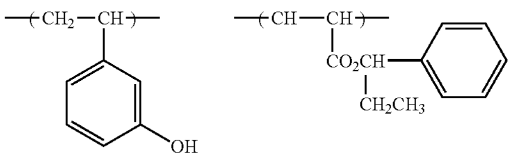
(A-48)
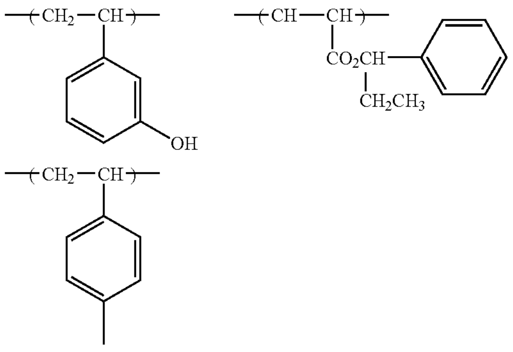
(A-49)
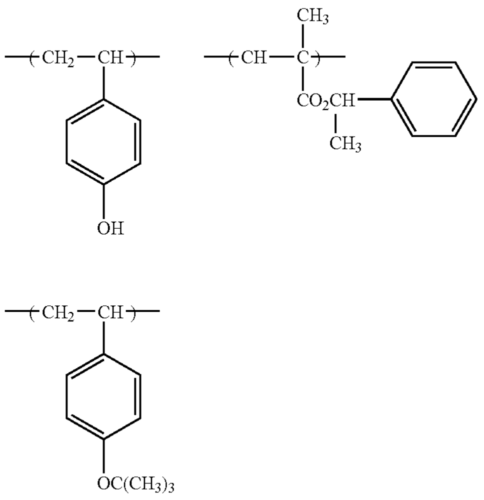
(A-50)
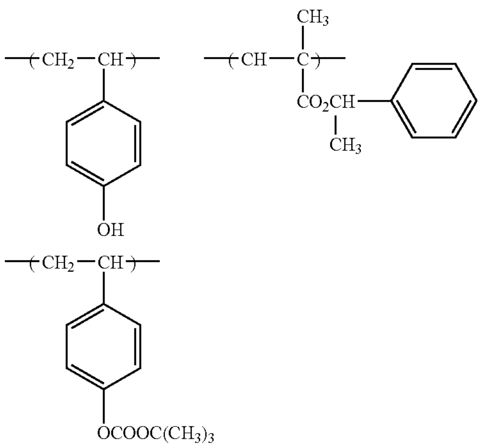
-continued
(A-51)
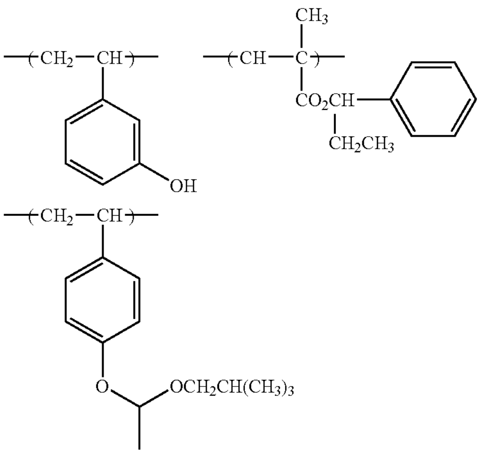
(A-52)
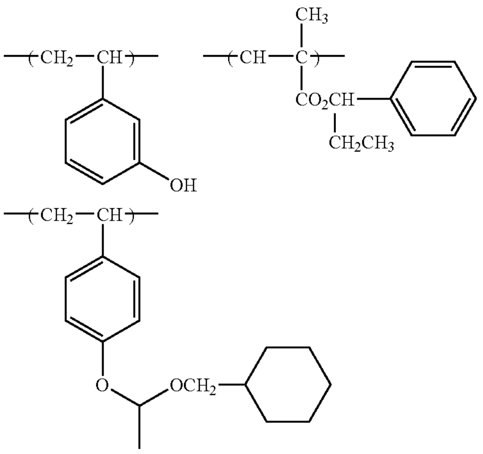
(A-53)
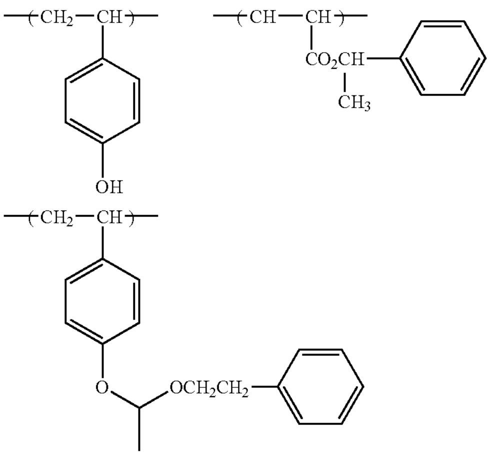
(A-54)
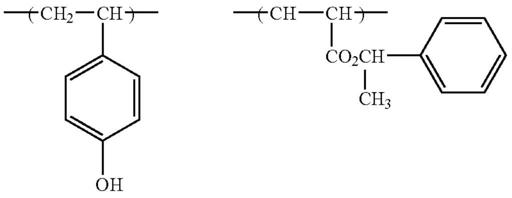

-continued
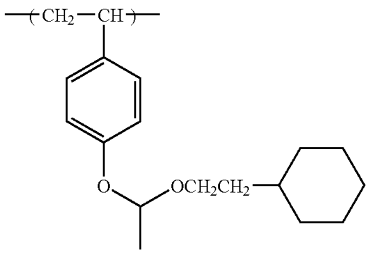
(A-55)
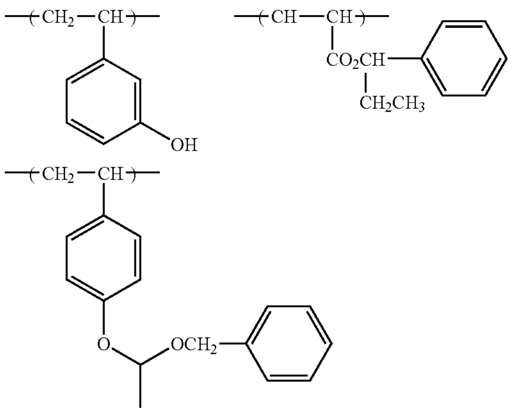
(A-56)
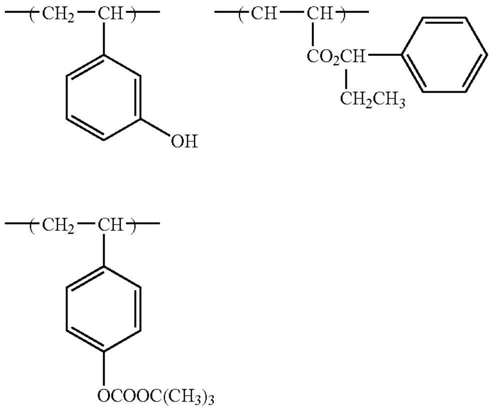
(A-57)
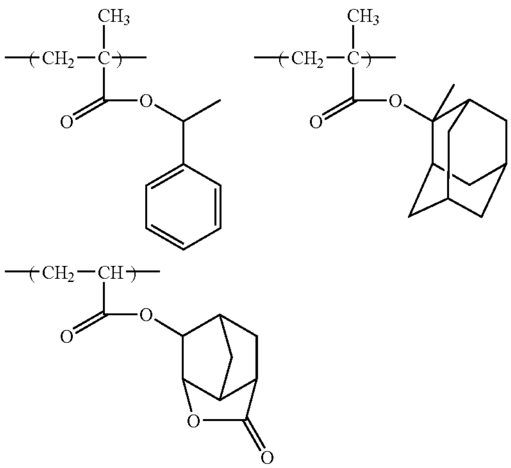
-continued
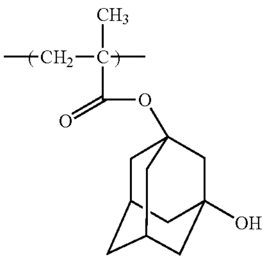
(A-58)
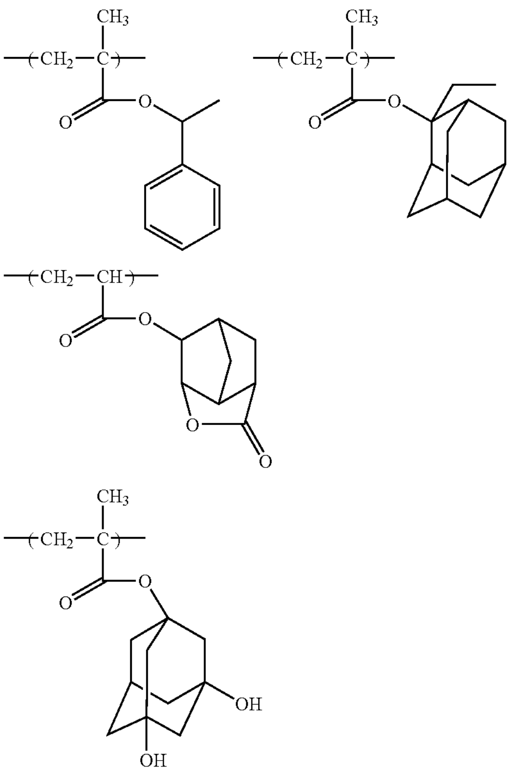
(A-59)
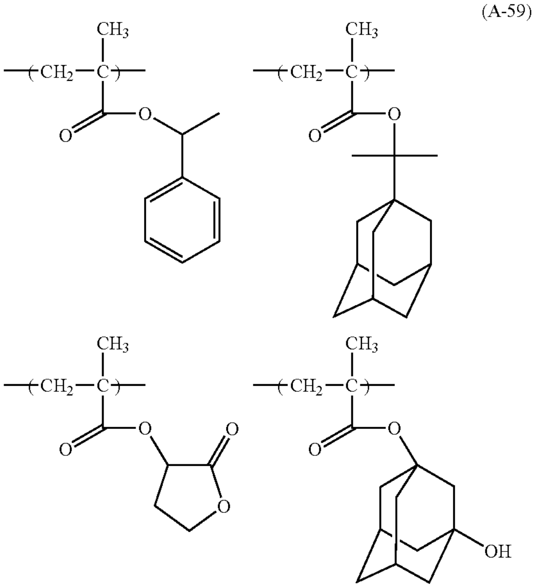

-continued
(A-60)
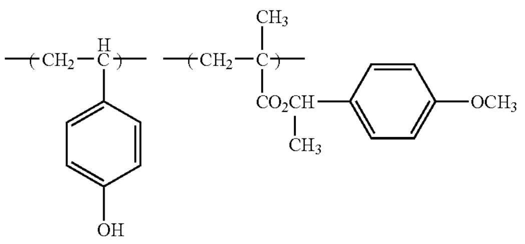
(A-61)
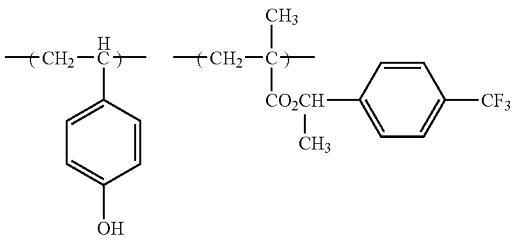
(A-62)
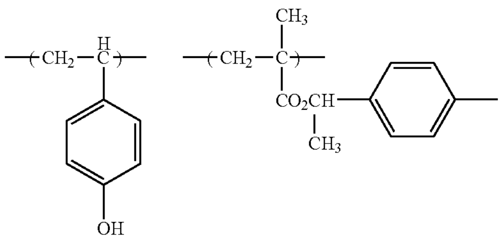
(A-63)
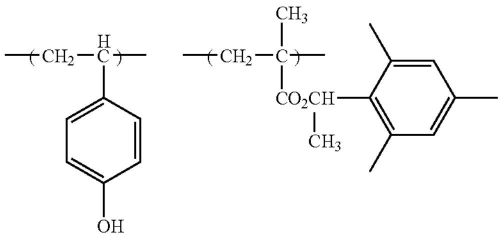
(A-64)
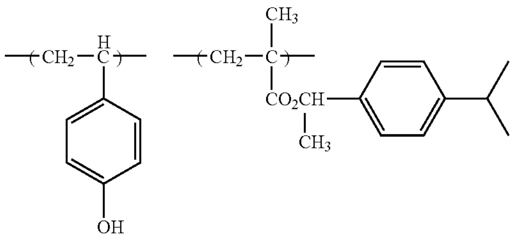
(A-65)
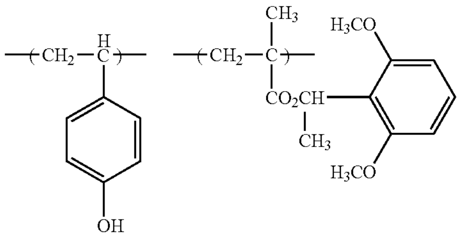
-continued
(A-66)
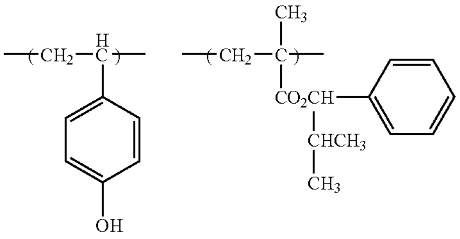
(A-67)
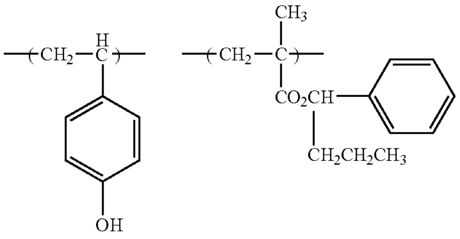
(A-68)
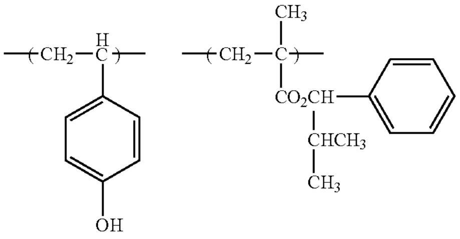
(A-69)
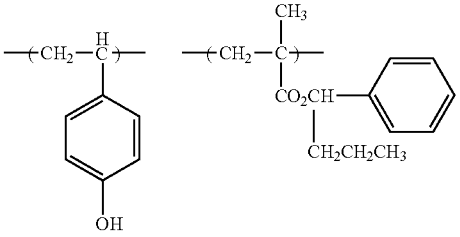
(A-70)
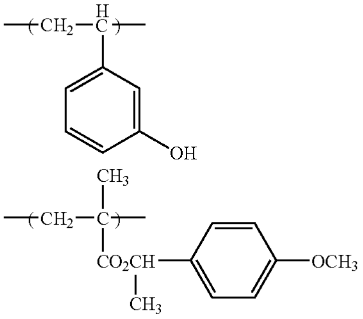
(A-71)
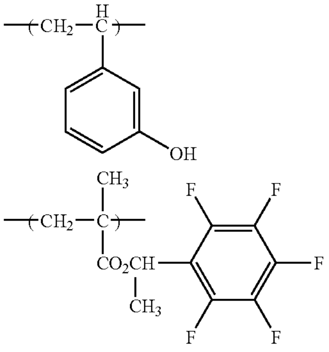

-continued
(A-72)
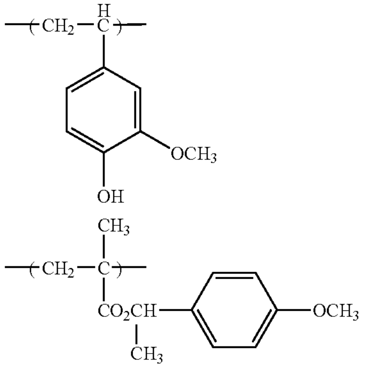
(A-73)
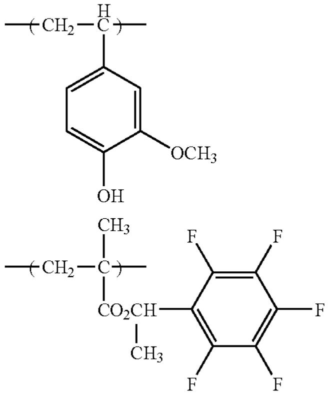
(A-74)
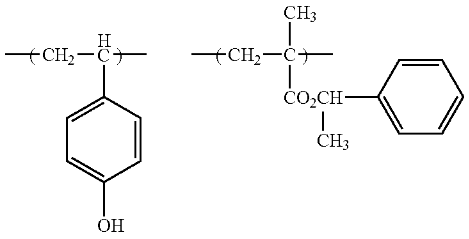
(A-75)
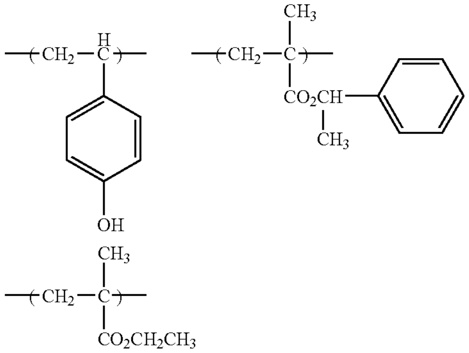
-continued
(A-76)
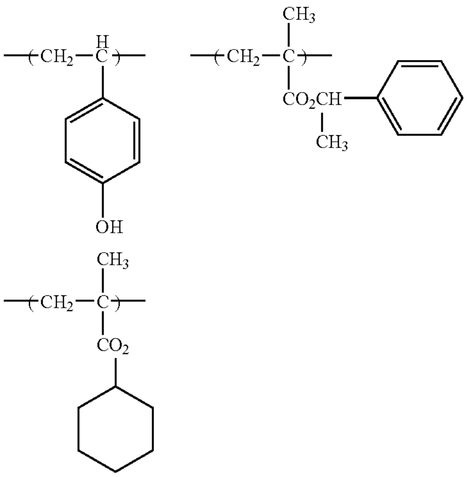
(A-77)
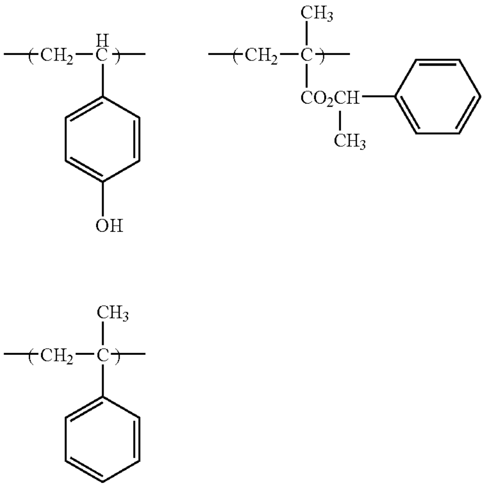
(A-78)
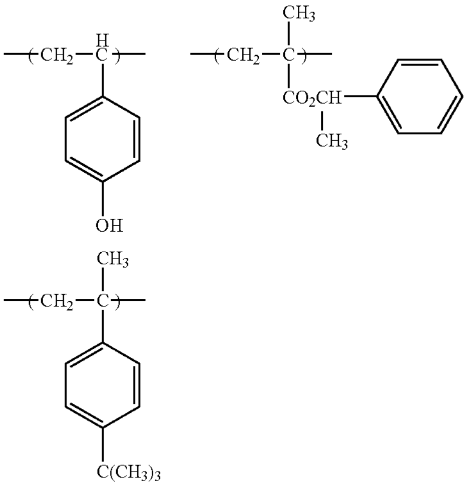

-continued
(A-79)
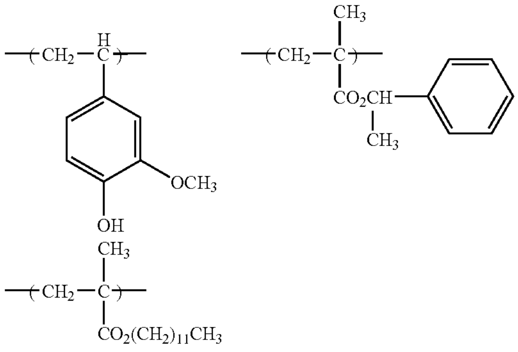
(A-80)
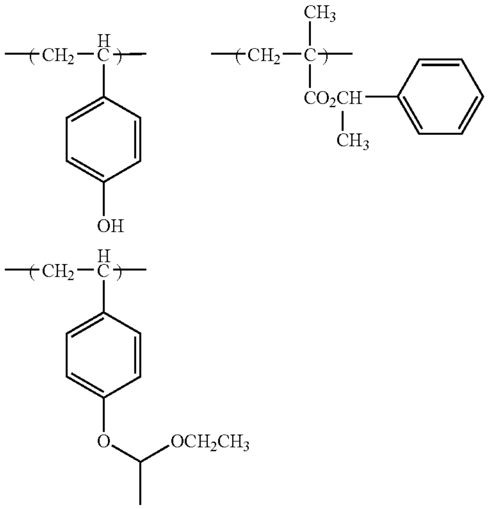
(A-81)
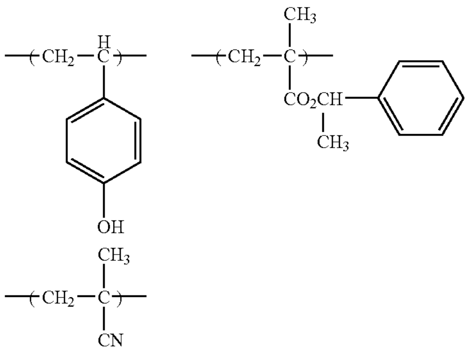
(A-82)
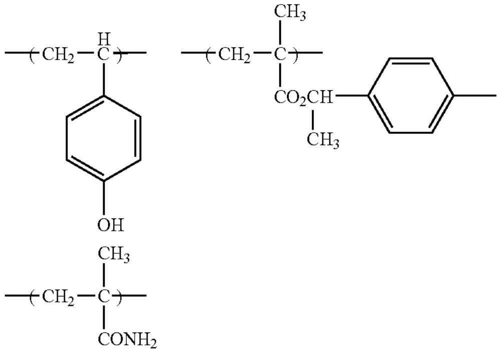
-continued
(A-83)
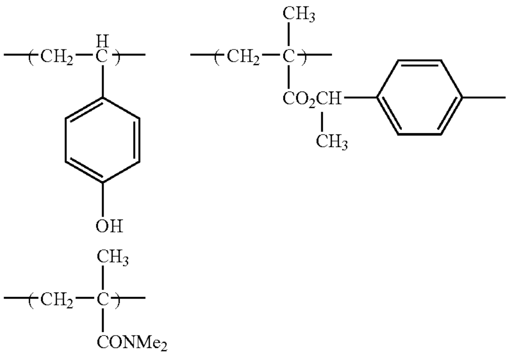
(A-84)
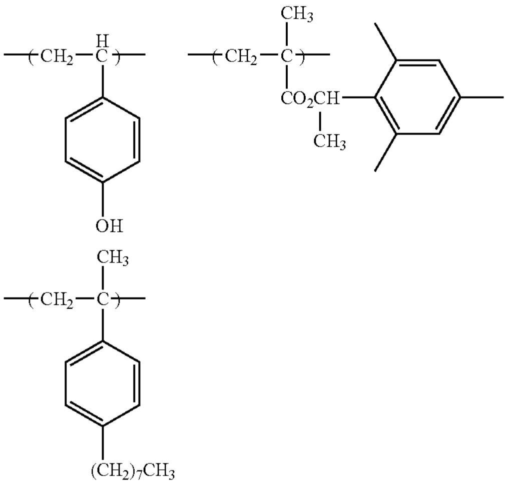
(A-85)
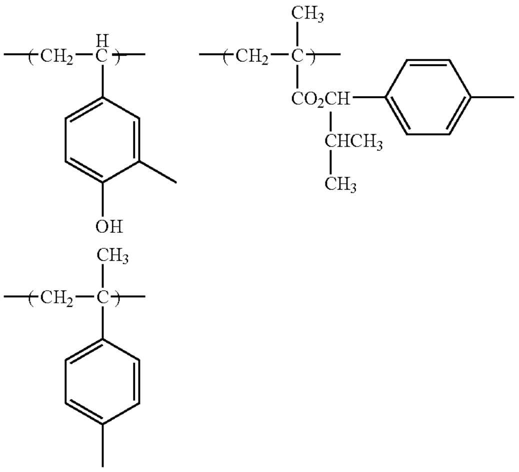
(A-86)
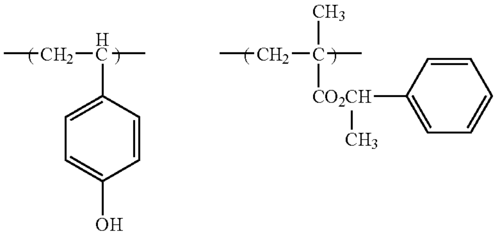

-continued
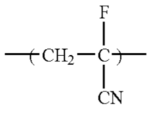
(A-87)
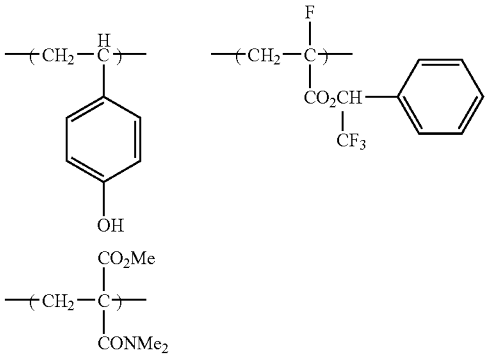
(A-88)
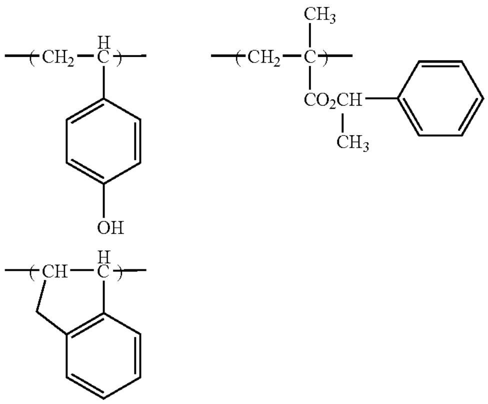
(A-89)
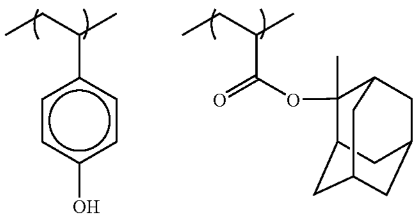
(A-90)
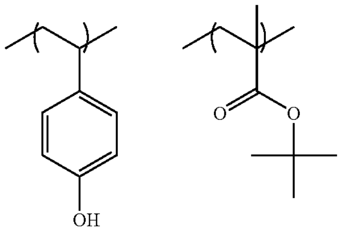
(A-91)
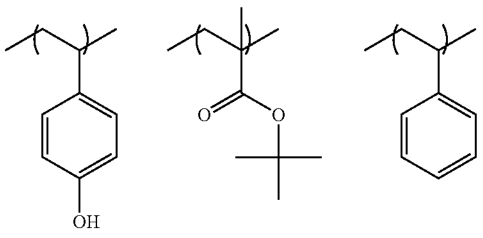
-continued
(A-92)
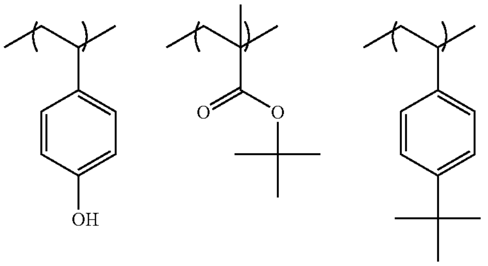
(A-93)
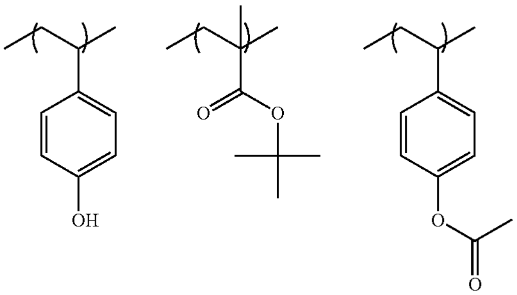
(A-94)
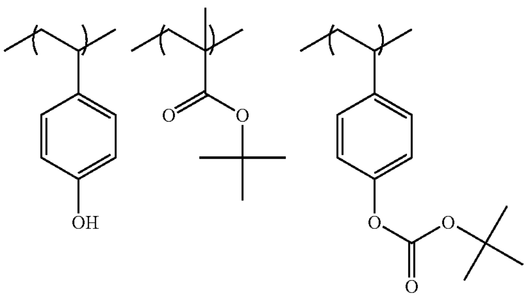
(A-95)
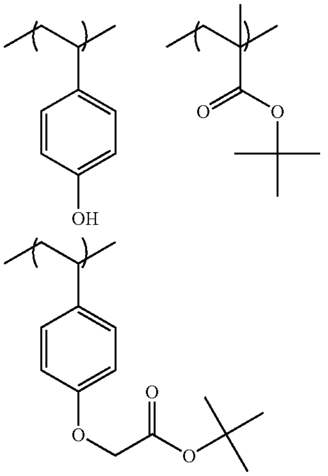
(A-96)
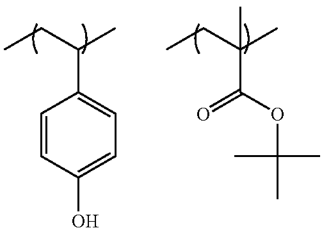

-continued
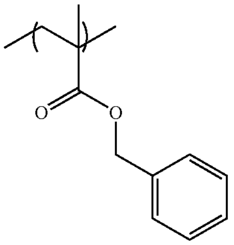
(A-97)
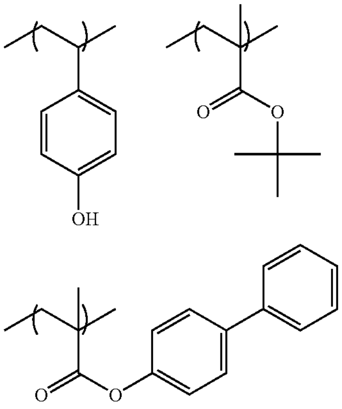
(A-98)
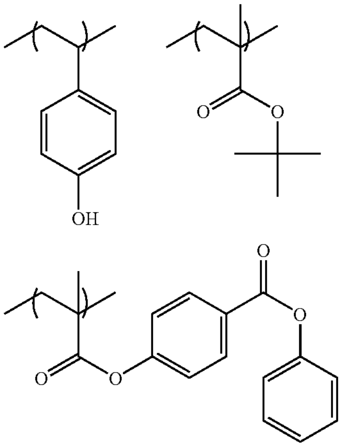
(A-99)
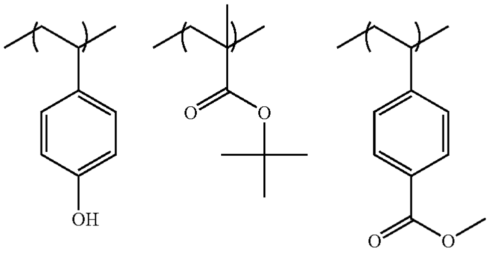
(A-100)
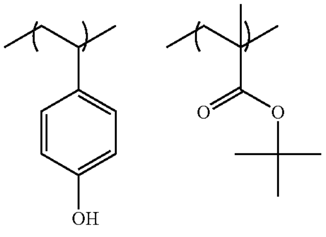
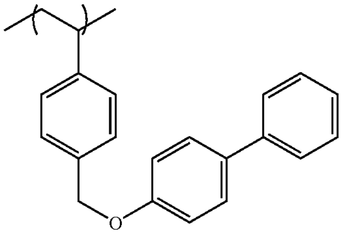
(A-101)
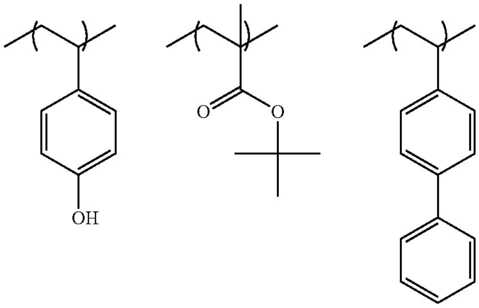
(A-102)
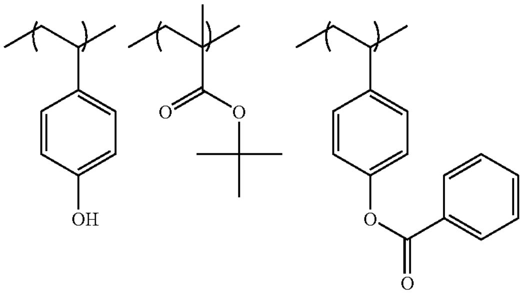
(A-103)
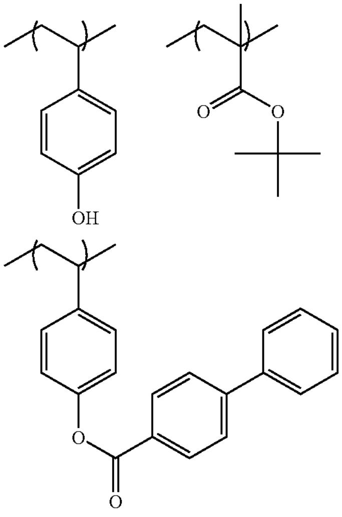
(A-104)
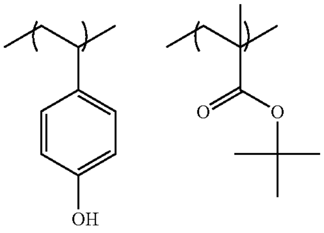

-continued
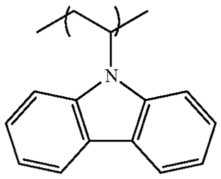
(A-105)
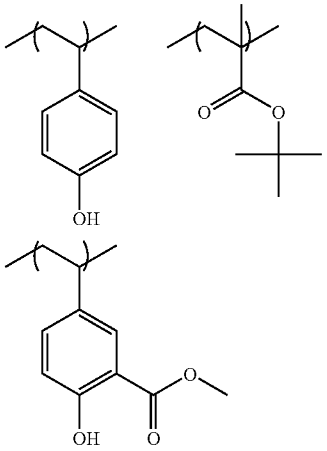
(A-106)
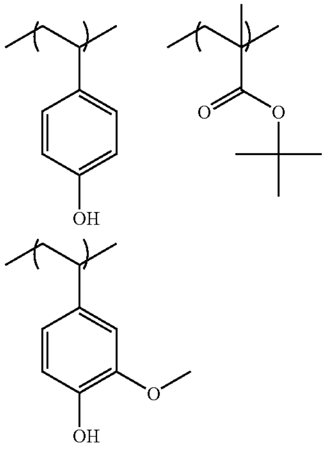
(A-107)
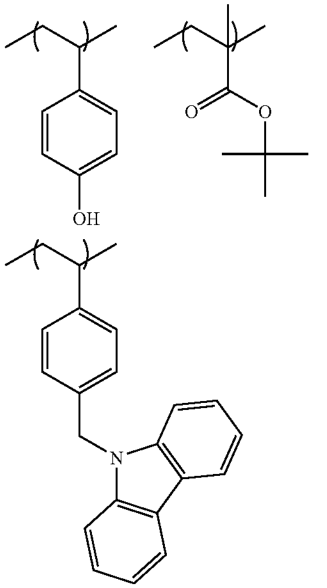
-continued
(A-108)
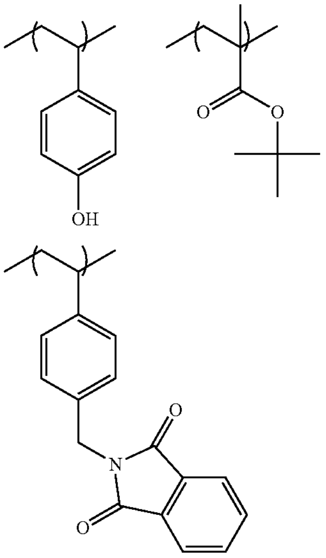
(A-109)
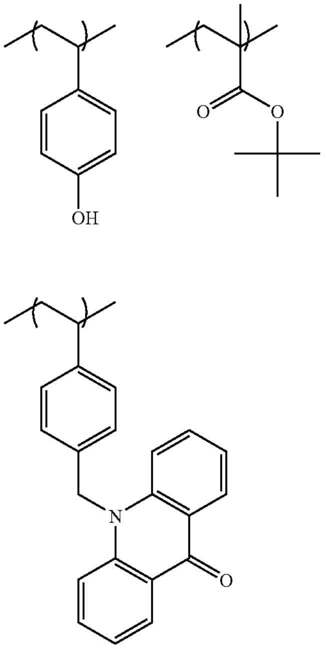
(A-110)
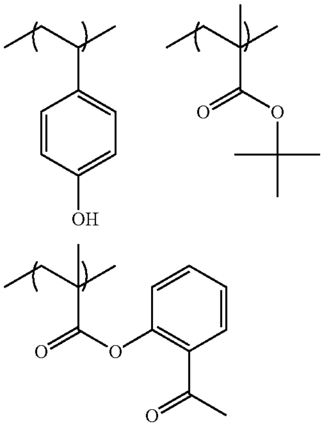

-continued
(A-111)
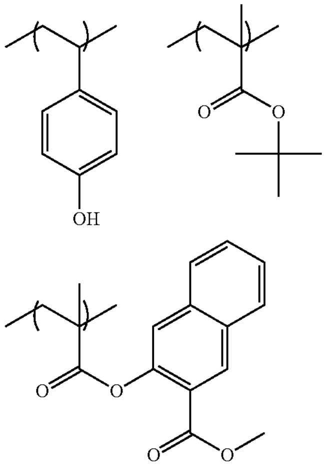
(A-112)
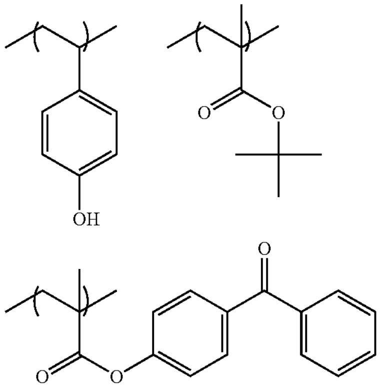
(A-113)
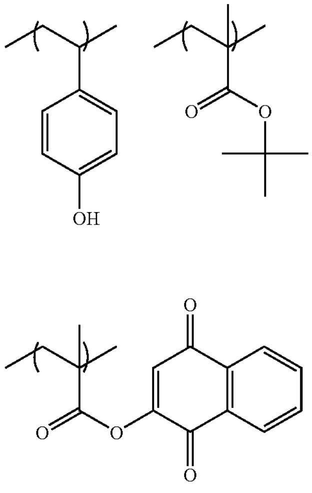
(A-114)
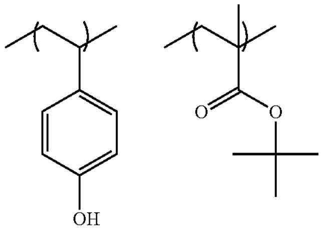
-continued
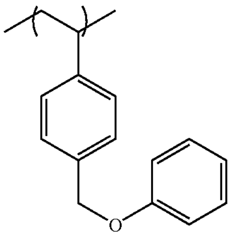
(A-115)
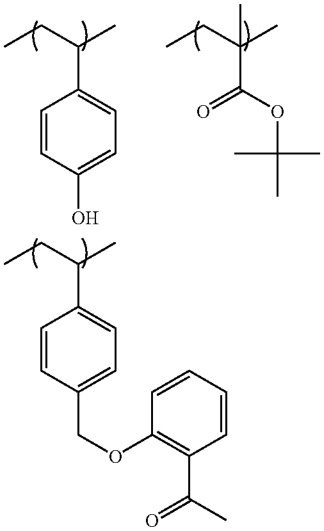
(A-116)
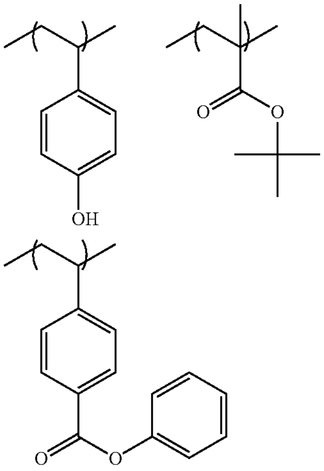
(A-117)
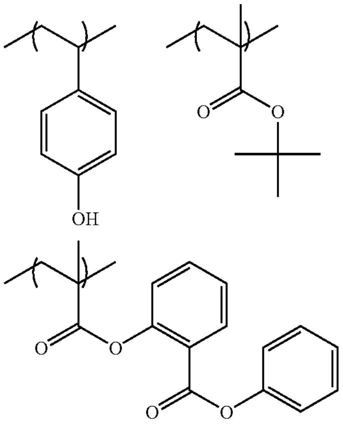

-continued
(A-118)
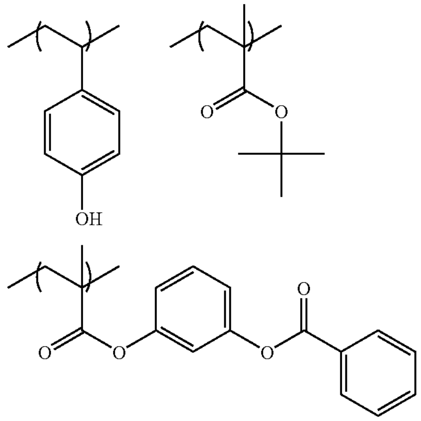
(A-119)
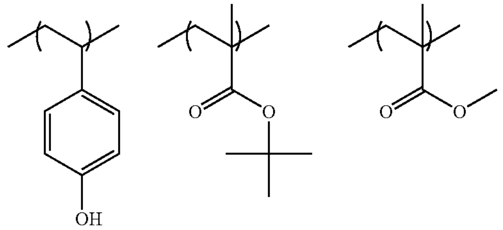
(A-120)
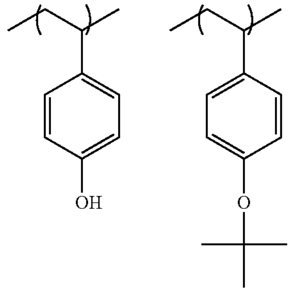
(A-121)
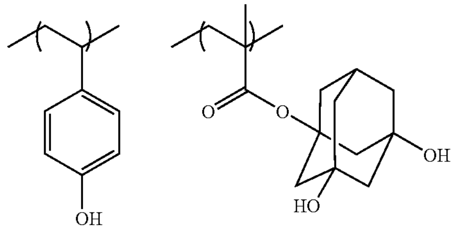
(A-122)
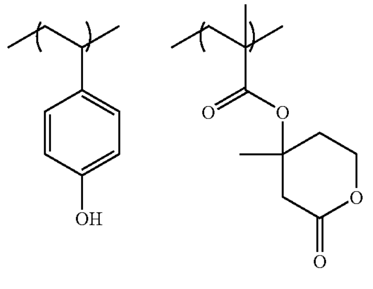
-continued
(A-123)
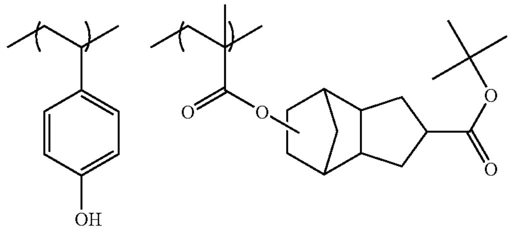
(A-124)
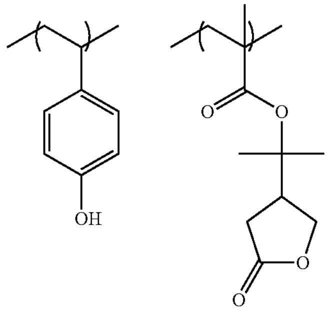
(A-125)
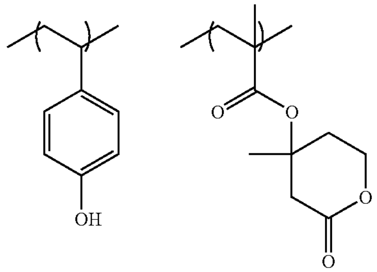
(A-126)
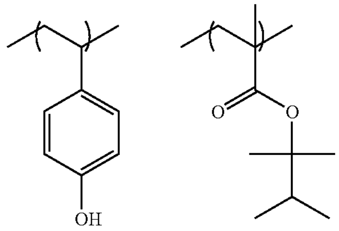
(A-127)
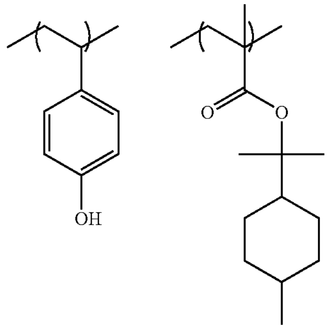

-continued (A-128)

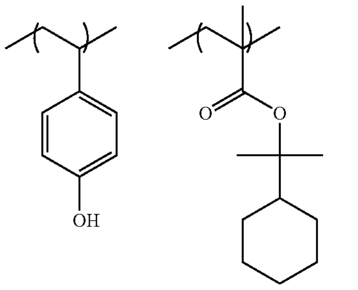

(A-129)

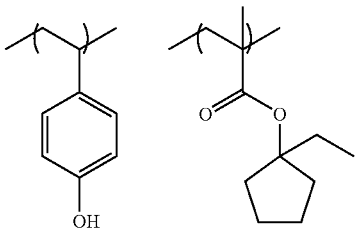

(A-130)

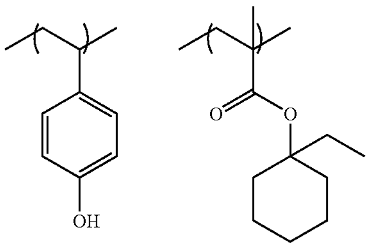

(A-131)

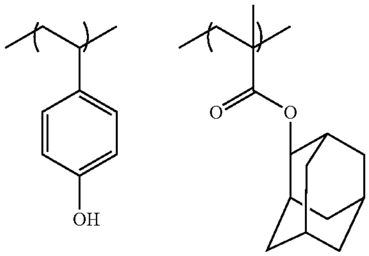

(A-132)

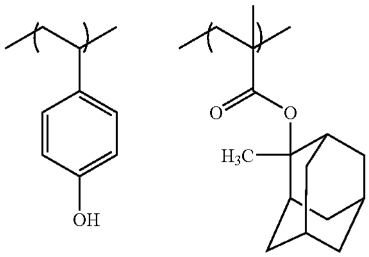

(A-133)

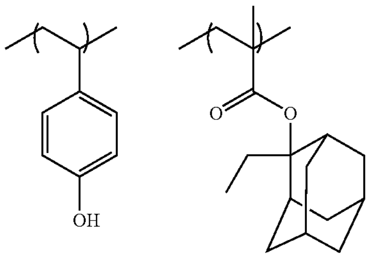

-continued (A-134)

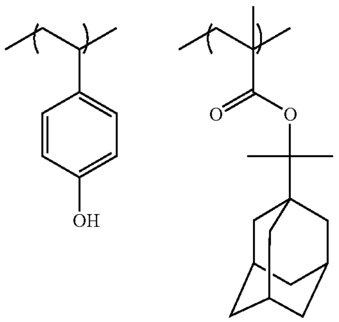

(A-135)

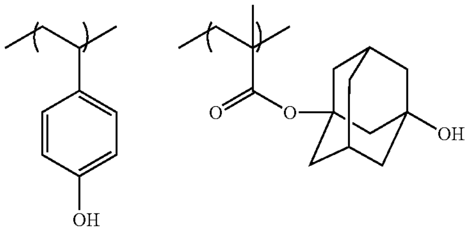

Specific examples (M-1) to (M-31) of the main chain terminal and specific examples (A-1) to (A-135) of the repeating unit in the main chain of the resin (A) may be combined in any combination.

[2] Compound Capable of Generating an Acid Upon Irradiation with Actinic Rays or Radiation The resist composition of the present invention comprises a compound capable of generating an acid upon irradiation with actinic rays or radiation (hereinafter sometimes referred to as an "acid generator").

The acid generator which can be used may be appropriately selected from a photoinitiator for photocationic polymerization, a photoinitiator for photoradical polymerization, a photo-decoloring agent for coloring matters, a photo-discoloring agent, a compound known to generate an acid upon irradiation with actinic rays or radiation such as KrF excimer laser light, electron beam and EUV and used for microresist or the like, and a mixture thereof.

Examples of such an acid generator include a diazonium salt, a phosphonium salt, a sulfonium salt, an iodonium salt, imidosulfonate, oxime sulfonate, diazodisulfone, disulfone and o-nitrobenzyl sulfonate.

Also, a compound where a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, the compounds represented by the following formulae (ZI), (ZII) and (ZIII) are preferred.

(ZI)

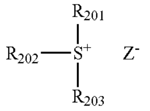

(ZII)

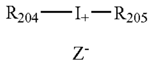

(ZIII)

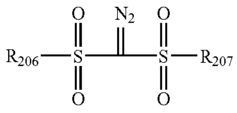

In formula (ZI), $R_{201}$, $R_{202}$ and $R_{203}$ each independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition with aging due to intramolecular nucleophilic reaction. By this anion, the aging stability of the resist is enhanced.

Examples of the sulfonate anion include aliphatic sulfonate anion, aromatic sulfonate anion and camphorsulfonate anion.

Examples of the carboxylate anion include aliphatic carboxylate anion, aromatic carboxylate anion and aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

As the organic group as $R_{201}$, $R_{202}$ and $R_{203}$, for example, corresponding groups in the compounds (ZI-1), (ZI-2) and (ZI-3) which are described later are exemplified.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkyl-sulfonium compound, and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by eliminating one hydrogen atom from a pyrrole), a furan residue (a group formed by eliminating one hydrogen atom from a furan), a thiophene residue (a group formed by eliminating one hydrogen atom from a thiophene), an indole residue (a group formed by eliminating one hydrogen atom from an indole), a benzofuran residue (a group formed by eliminating one hydrogen atom from a benzofuran), and a benzothiophene residue (a group formed by eliminating one hydrogen atom from a benzothiophene). In the case where the arylsulfonium compound has two or more aryl groups, these two or more aryl groups may be the same of different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group of $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group or cycloalkyl group of $R_{201}$ to $R_{203}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

(ZI-3)

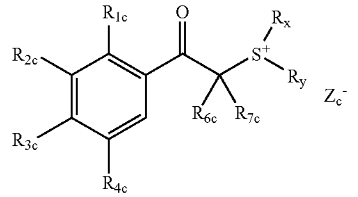

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, the pair of $R_{6c}$ and $R_{7c}$, or the pair of $R_x$ and $R_y$ may combine with each other to form a ring structure, and the ring structure may contain an oxygen atom, a sulfur atom, an ester bond or an amido bond. Examples of the group formed by combining any two or more members out of $R_{1c}$ to $R_{5c}$, the pair of $R_{6c}$ and $R_{7c}$, or the pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group of $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group of $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. In this case, the solvent solubility is enhanced, and generation of particles during storage can be suppressed.

Examples of the alkyl group and cycloalkyl group of $R_x$ and $R_y$ include the same alkyl group and cycloalkyl group as in $R_{1c}$ to $R_{7c}$. Above all, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group include the same alkoxy group as in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ and $R_{207}$ may be an aryl group having a heterocyclic structure containing an oxygen atom, a nitrogen atom, a sulfur atom or the like. Examples of the aryl group having a heterocyclic structure include a pyrrole residue (a group formed by eliminating one hydrogen atom from a pyrrole), a furan residue (a group formed eliminating one hydrogen atom from a furan), a thiophene residue (a group formed by eliminating one hydrogen atom from a thiophene), an indole residue (a group formed by eliminating one hydrogen atom from an indole), a benzofuran residue (a group formed by eliminating one hydrogen atom from a benzofuran), and a benzothiophene residue (a group formed by eliminating one hydrogen atom from a benzothiophene).

The alkyl group or cycloalkyl group of $R_{204}$ to $R_{207}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include the compounds represented by the following formulae (ZIV), (ZV) and (ZVI):

ZIV

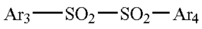

ZV

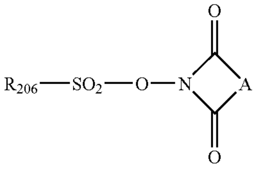

ZVI

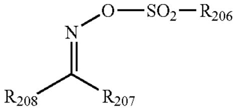

In formulae (ZIV) to (ZVI), $Ar_3$ and $Ar_4$ each independently represents an aryl group.

$R_{206}$, $R_{207}$ and $R_{208}$ each independently represents an alkyl group, a cycloalkyl group or an aryl group.

A represents an alkylene group, an alkenylene group or an arylene group.

Among the acid generators, more preferred are the compounds represented by formulae (ZI) to (ZIII).

Also, the acid generator is preferably a compound capable of generating an acid having one sulfonic acid group or imide group, more preferably a compound capable of generating a monovalent perfluoroalkanesulfonic acid, a compound capable of generating a monovalent aromatic sulfonic acid substituted by a fluorine atom or a fluorine atom-containing group, or a compound capable of generating a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the usable acid generator preferably generates a fluoro-substituted alkanesulfonic acid, a fluoro-substituted benzenesulfonic acid or a fluoro-substituted imide acid, which are an acid having a pKa of −1 or less, and in this case, the sensitivity can be enhanced.

<Sulfonic Acid Generator>

The compound capable of generating a sulfonic acid upon irradiation with actinic rays or radiation (hereinafter, sometimes referred to as a "sulfonic acid generator"), which is preferred as the acid generator, is a compound capable of generating a sulfonic acid upon irradiation with actinic rays or radiation such as KrF excimer laser light, electron beam and EUV, and examples thereof include a diazonium salt, a phosphonium salt, a sulfonium salt, an iodonium salt, imidosulfonate, oxime sulfonate, diazodisulfone, disulfone and o-nitrobenzyl sulfonate.

From the standpoint of enhancing the image performance such as resolving power and pattern profile, a sulfonium salt, an iodonium salt, imidosulfonate, oxime sulfonate, diazodisulfone and disulfone are preferred.

In consideration of remaining of standing waves, imidosulfonate, oxime sulfonate, diazodisulfone and disulfone are more preferred, and oxime sulfonate and diazodisulfone are still more preferred.

The sulfonic acid generator can be synthesized by a known method such as synthesis method described in JP-A-2002-27806.

Particularly preferred examples of the sulfonic acid generator are set forth below.

B-1
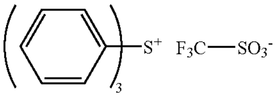
B-2
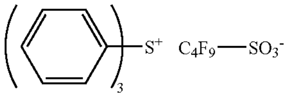
B-3
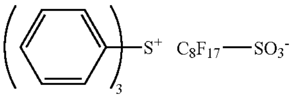
B-4
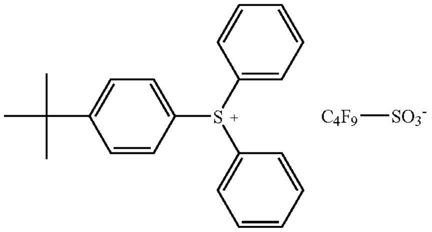
B-5
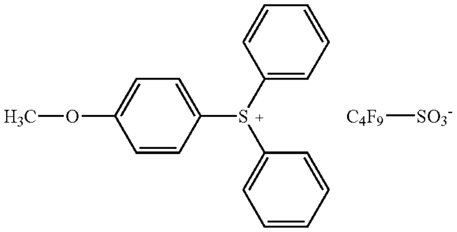
B-6
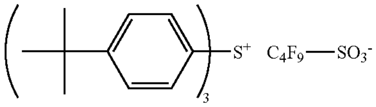
B-7
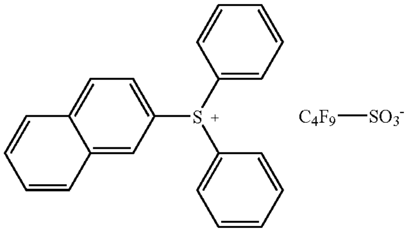
B-8
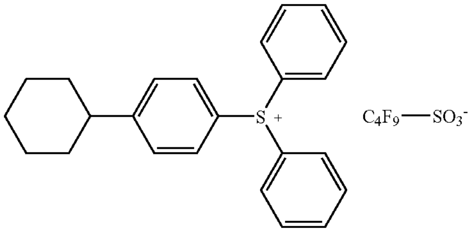
B-9
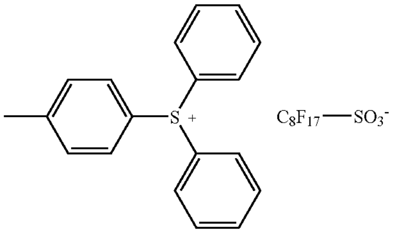
B-10
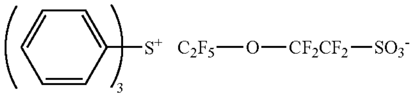
B-11
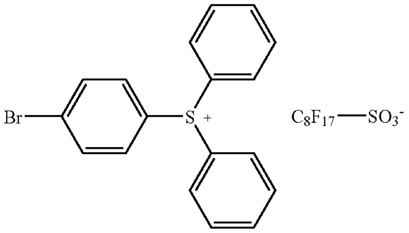
B-12
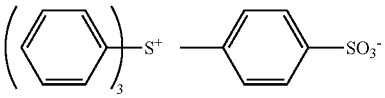
B-13
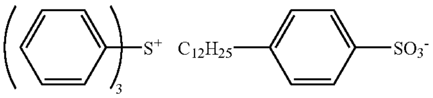
B-14
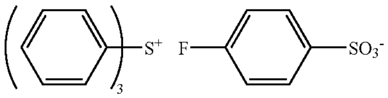
B-15
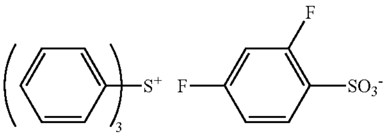
B-16
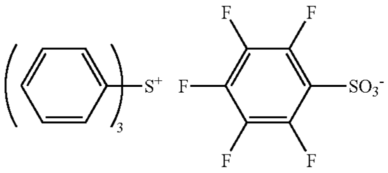

-continued
B-17
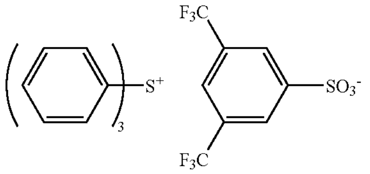
B-18
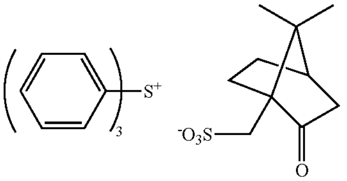
B-19
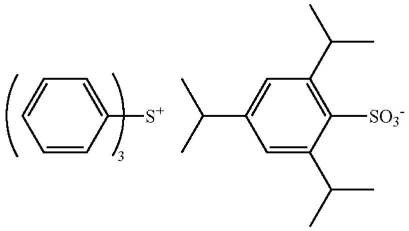
B-20
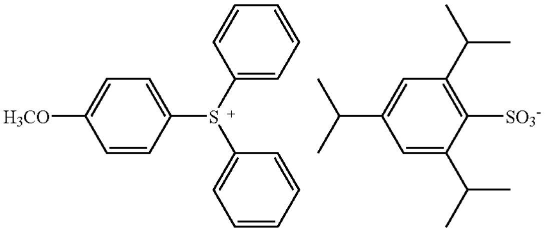
B-21
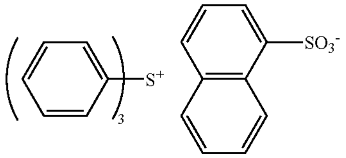
B-22
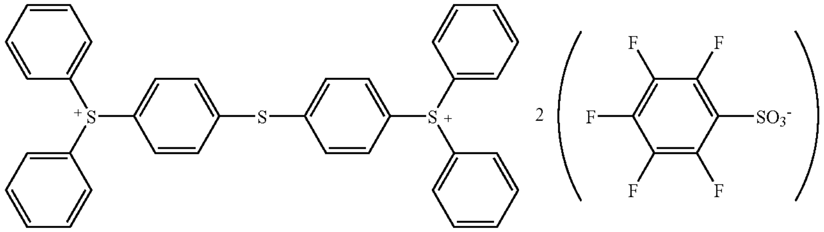
B-23
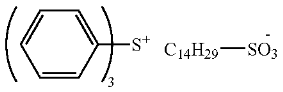
B-24
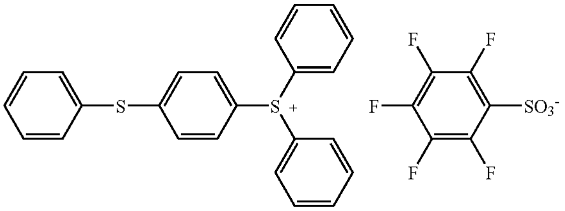
B-25
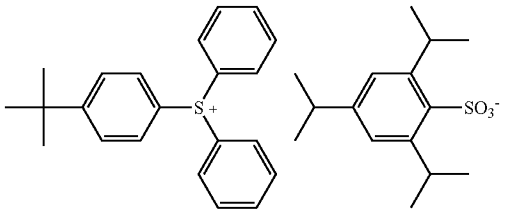
B-26
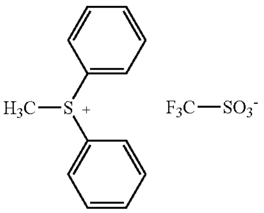
B-27
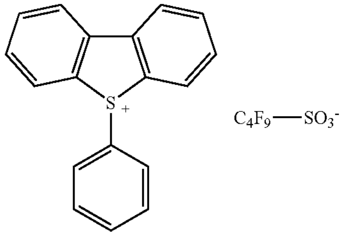
B-28
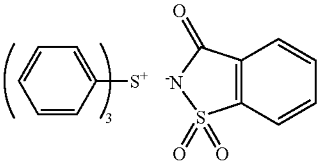

-continued
B-29
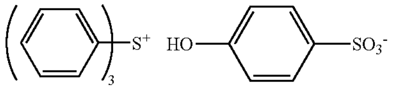
B-30
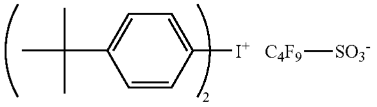
B-31
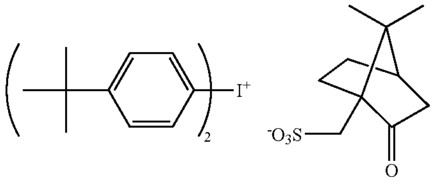
B-32
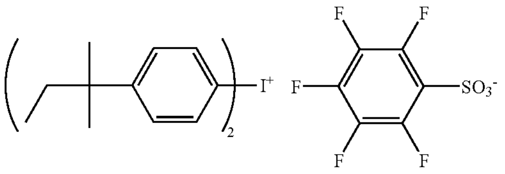
B-33
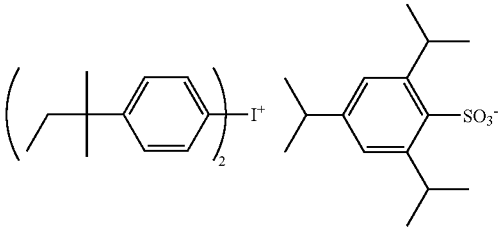
B-34
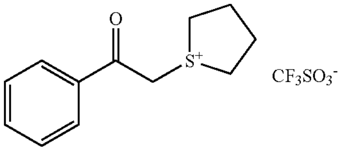
B-35
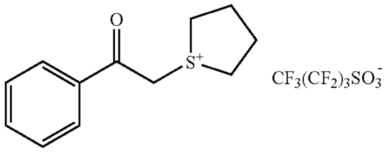
B-36
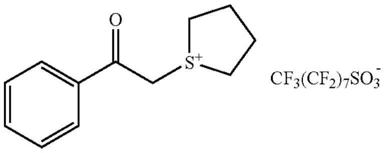
B-37
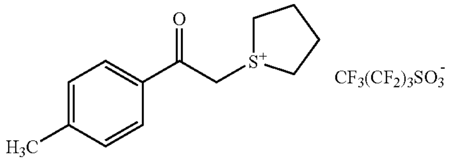
B-38
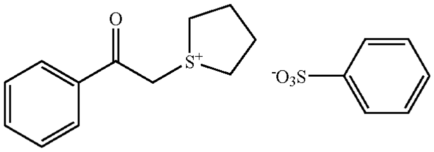
B-39
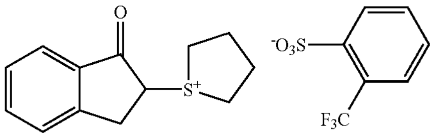
B-40
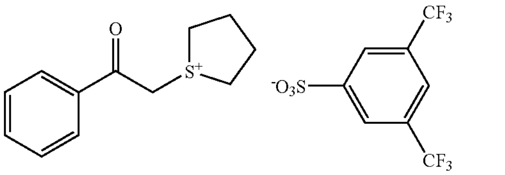
B-41
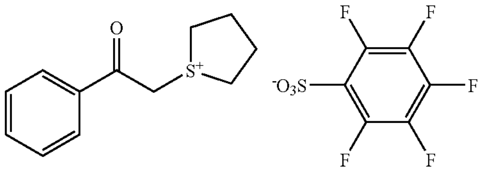
B-42
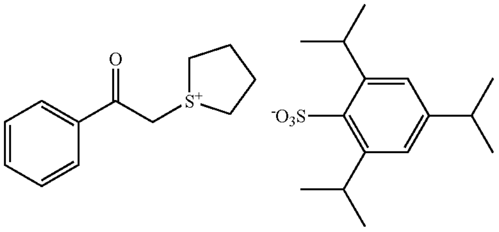
B-43
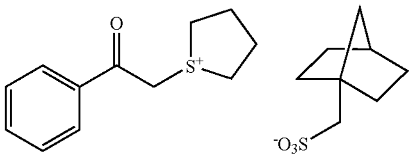
B-44
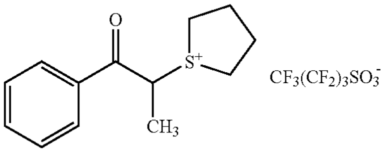
B-45
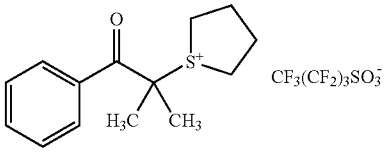
B-46
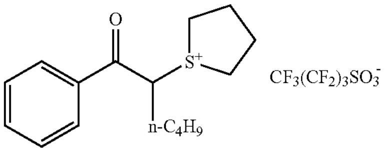

-continued
B-47
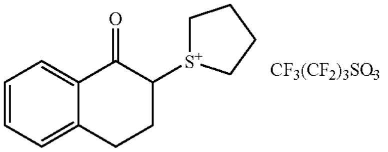
B-48
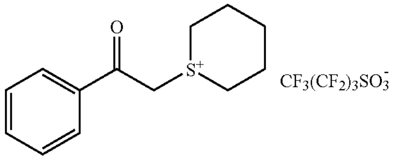
B-49
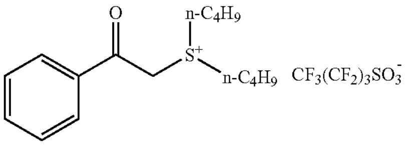
B-50
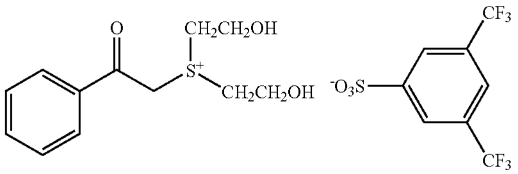
B-51
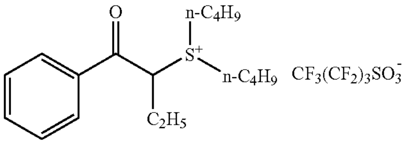
B-52
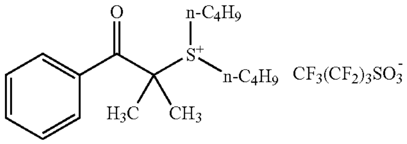
B-53
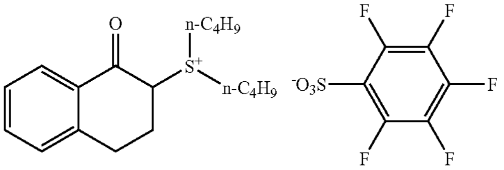
B-54
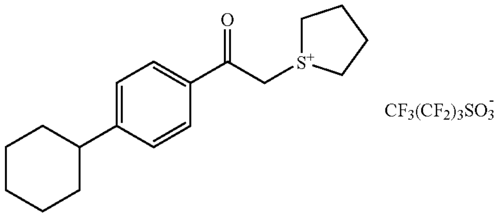
B-55
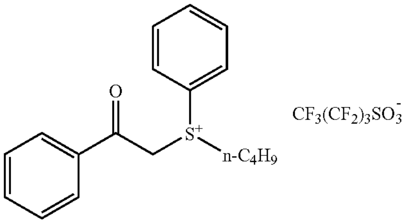
B-56
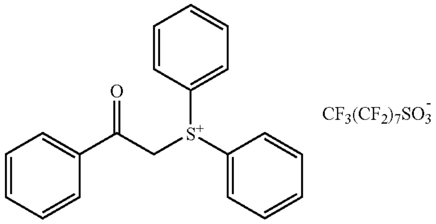
B-57
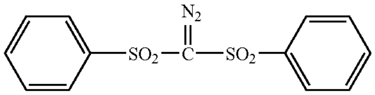
B-58
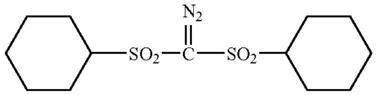
B-59
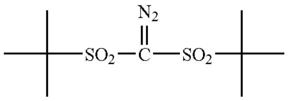
B-60
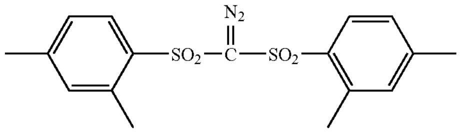
B-61
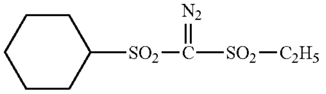
B-62
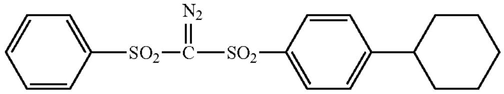
B-63
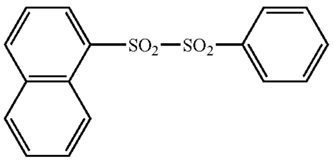
B-64
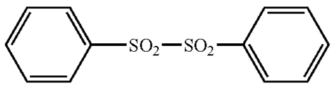

-continued
B-65
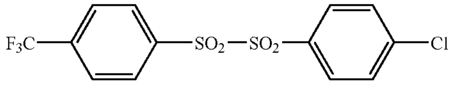
B-66
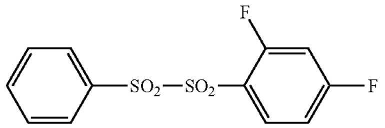
B-67
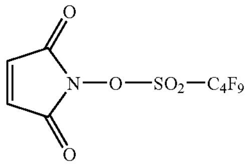
B-68
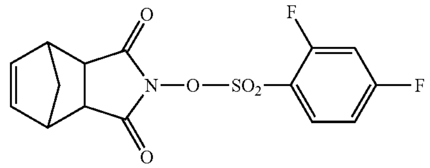
B-69
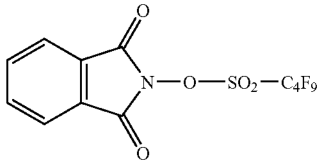
B-70
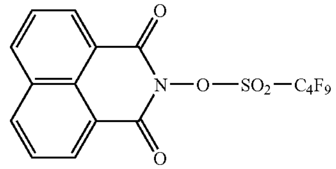
B-71
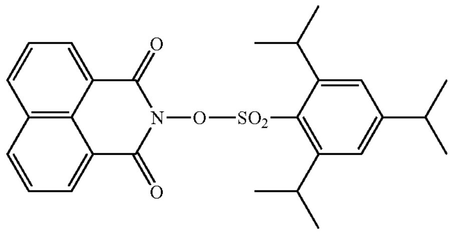
B-72
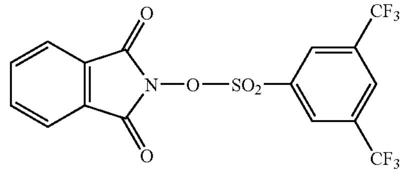
B-73
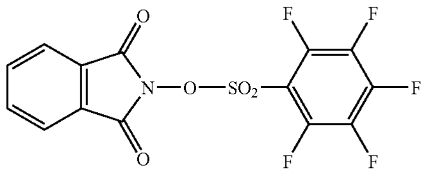
B-74
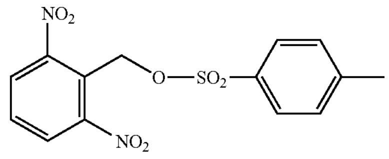
B-75
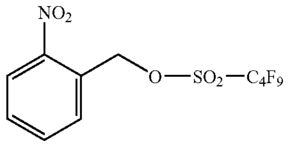
B-76
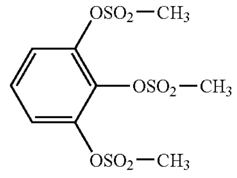
B-77
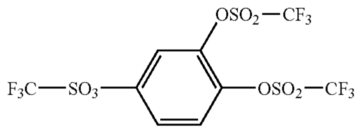
B-78
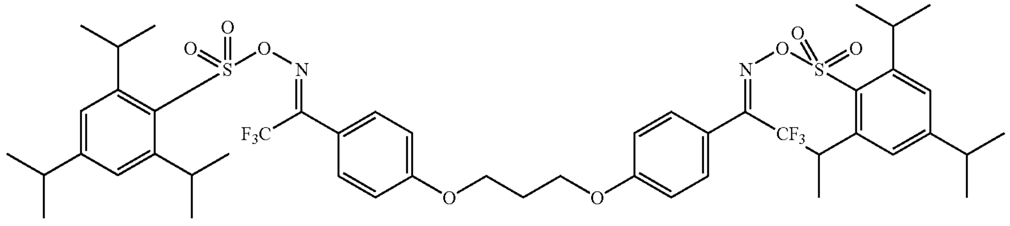

-continued
B-79
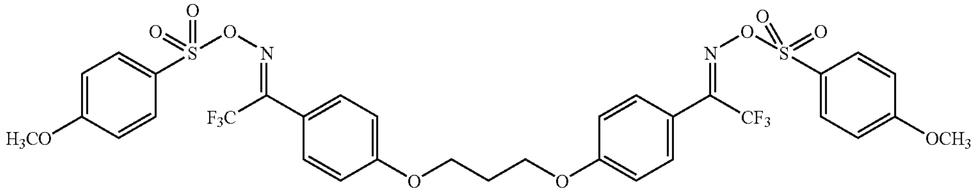
B-80
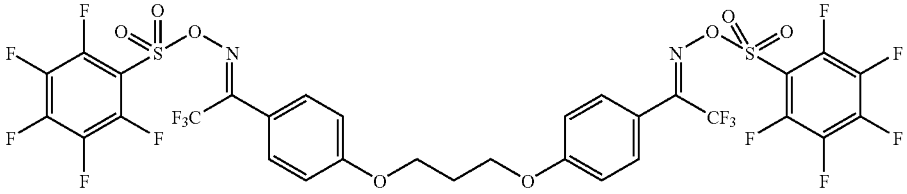
B-81
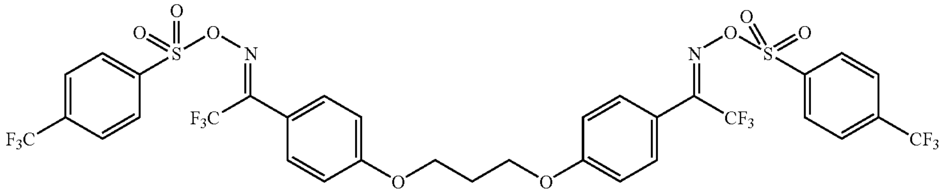
B-82
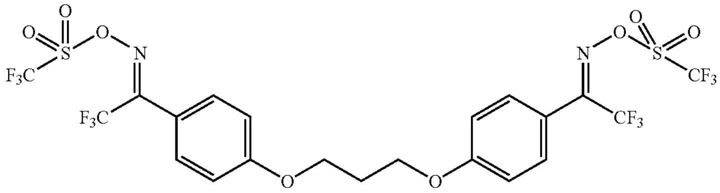
B-83
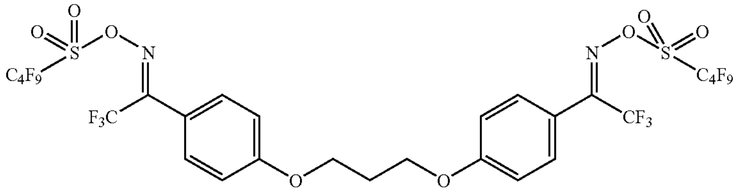
B-84
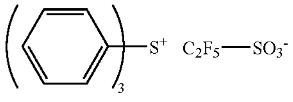
B-85
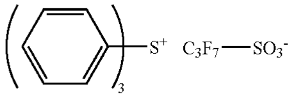
B-86
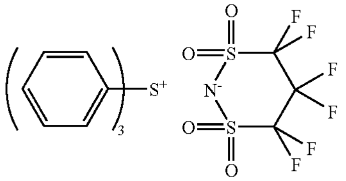
B-87
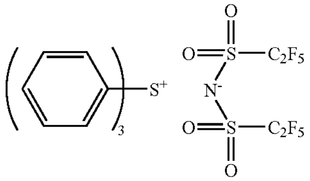
B-88
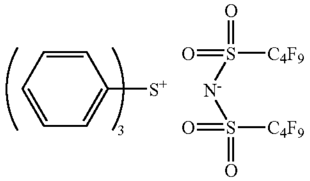
B-89
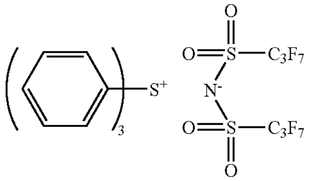

-continued

B-90

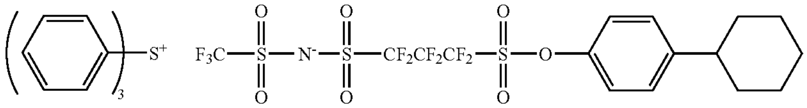

B-91

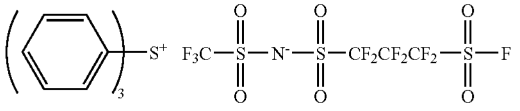

B-92

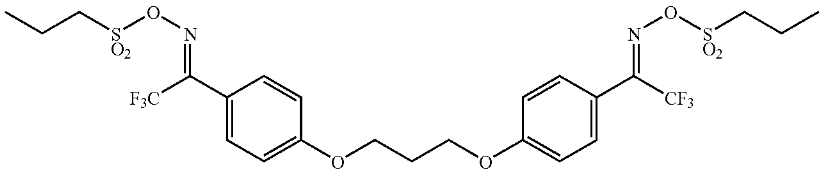

B-93

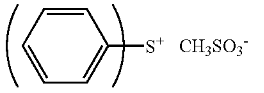

B-94

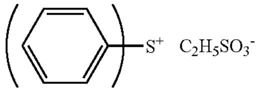

B-95

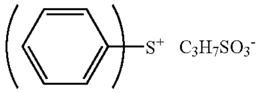

B-96

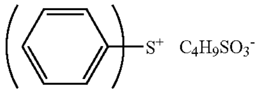

B-97

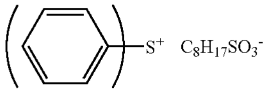

B-98

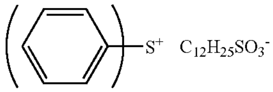

B-99

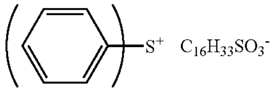

The content of the acid generator is generally from 0.5 to 20 mass %, preferably from 1 to 15 mass %, more preferably from 1 to 10 mass %, based on the entire solid content of the resist composition. That is, the content is preferably 1 mass % or more in view of sensitivity or line edge roughness and preferably 10 mass % or less in view of resolving power, pattern profile and film quality.

One kind of the acid generator may be used, or two or more kinds thereof may be mixed and used. For example, a compound capable of generating an arylsulfonic acid upon irradiation with actinic rays or radiation and a compound capable of generating an alkylsulfonic acid upon irradiation with actinic rays or radiation may be used in combination as the acid generator.

<Carboxylic Acid Generator>

A compound capable of generating a carboxylic acid upon irradiation with actinic rays or radiation (hereinafter, sometimes referred to as a “carboxylic acid generator”) may also be used.

The carboxylic acid generator is preferably a compound represented by the following formula (C):

(C)

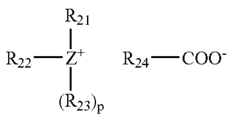

In formula (C), $R_{21}$ to $R_{23}$ each independently represents an alkyl group, a cycloalkyl group, an alkenyl group or an aryl group, $R_{24}$ represents a hydrogen atom, an alkyl group, a cycloalkyl group, an alkenyl group or an aryl group, and Z represents a sulfur atom or an iodine atom. When Z is a sulfur atom, p is 1, and when an iodine atom, p is 0.

In formula (C), $R_{21}$ to $R_{23}$ each independently represents an alkyl group, a cycloalkyl group, an alkenyl group or an aryl group, and these groups each may have a substituent.

Examples of the substituent which the alkyl group, cycloalkyl group and alkenyl group each may have include a halogen atom (e.g., chlorine, bromine, fluorine), an aryl group (e.g., phenyl, naphthyl), a hydroxy group and an alkoxy group (e.g., methoxy, ethoxy, butoxy).

Examples of the substituent which the aryl group may have include a halogen atom (e.g., chlorine, bromine, fluorine), a nitro group, a cyano group, an alkyl group (e.g., methyl, ethyl, tert-butyl, tert-amyl, octyl), a hydroxy group and an alkoxy group (e.g., methoxy, ethoxy, butoxy).

$R_{21}$ to $R_{23}$ each is, independently, preferably an alkyl group having a carbon number of 1 to 12, a cycloalkyl group having a carbon number of 3 to 12, an alkenyl group having a carbon number of 2 to 12, or an aryl group having a carbon number of 6 to 24, more preferably an alkyl group having a carbon number of 1 to 6, a cycloalkyl group having a carbon number of 3 to 6, or an aryl group having a carbon number of 6 to 18, still more preferably an aryl group having a carbon number of 6 to 15, and these groups each may have a substituent.

$R_{24}$ represents a hydrogen atom, an alkyl group, a cycloalkyl group, an alkenyl group or an aryl group.

Examples of the substituent which the alkyl group, cycloalkyl group and alkenyl group each may have are the same as those of the substituent described above when $R_{21}$ is an alkyl group. Examples of the substituent of the aryl group are the same as those of the substituent described above when $R_{21}$ is an aryl group.

$R_{24}$ is preferably a hydrogen atom, an alkyl group having a carbon number of 1 to 30, a cycloalkyl group having a carbon number of 3 to 30, an alkenyl group having a carbon number of 2 to 30, or an aryl group having a carbon number of 6 to 24, more preferably an alkyl group having a carbon number of 1 to 18, a cycloalkyl group having a carbon number of 3 to 18, or an aryl group having a carbon number of 6 to 18, still more preferably an alkyl group having a carbon number of 1 to 12, a cycloalkyl group having a carbon number of 3 to 12, or an aryl group having a carbon number of 6 to 15. These groups each may have a substituent.

Z represents a sulfur atom or an iodine atom. p is 1 when Z is a sulfur atom, and 0 when Z is an iodine atom.

Incidentally, two or more cation moieties of formula (C) may combine through a single bond or a linking group (e.g., —S—, —O—) to form a cation structure having a plurality of cation moieties of formula (C).

Specific preferred examples of the carboxylic acid generator are set forth below, but the present invention is of course not limited thereto.

C-1

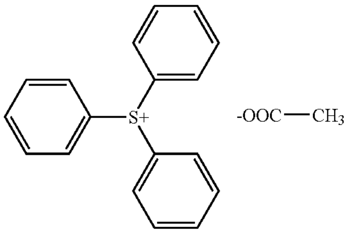

C-2

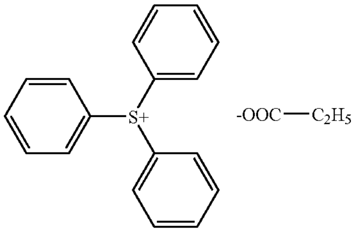

C-3

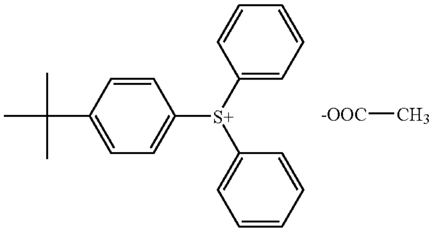

C-4

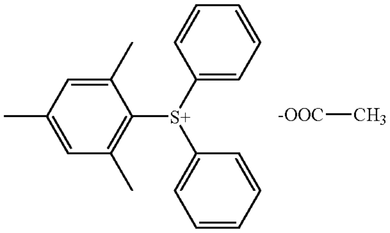

-continued

C-5

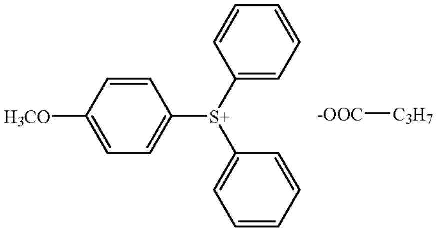

C-6

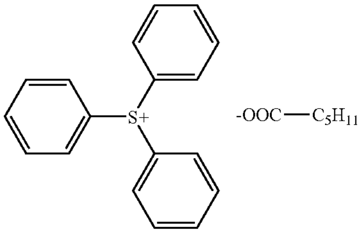

C-7

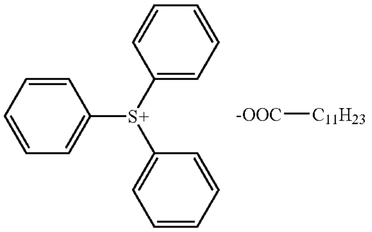

C-8

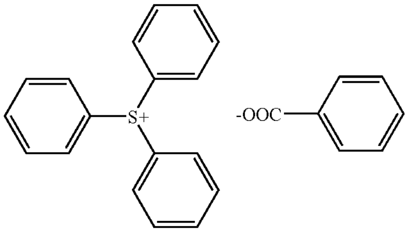

C-9

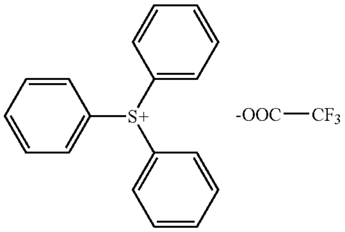

C-10

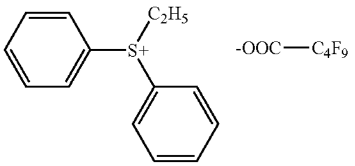

C-11

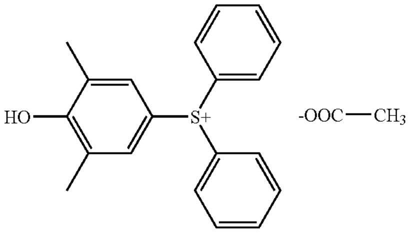

-continued
C-12
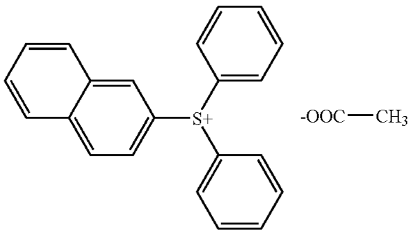
C-13
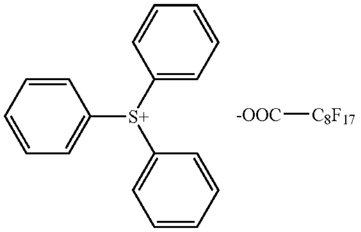
C-14
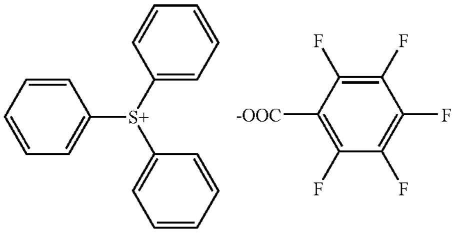
C-15
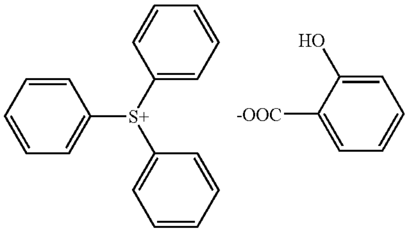
C-16
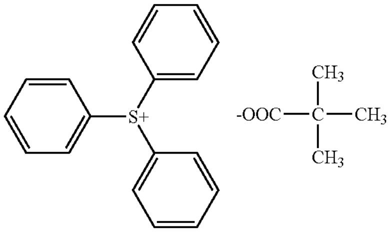
C-17
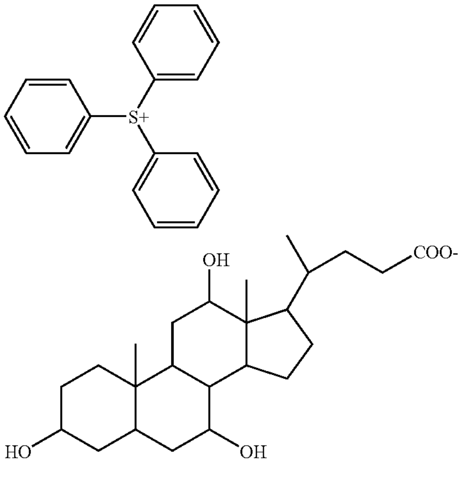
-continued
C-18
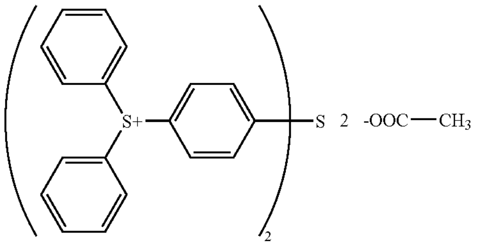
C-19
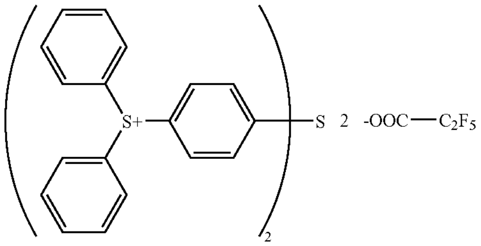
C-20
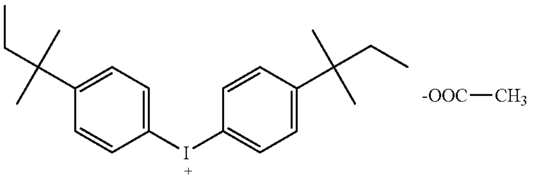
C-21
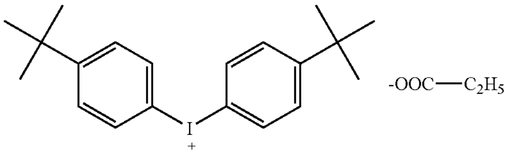
C-22
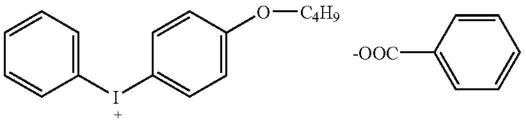
C-23
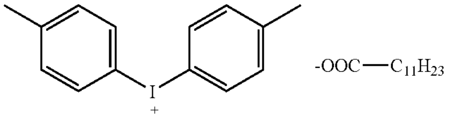
C-24
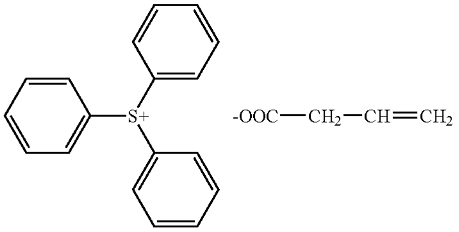

-continued

C-25

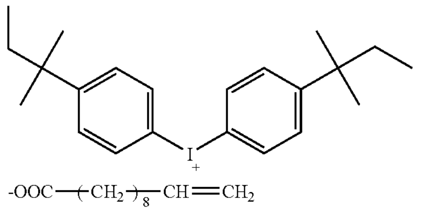

The content of the carboxylic acid generator in the positive resist composition of the present invention is preferably from 0.01 to 10 mass %, more preferably from 0.03 to 5 mass %, still more preferably from 0.05 to 3 mass %, based on the entire solid content of the composition. One of these carboxylic acid generators may be used, or two or more kinds thereof may be mixed and used.

The carboxylic acid generator can be synthesized by a known method such as synthesis method described in JP-A-2002-27806.

In the case of using a sulfonic acid generator (B) and a carboxylic acid generator (C) in combination, C/B (ratio by mass) is usually from 99.9/0.1 to 50/50, preferably from 99/1 to 60/40, more preferably from 98/2 to 70/30.

[3] Compound Having a Proton Acceptor Functional Group and Undergoing Decomposition Upon Irradiation with Actinic Rays or Radiation to Generate a Compound Reduced in or Deprived of the Proton Acceptor Property or Changed to be Acidic from Being Proton Acceptor-Functioning In view of sensitivity, resolution and line edge roughness, the positive resist composition of the present invention preferably contains a compound having a proton acceptor functional group and undergoing decomposition upon irradiation with actinic rays or radiation to generate a compound reduced in or deprived of the proton acceptor property or changed to be acidic from being proton acceptor-functioning (hereinafter sometimes referred to as a "compound (PA)").

The compound reduced in or deprived of the proton acceptor property or changed to be acidic from being proton acceptor-functioning, which is generated resulting from decomposition of the compound (PA) upon irradiation with actinic rays or radiation, includes a compound represented by the following formula (PA-I):

$$Q\text{-}A\text{-}(X)n\text{-}B\text{-}R \qquad \text{(PA-I)}$$

In formula (PA-I), A represents a divalent linking group.

Q represents a sulfo group ($-SO_3H$) or a carboxyl group ($-CO_2H$).

X represents $-SO_2-$ or $-CO-$.

n represents 0 or 1.

B represents a single bond, an oxygen atom or —N(Rx)-.

Rx represents a hydrogen atom or a monovalent organic group.

R represents a monovalent organic group containing a proton acceptor functional group, or a monovalent organic group containing an ammonium group.

The divalent linking group of A is preferably a divalent linking group having a carbon number of 2 to 12, such as alkylene group and phenylene group, more preferably an alkylene group having at least one fluorine atom, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of hydrogen atoms are replaced by a fluorine atom, more preferably an alkylene group where the carbon atom bonded to the Q site has a fluorine atom, still more preferably a perfluoroalkylene group, yet still more preferably a perfluoroethylene group, a perfluoropropylene group, or a perfluorobutylene group.

The monovalent organic group of Rx is preferably a monovalent organic group having a carbon number of 4 to 30, and examples thereof include an alkyl group, a cycloalkyl group, an aryl group, an aralkyl group and an alkenyl group.

The alkyl group of Rx, which may have a substituent, is preferably a linear or branched alkyl group having a carbon number of 1 to 20 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The alkyl group having a substituent includes, particularly, a group where a cycloalkyl group is substituted to a linear or branched alkyl group, such as adamantylmethyl group, adamantylethyl group, cyclohexylethyl group and camphor residue.

The cycloalkyl group of Rx, which may have a substituent, is preferably a cycloalkyl group having a carbon number of 3 to 20 and may contain an oxygen atom in the ring. Specific examples thereof include a cyclopropyl group, a cyclopentyl group, a cyclohexyl group, a norbornyl group and an adamantyl group.

The aryl group of Rx, which may have a substituent, is preferably an aryl group having a carbon number of 6 to 14, and examples thereof include a phenyl group and a naphthyl group.

The aralkyl group of Rx, which may have a substituent, is preferably an aralkyl group having a carbon number of 7 to 20, and examples thereof include a benzyl group, a phenethyl group, a naphthylmethyl group and a naphthylethyl group.

The alkenyl group of Rx, which may have a substituent, includes a group having a double bond at an arbitrary position of the alkyl group described, for example, as Rx.

The proton acceptor functional group of R is a functional group having a group or electron capable of electrostatically interacting with a proton and indicates, for example, a functional group having a microcyclic structure such as cyclic polyether, or a functional group containing a nitrogen atom having a lone electron pair not contributing to π-conjugation. The nitrogen atom having a lone electron pair not contributing to π-conjugation is, for example, a nitrogen atom having a partial structure represented by either one of the following formulae:

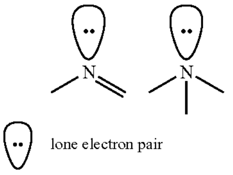

Preferred examples of the partial structure of the proton acceptor functional group include a crown ether structure, an aza-crown ether structure, a tertiary amine structure, a secondary amine structure, a primary amine structure, a pyridine structure, an imidazole structure and a pyrazine structure.

Preferred examples of the partial structure of the ammonium group include a tertiary ammonium structure, a secondary ammonium structure, a primary ammonium structure, a pyridinium structure, an imidazolinium structure and a pyrazinium structure.

The group containing such a structure preferably has a carbon number of 4 to 30, and examples thereof include an alkyl group, a cycloalkyl group, an aryl group, an aralkyl group and an alkenyl group.

The alkyl group, cycloalkyl group, aryl group, aralkyl group and alkenyl group in the alkyl group, cycloalkyl group, aryl group, aralkyl group or alkenyl group as R containing a proton acceptor functional group or an ammonium group are the same as the alkyl group, cycloalkyl group, aryl group, aralkyl group and alkenyl group described for Rx.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include one or two alkyl groups (preferably having a carbon number of 1 to 20).

When B is —N(Rx)-, R and Rx preferably combine to form a ring. By forming a ring structure, the stability is enhanced and the composition using this compound is also increased in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4-membered ring, a 5-membered ring, a 6-membered ring, a 7-membered ring and a 8-membered ring each containing a nitrogen atom. Examples of the polycyclic structure include a structure comprising a combination of two monocyclic structures or a combination of three or more monocyclic structures. The monocyclic structure and polycyclic structure each may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, examples of the substituent further include an alkyl group (preferably having a carbon number of 1 to 15). As for the aminoacyl group, examples of the substituent further include one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond, and then hydrolyzing the other sulfonyl halide moiety, or a method of ring-opening a cyclic sulfonic anhydride through reaction with an amine compound.

Specific preferred examples of the compound represented by formula (PA-I) are set forth below, but the present invention is not limited thereto.

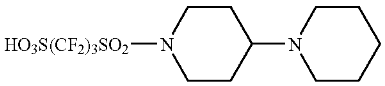

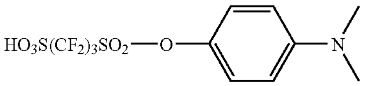

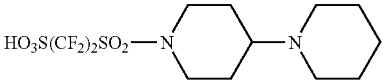

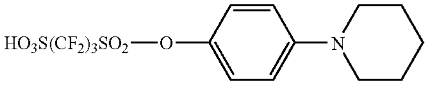

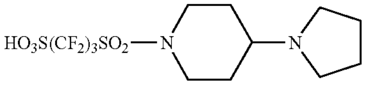

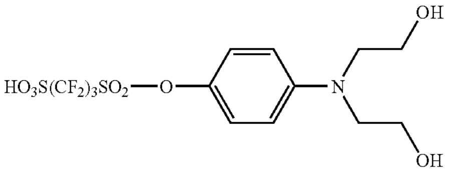

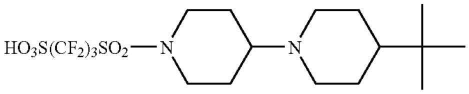

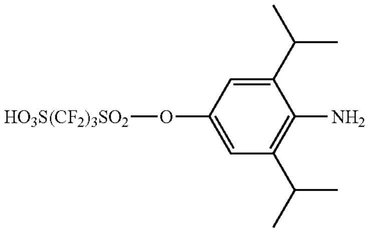

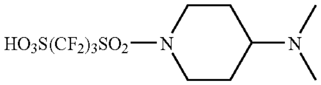

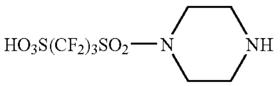

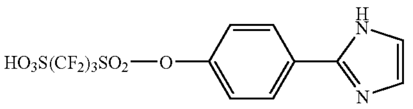

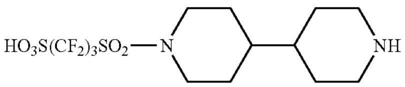

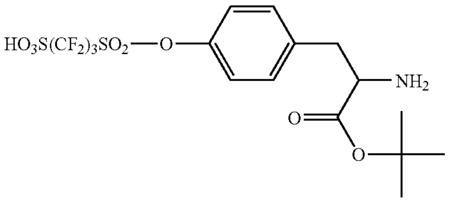

-continued

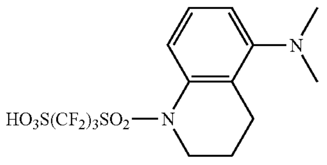

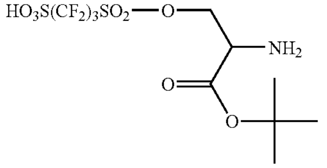

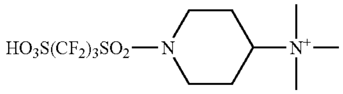

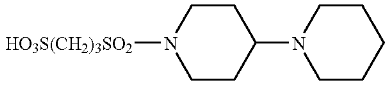

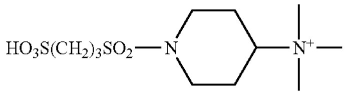

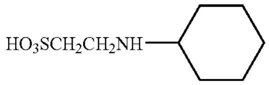

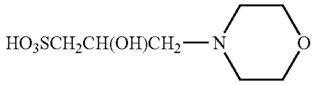

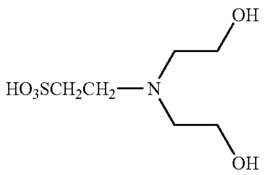

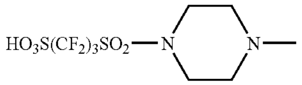

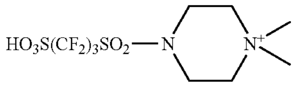

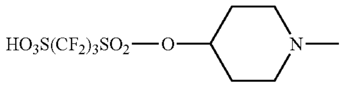

$HO_3S(CH_2)_3N^+(CH_3)_2(n\text{-}C_{16}H_{33})\ Br^-$

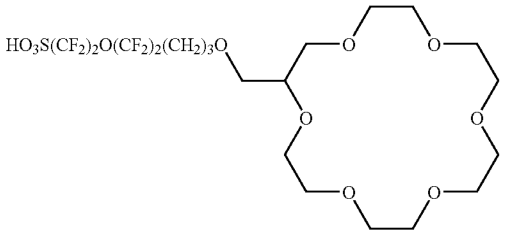

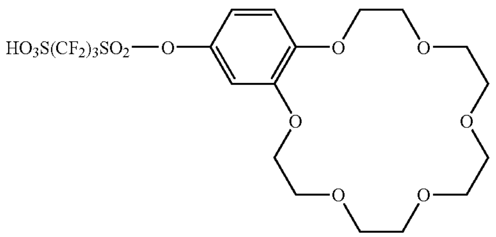

-continued

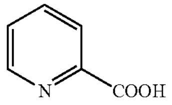
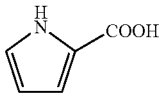
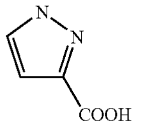

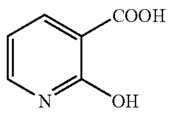
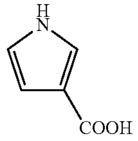
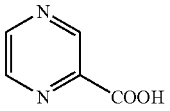

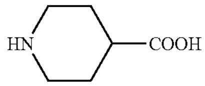
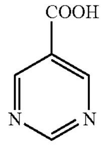

The compound reduced in or deprived of the proton acceptor property or changed to be acidic from being proton acceptor-functioning, which is generated resulting from decomposition of the compound (PA) upon irradiation with actinic rays or radiation, also includes a compound represented by the following formula (PA-II):

$$Q_1\text{-}X_1\text{—}NH\text{—}X_2\text{-}Q_2 \qquad \text{(PA-II)}$$

In formula (PA-II), $Q_1$ and $Q_2$ each independently represents a monovalent organic group, provided that either one of $Q_1$ and $Q_2$ has a proton acceptor functional group. $Q_1$ and $Q_2$ may combine to form a ring and the ring formed may have a proton acceptor functional group.

$X_1$ and $X_2$ each independently represents —CO— or —$SO_2$—.

The monovalent organic group of $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group of $Q_1$ and $Q_2$, which may have a substituent, is preferably a linear or branched alkyl group having a carbon number of 1 to 30 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The cycloalkyl group of $Q_1$ and $Q_2$, which may have a substituent, is preferably a cycloalkyl group having a carbon number of 3 to 20 and may contain an oxygen atom or a nitrogen atom in the ring. Specific examples thereof include a cyclopropyl group, a cyclopentyl group, a cyclohexyl group, a norbornyl group and an adamantyl group.

The aryl group of $Q_1$ and $Q_2$, which may have a substituent, is preferably an aryl group having a carbon number of 6 to 14, and examples thereof include a phenyl group and a naphthyl group.

The aralkyl group of $Q_1$ and $Q_2$, which may have a substituent, is preferably an aralkyl group having a carbon number of 7 to 20, and examples thereof include a benzyl group, a phenethyl group, a naphthylmethyl group and a naphthylethyl group.

The alkenyl group of $Q_1$ and $Q_2$, which may have a substituent, includes a group having a double bond at an arbitrary position of the alkyl group above.

Examples of the substituent which these groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Either one monovalent organic group $Q_1$ or $Q_2$ has a proton acceptor functional group.

The proton acceptor functional group is a functional group having a group capable of electrostatically interacting with a proton or having a lone electron pair, and examples thereof include a functional group having a microcyclic structure such as cyclic polyether, and a functional group containing a nitrogen atom having a lone electron pair less contributing to π-conjugation. The nitrogen atom having a lone electron pair less contributing to π-conjugation includes, for example, a nitrogen atom having a partial structure represented by either one of the following formulae:

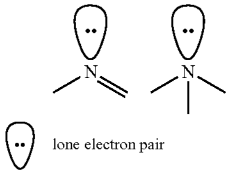

lone electron pair

Preferred examples of the partial structure of the proton acceptor functional group include a crown ether structure, an aza-crown ether structure, a tertiary amine structure, a secondary amine structure, a primary amine structure, a pyridine structure, an imidazole structure, a pyrazine structure and an aniline structure. The group containing such a structure preferably has a carbon number of 4 to 30, and examples thereof include an alkyl group, a cycloalkyl group, an aryl group, an aralkyl group and an alkenyl group. The alkyl group, cycloalkyl group, aryl group, aralkyl group and alkenyl group are the same as those described above.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include an alkyl group (preferably having a carbon number of 1 to 20).

The proton acceptor functional group may be substituted by an organic group having a bond which is breakable by an acid. Examples of the organic group having a bond breakable by an acid include an amido group, an ester group (preferably a tertiary alkyloxycarbonyl group), an acetal group (preferably a 1-alkyloxy-alkyloxy group), a carbamoyl group and a carbonate group.

When $Q_1$ and $Q_2$ combine to form a ring and the ring formed has a proton acceptor functional group, examples of the structure thereof include a structure where the organic group of $Q_1$ or $Q_2$ is further bonded by an alkylene group, an oxy group, an imino group or the like.

In formula (PA-II), at least either one of $X_1$ and $X_2$ is preferably $-SO_2-$.

The compound represented by formula (PA-II) is preferably a compound represented by the following formula (PA-III):

$$Q_1\text{-}X_1\text{—NH—}X_2\text{-A-}(X_3)_n\text{—B-}Q_3 \qquad \text{(PA-III)}$$

In formula (PA-III), $Q_1$ and $Q_3$ each independently represents a monovalent organic group, provided that either one of $Q_1$ and $Q_3$ has a proton acceptor functional group. $Q_1$ and $Q_3$ may combine to form a ring and the ring formed may have a proton acceptor functional group.

$X_1$, $X_2$ and $X_3$ each independently represents —CO— or $-SO_2-$.

A represents a divalent linking group.

B represents a single bond, an oxygen atom or —N(Qx)-.

Qx represents a hydrogen atom or a monovalent organic group.

When B is —N(Qx)-, $Q_3$ and Qx may combine to form a ring.

n represents 0 or 1.

$Q_1$ has the same meaning as $Q_1$ in formula (PA-II).

Examples of the organic group of $Q_3$ are the same as those of the organic group of $Q_1$ and $Q_2$ in formula (PA-II).

The divalent linking group of A is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of hydrogen atoms are replaced by a fluorine atom, more preferably a perfluoroakylene group, still more preferably a perfluoroethylene group, a perfluoropropylene group, or a perfluorobutylene group.

The monovalent organic group of Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those described above.

In formula (PA-III), $X_1$, $X_2$ and $X_3$ each is preferably $-SO_2-$.

Specific examples of the compound represented by formula (PA-II) are set forth below, but the present invention is not limited thereto.

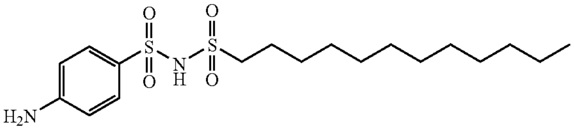
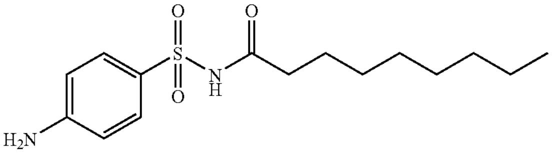
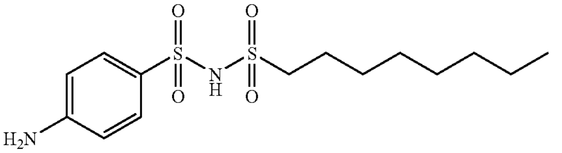
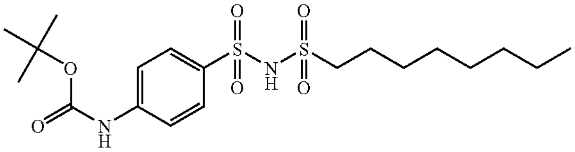
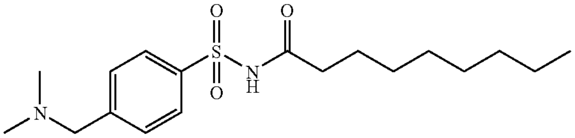
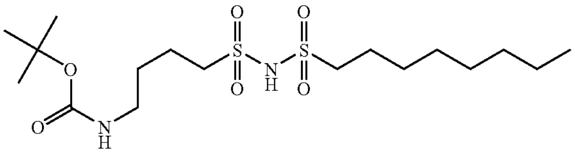
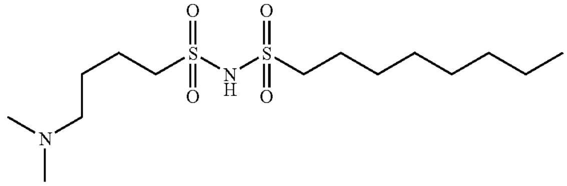
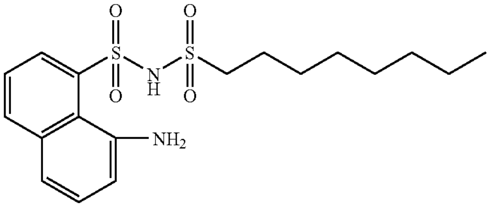
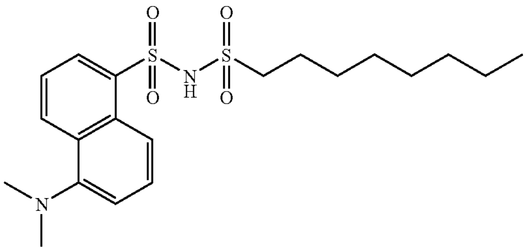
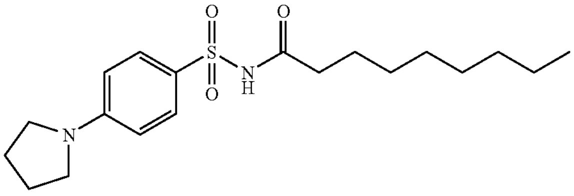
-continued
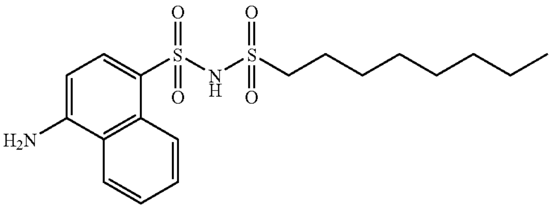
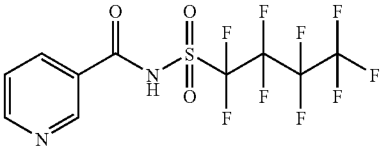
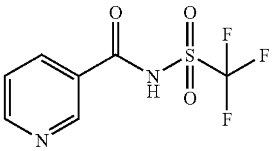
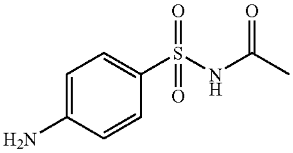
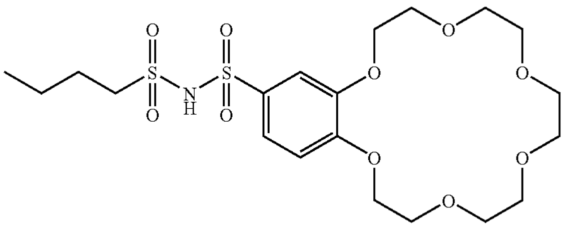
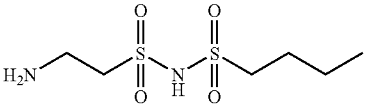
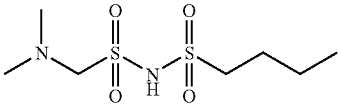
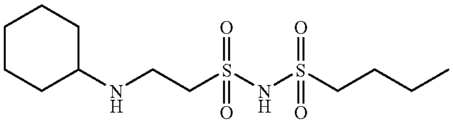
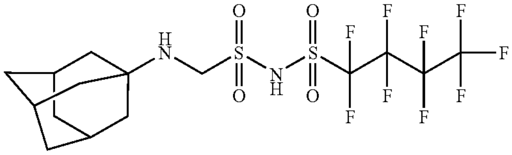
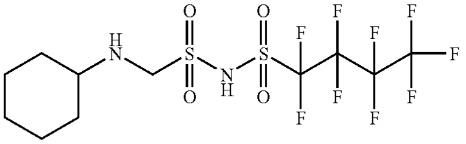
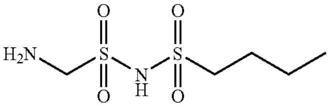
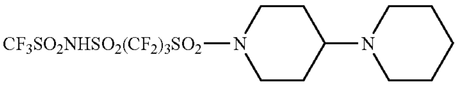

-continued

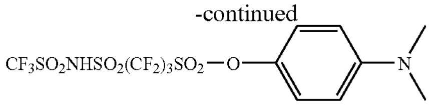

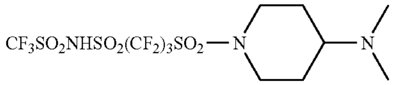

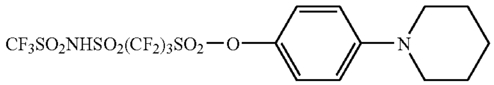

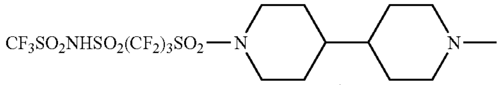

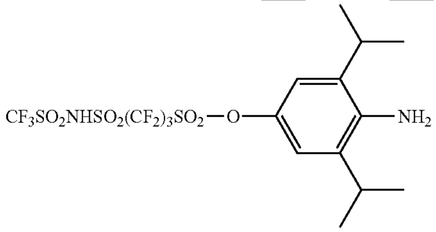

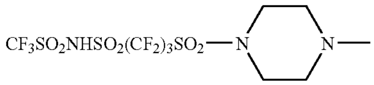

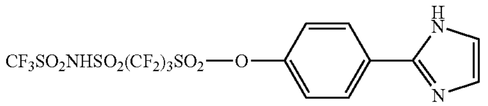

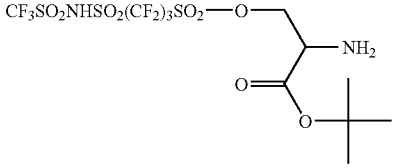

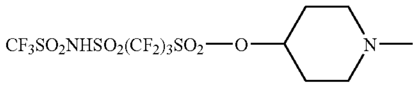

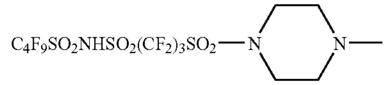

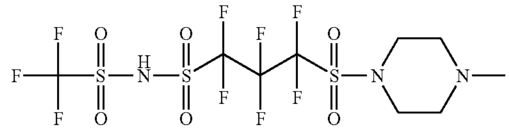

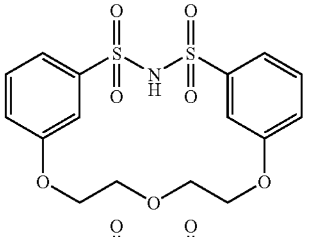

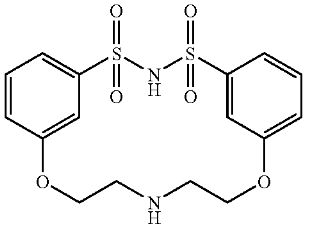

The compound (PA) is preferably a sulfonium salt compound of the compound represented by formula (PA-I), (PA- II) or (PA-III), or an iodonium salt compound of the compound represented by formula (PA-I), (PA-II) or (PA-III), more preferably a compound represented by the following formula (PA1) or (PA2):

(PA1)

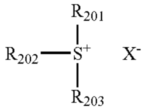

(PA2)

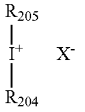

In formula (PA1), $R_{201}$, $R_{202}$ and $R_{203}$ each independently represents an organic group.

$X^-$ represents a sulfonate or carboxylate anion resulting from removal of a hydrogen atom in the —$SO_3H$ moiety or —COOH moiety of the compound represented by formula (PA-I), or an anion of the compound represented by formula (PA-II) or (PA-III).

The carbon number of the organic group of $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amido bond or a carbonyl group. Examples of the group formed by combining two members out of $R_{201}$ to $R_{203}$ include an alkylene group (e.g., butylene, pentylene).

Specific examples of the organic group of $R_{201}$, $R_{202}$ and $R_{203}$ include the corresponding groups in the compounds (A1a), (A1b) and (A1c) described later.

The compound may be a compound having a plurality of structures represented by formula (PA1). For example, the compound may be a compound having a structure where at least one of $R_{201}$ to $R_{203}$ in the compound represented by formula (PA1) is bonded to at least one of $R_{201}$ to $R_{203}$ in another compound represented by formula (PA1).

The component (PA1) is more preferably a compound (A1a), (A1b) or (A1c) described below.

The compound (A1a) is an arylsulfonium compound where at least one of $R_{201}$ to $R_{203}$ in formula (PA1) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, a diarylcycloalkylsulfonium compound, an aryldialkyl-sulfonium compound, an aryldicycloalkylsulfonium compound and an arylalkylcycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (A1b) is described below.

The compound (A1b) is a compound when $R_{201}$ to $R_{203}$ in formula (PA1) each independently represents an aromatic ring-free organic group. The aromatic ring as used herein includes an aromatic ring having a heteroatom.

The aromatic ring-free organic group of $R_{201}$ to $R_{203}$ is an organic group having a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group of $R_{201}$ to $R_{203}$ may be either linear or branched and is preferably a linear or branched alkyl group having a carbon number of 1 to 20 (e.g., methyl, ethyl, propyl, butyl, pentyl). The alkyl group as $R_{201}$ to $R_{203}$ is more preferably a linear or branched 2-oxoalkyl group or an alkoxycarbonylmethyl group.

The cycloalkyl group of $R_{201}$ to $R_{203}$ is preferably a cycloalkyl group having a carbon number of 3 to 10 (e.g., cyclopentyl, cyclohexyl, norbornyl). The cycloalkyl group as $R_{201}$ to $R_{203}$ is more preferably a 2-oxocycloalkyl group.

The linear or branched 2-oxoalkyl group of $R_{201}$ to $R_{203}$ may have a double bond in the chain and is preferably a group having >C=O at the 2-position of the alkyl group above.

The 2-oxocycloalkyl group of $R_{201}$ to $R_{203}$ may have a double bond in the chain and is preferably a group having >C=O at the 2-position of the cycloalkyl group above.

The alkoxy group in the alkoxycarbonylmethyl group of $R_{201}$ to $R_{203}$ is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), an alkoxycarbonyl group (for example, an alkoxycarbonyl group having a carbon number of 1 to 5), a hydroxyl group, a cyano group or a nitro group.

The compound (A1c) is a compound represented by the following formula (A1c), and this is a compound having an arylacylsulfonium salt structure.

(A1c)

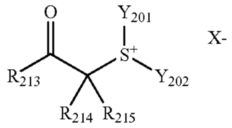

In formula (A1c), $R_{213}$ represents an aryl group which may have a substituent, and is preferably a phenyl group or a naphthyl group. Preferred examples of the substituent in $R_{213}$ include an alkyl group, an alkoxy group, an acyl group, a nitro group, a hydroxyl group, an alkoxycarbonyl group and a carboxy group.

$R_{214}$ and $R_{215}$ each independently represents a hydrogen atom, an alkyl group or a cycloalkyl group.

$Y_{201}$ and $Y_{202}$ each independently represents an alkyl group, a cycloalkyl group, an aryl group or a vinyl group.

$X^-$ represents a sulfonate or carboxylate anion resulting from removal of a hydrogen atom in the —$SO_3H$ moiety or —COOH moiety of the compound represented by formula (PA-I), or an anion of the compound represented by formula (PA-II) or (PA-III).

$R_{213}$ and $R_{214}$ may combine with each other to form a ring structure, $R_{214}$ and $R_{215}$ may combine with each other to form a ring structure, and $Y_{200}$ and $Y_{202}$ may combine with each other to form a ring structure. The ring structure formed may contain an oxygen atom, a sulfur atom, an ester bond or an amide bond. Examples of the group formed by combining each pair of $R_{213}$ and $R_{214}$, $R_{214}$ and $R_{215}$, and $Y_{201}$ and $Y_{202}$ include a butylene group and a pentylene group.

The alkyl group of $R_{214}$, $R_{215}$, $Y_{201}$ and $Y_{202}$ is preferably a linear or branched alkyl group having a carbon number of 1 to 20. The alkyl group of $Y_{201}$ and $Y_{202}$ is more preferably a 2-oxoalkyl group having >C=O at the 2-position of the alkyl group, an alkoxycarbonylalkyl group (preferably with the alkoxy group having a carbon number of 2 to 20), or a carboxyalkyl group.

The cycloalkyl group of $R_{214}$, $R_{215}$, $Y_{201}$ and $Y_{202}$ is preferably a cycloalkyl group having a carbon number of 3 to 20.

$Y_{201}$ and $Y_{202}$ each is preferably an alkyl group having a carbon number of 4 or more, more preferably from 4 to 6, still more preferably from 4 to 12.

At least either one of $R_{214}$ and $R_{215}$ is preferably an alkyl group, and more preferably, $R_{214}$ and $R_{215}$ both are an alkyl group.

In formula (PA2), $R_{204}$ and $R_{205}$ each independently represents an aryl group, an alkyl group or a cycloalkyl group.

$X^-$ represents a sulfonate or carboxylate anion resulting from removal of a hydrogen atom in the —$SO_3H$ moiety or —COOH moiety of the compound represented by formula (PA-I), or an anion of the compound represented by formula (PA-II) or (PA-III).

The aryl group of $R_{204}$ and $R_{205}$ is preferably a phenyl group or a naphthyl group, more preferably a phenyl group.

The alkyl group of $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group of $R_{204}$ and $R_{205}$ is preferably a cycloalkyl group having a carbon number of 3 to 10 (e.g., cyclopentyl, cyclohexyl, norbornyl).

$R_{204}$ and $R_{205}$ each may have a substituent, and examples of the substituent which $R_{204}$ and $R_{205}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

The compound which generates a compound represented by formula (PA-I), (PA-II) or (PA-III) upon irradiation with actinic rays or radiation is preferably a compound represented by formula (PA1), more preferably a compound represented by any one of formulae (A1a) to (A1c).

The compound (PA) decomposes upon irradiation with actinic rays or radiation to generate, for example, a compound represented by formula (PA-1) or (PA-2).

The compound represented by formula (PA-1) is a compound having a sulfo group or carboxyl group together with a proton acceptor functional group and thereby being reduced in or deprived of the proton acceptor property as compared with the compound (PA) or changed to be acidic from being proton acceptor-functioning.

The compound represented by formula (PA-2) is a compound having an organic sulfonylimino group or organic carbonylimino group together with a proton acceptor functional group and thereby being reduced in or deprived of the proton acceptor property as compared with the compound (PA) or changed to be acidic from being proton acceptor-functioning.

In the present invention, reduction in the acceptor property means that when a noncovalent bond complex as a proton adduct is produced from a proton acceptor functional group-containing compound and a proton, the equilibrium constant at the chemical equilibrium decreases.

The proton acceptor property can be confirmed by measuring the pH.

Specific examples of the compound (PA) capable of generating a compound represented by formula (PA-I) upon irradiation with actinic rays or radiation are set forth below, but the present invention is not limited thereto.

(PA-1)

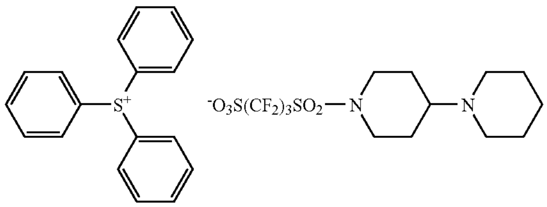

(PA-2)

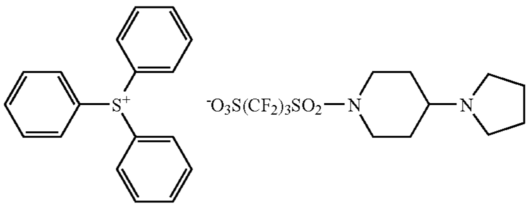

(PA-3)

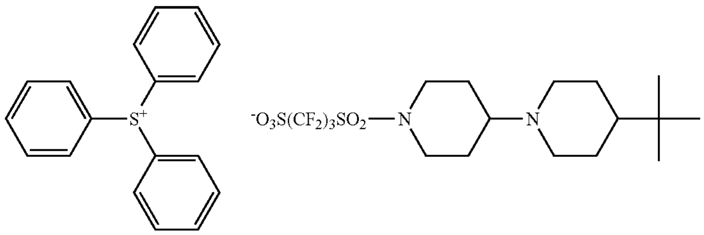

(PA-4)

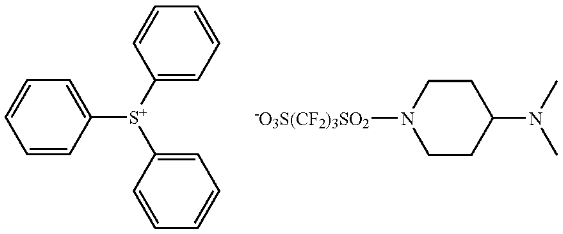

(PA-5)

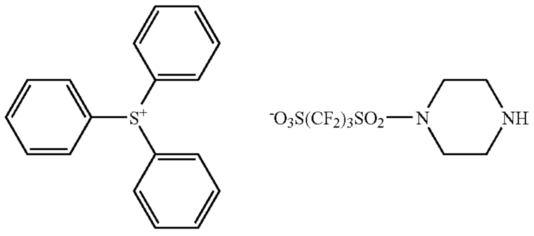

-continued
(PA-6)
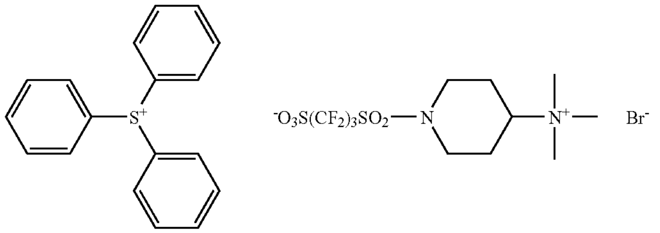
(PA-7)
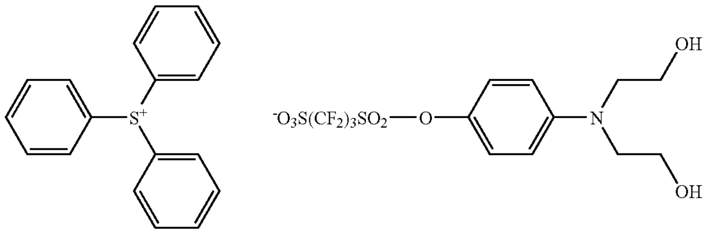
(PA-8)
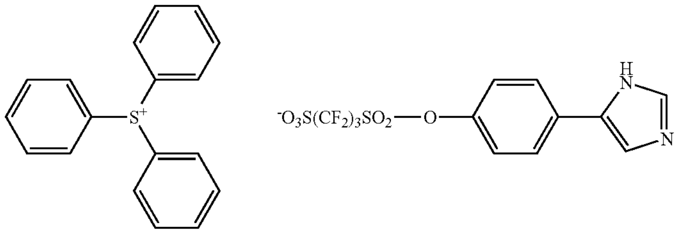
(PA-9)
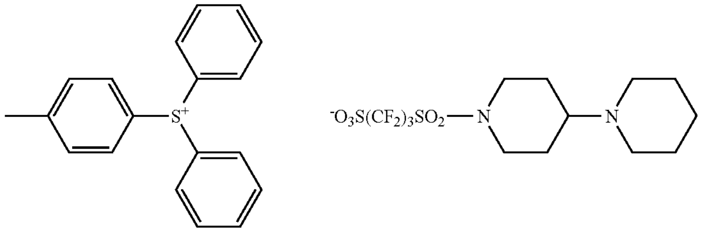
(PA-10)
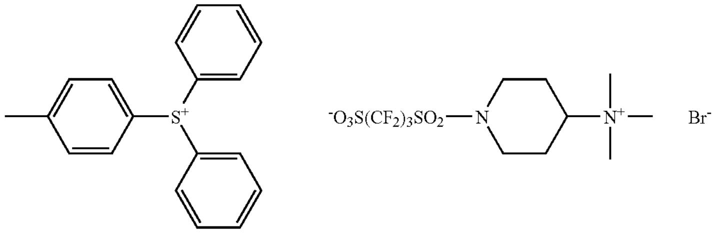
(PA-11)
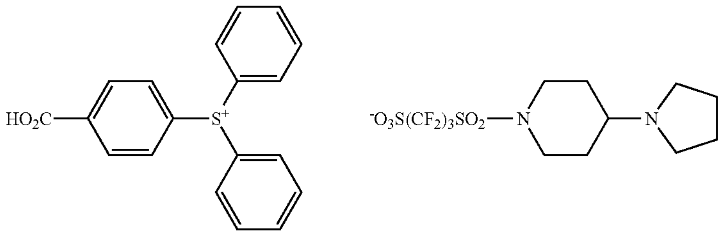

-continued
(PA-12)
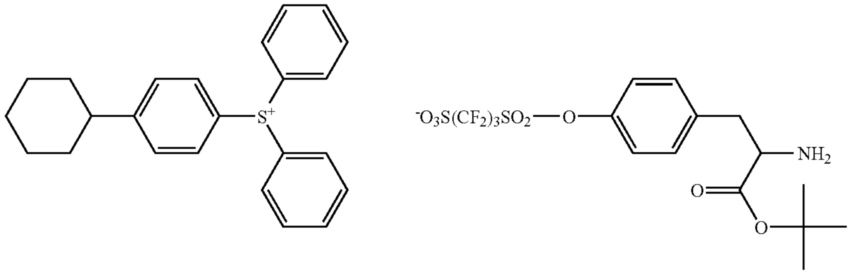
(PA-13)
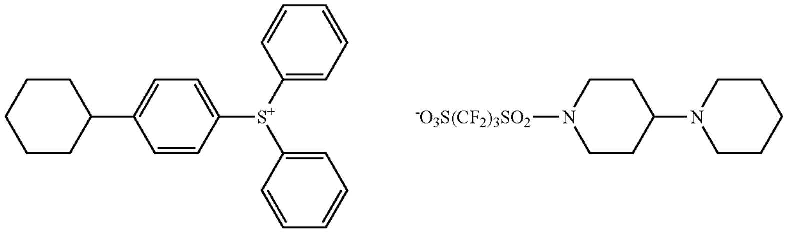
(PA-14)
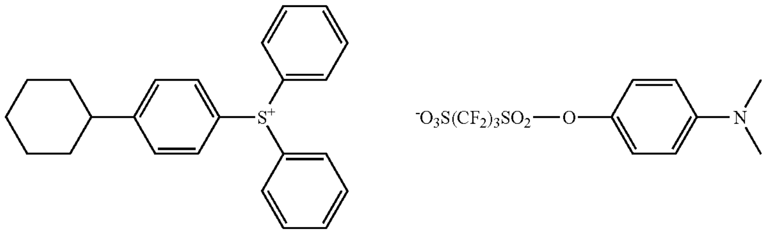
(PA-15)
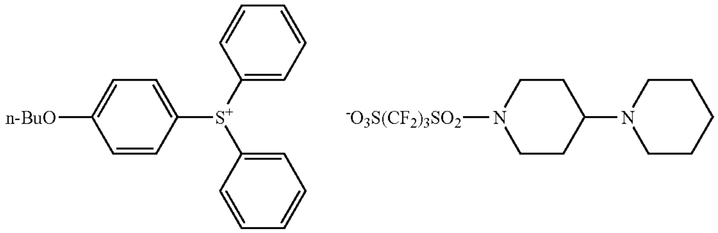
(PA-16)
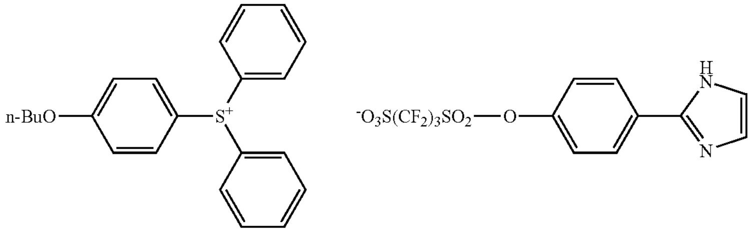
(PA-17)
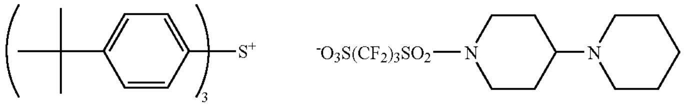
(PA-18)
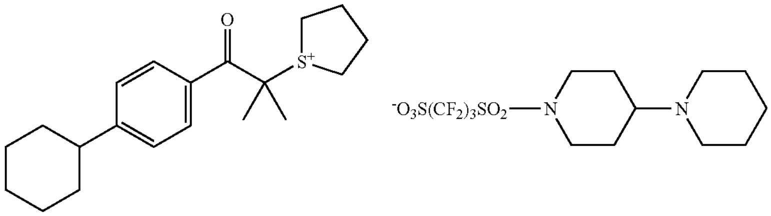

-continued
(PA-19)
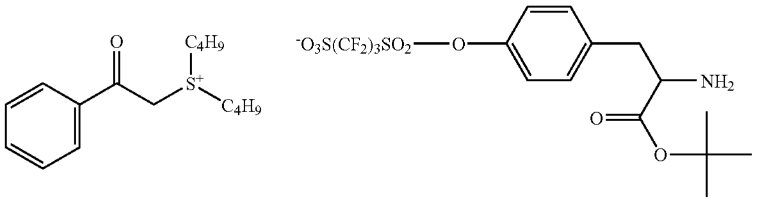
(PA-20)
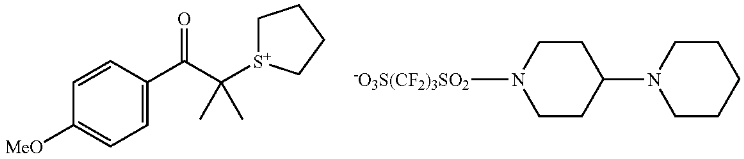
(PA-21)
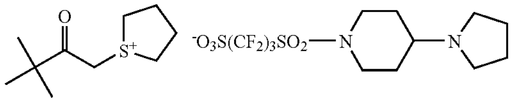
(PA-22)
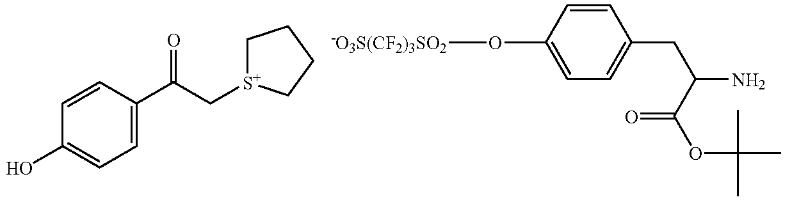
(PA-23)
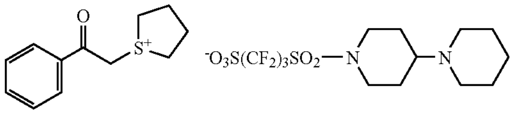
(PA-24)
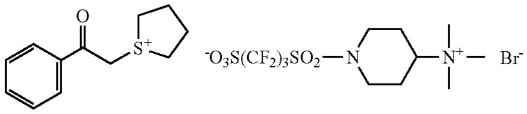
(PA-25)
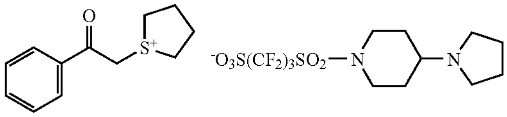
(PA-26)
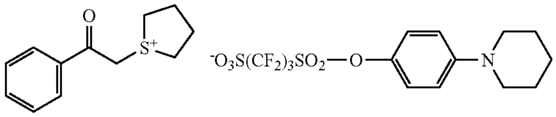
(PA-27)
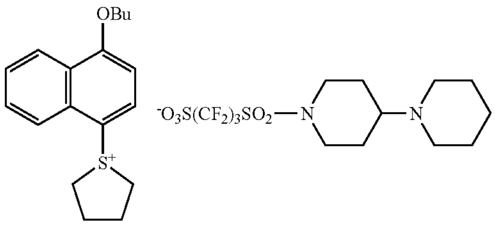
(PA-28)
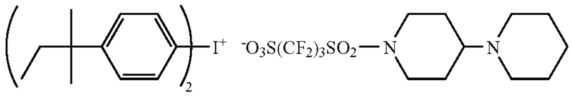
(PA-29)
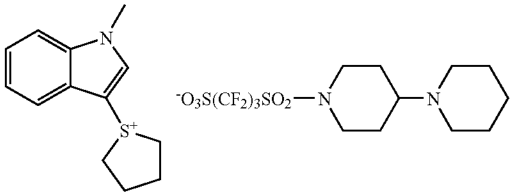
(PA-30)
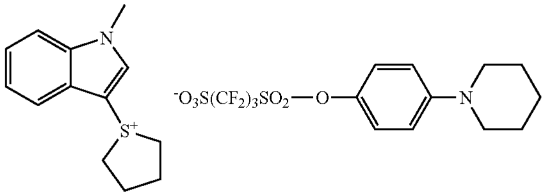

-continued
(PA-31)
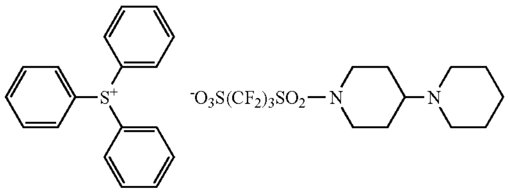
(PA-32)
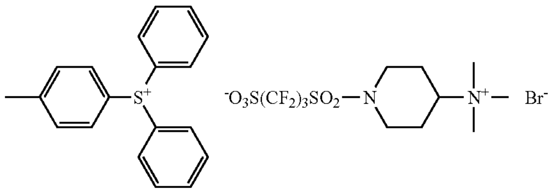
(PA-33)
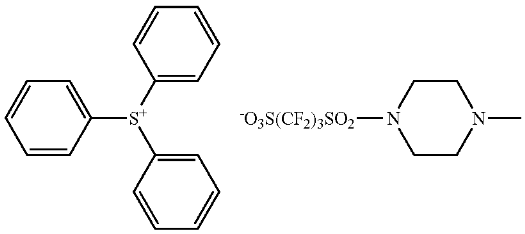
(PA-34)
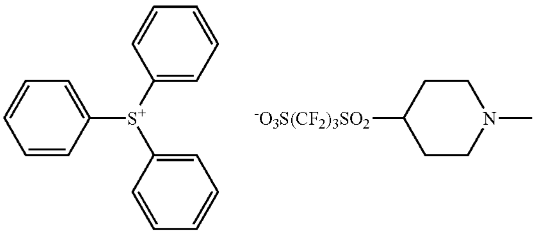
(PA-35)
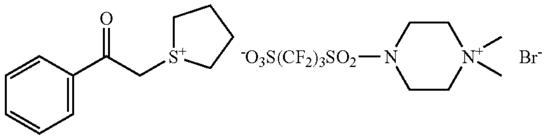
(PA-36)
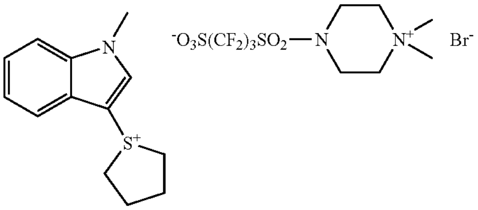
(PA-37)
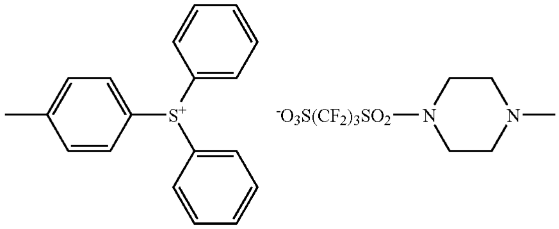
(PA-38)
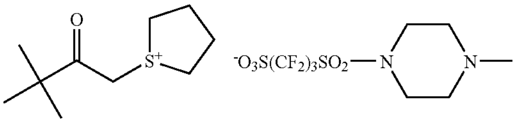
(PA-39)
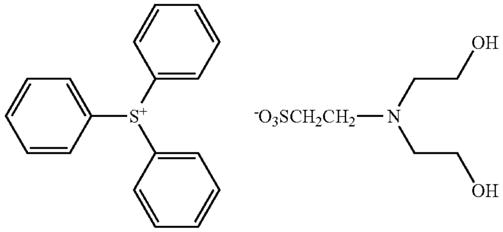
(PA-40)
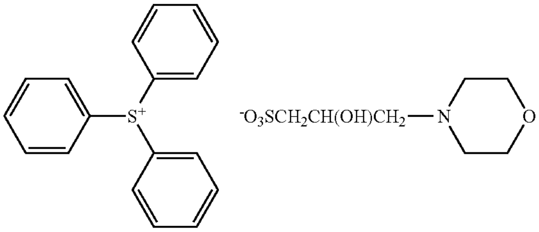
(PA-41)
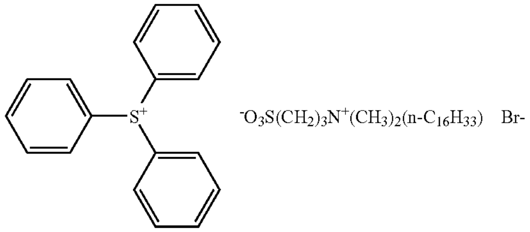
(PA-42)
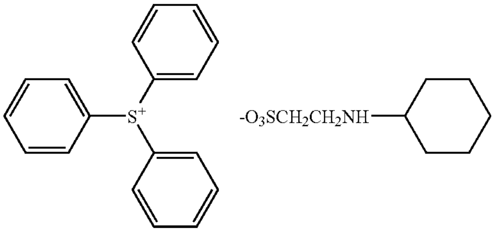

-continued
(PA-43)
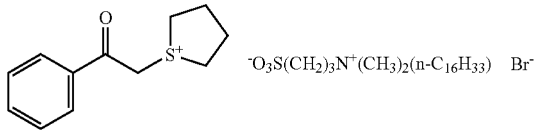
(PA-44)
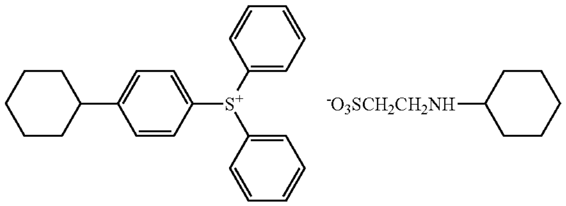
(PA-45)
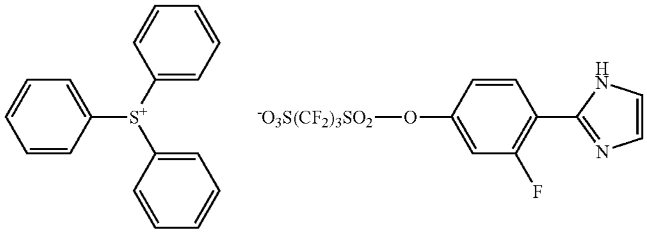
(PA-46)
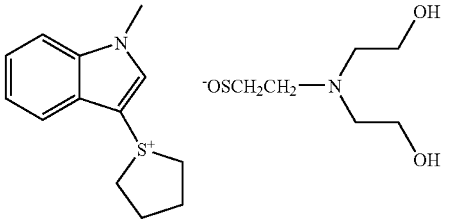
(PA-47)
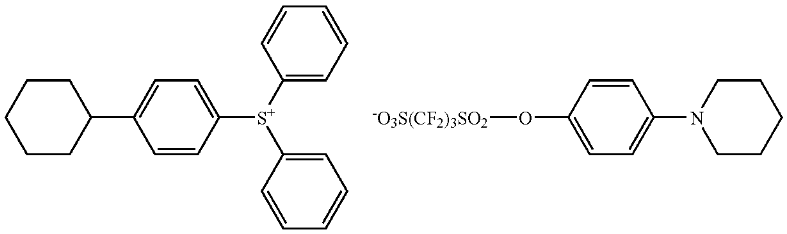
(PA-48)
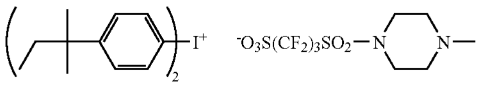
(PA-49)
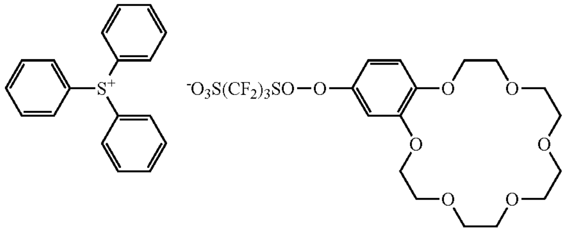
(PA-50)
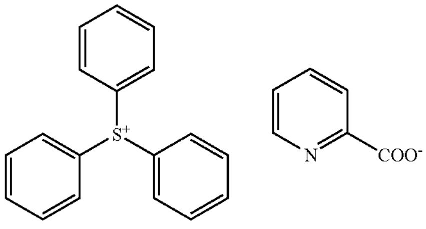
(PA-51)
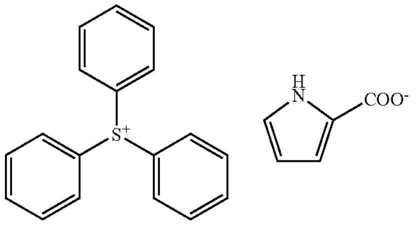

-continued (PA-52)

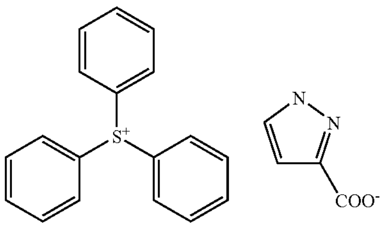

(PA-53)

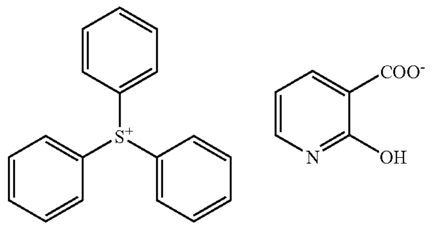

(PA-54)

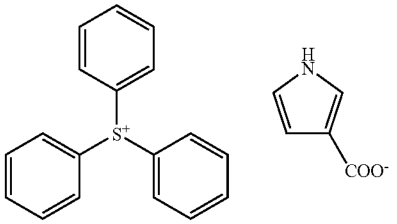

(PA-55)

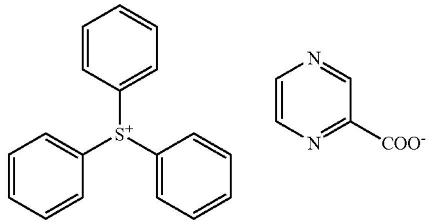

(PA-56)

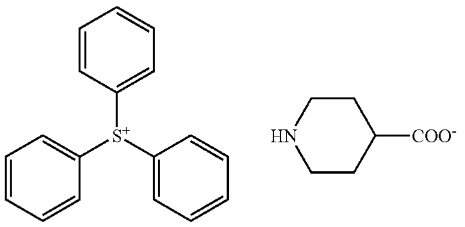

(PA-57)

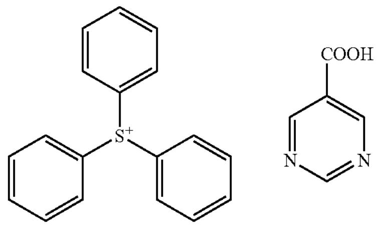

(PA-58)

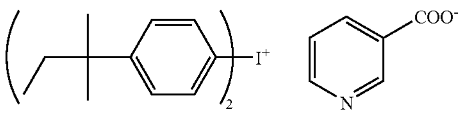

These compounds can be easily synthesized from a compound represented by formula (PA-I) or a lithium, sodium or potassium salt thereof and a hydroxide, bromide, chloride or the like of iodonium or sulfonium, by utilizing the salt-exchange method described in JP-T-11-501909 (the term "JP-T" as used herein means a "published Japanese translation of a PCT patent application") or JP-A-2003-246786.

Specific examples of the compound (PA) capable of generating a compound represented by formula (PA-II) upon irradiation with actinic rays or radiation are set forth below, but the present invention is not limited thereto.

(PA-59)

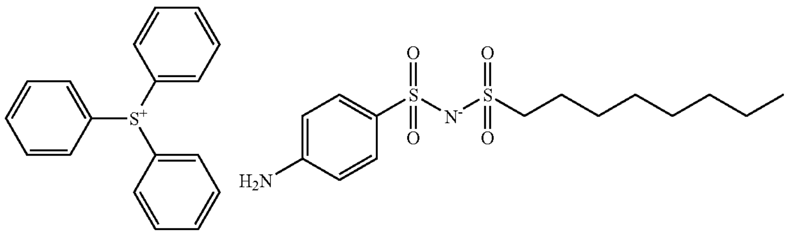

(PA-60)

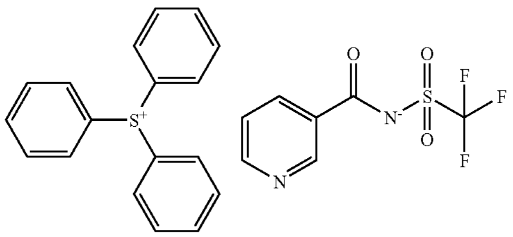

-continued
(PA-61)
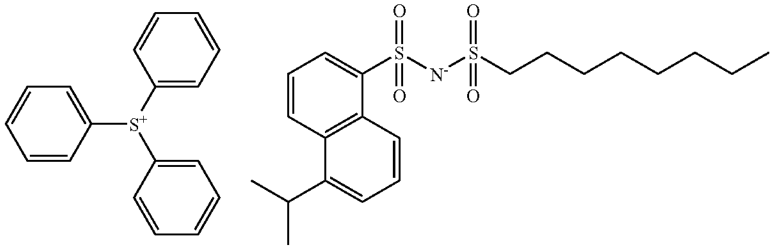
(PA-62)
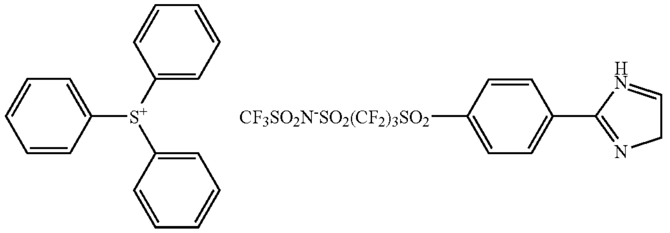
(PA-63)
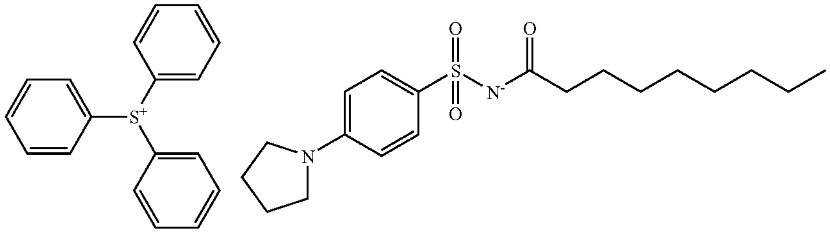
(PA-64)
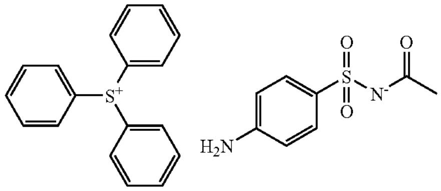
(PA-65)
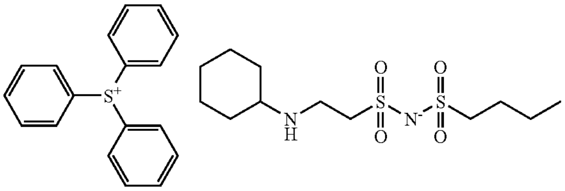
(PA-66)
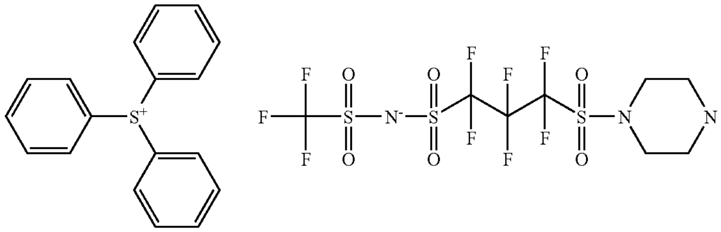
(PA-67)
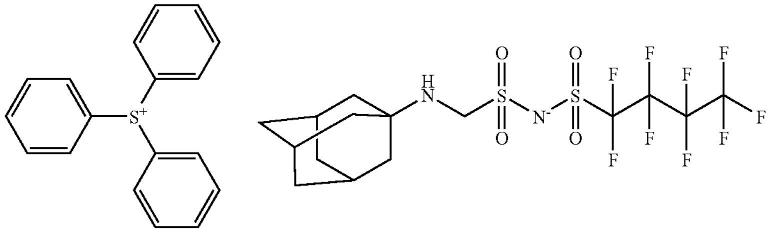

-continued
(PA-68)
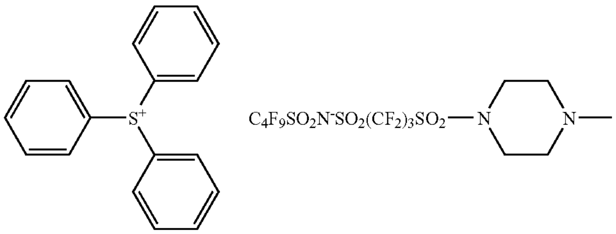
(PA-69)
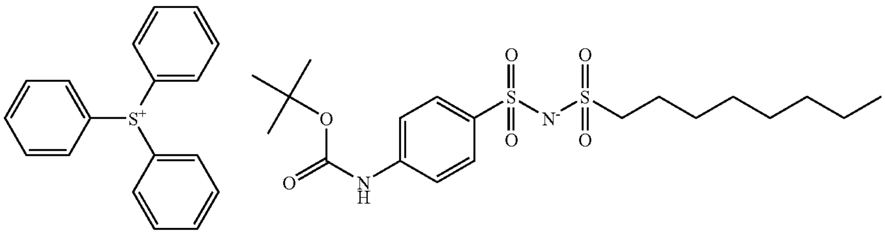
(PA-70)
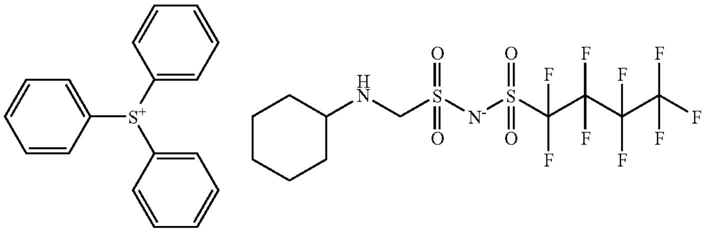
(PA-71)
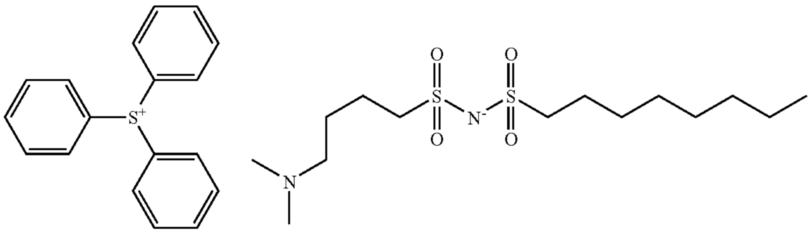
(PA-72)
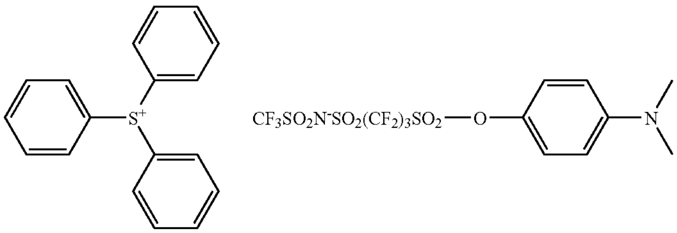
(PA-73)
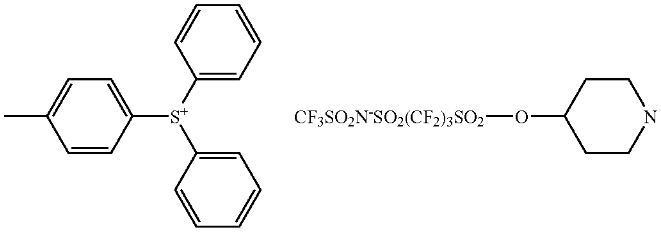

-continued
(PA-74)
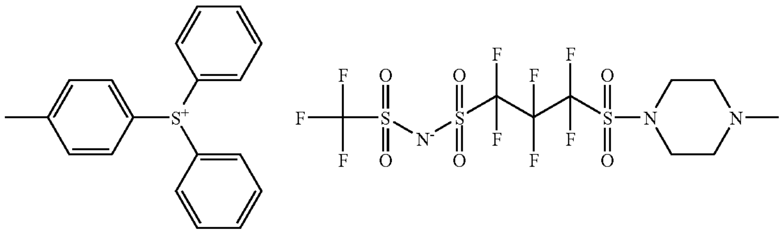
(PA-75)
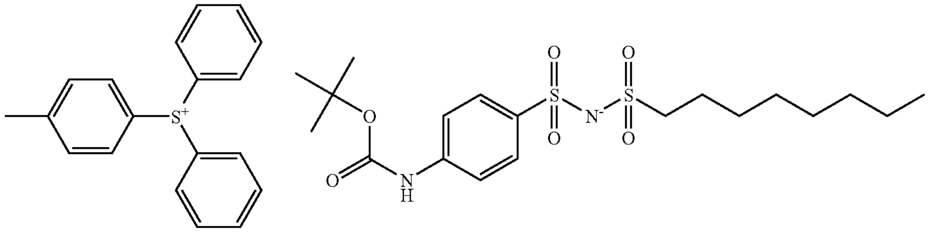
(PA-76)
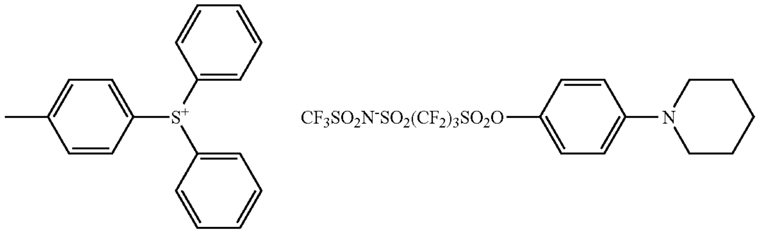
(PA-77)
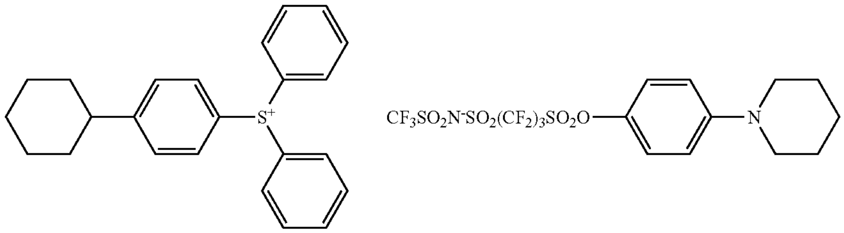
(PA-78)
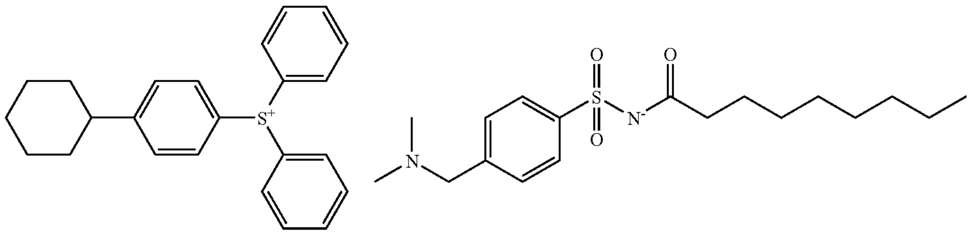
(PA-79)
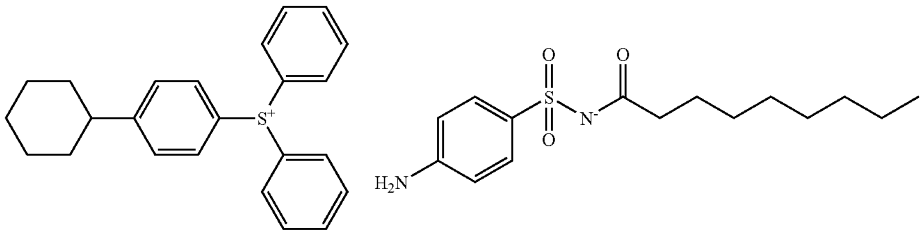

-continued
(PA-80)
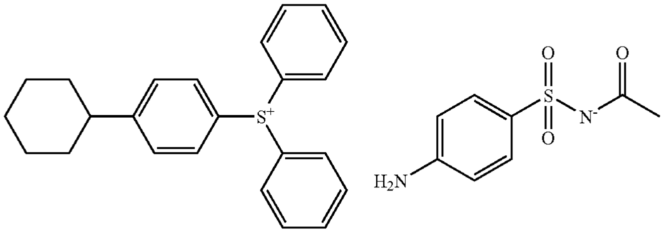
(PA-81)
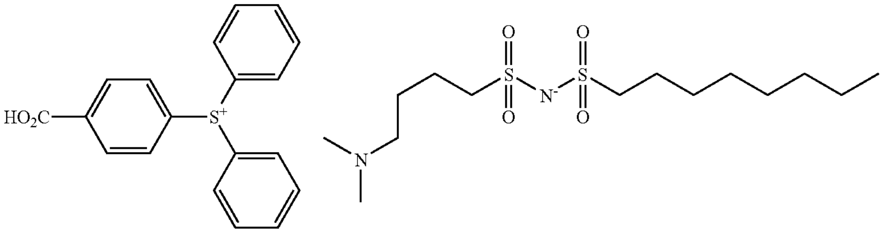
(PA-82)
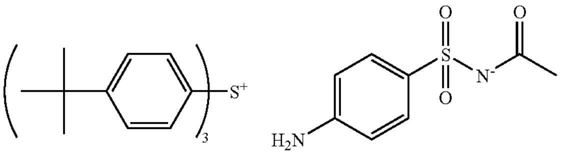
(PA-83)
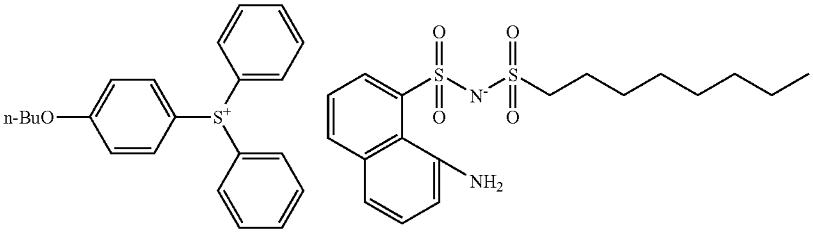
(PA-84)
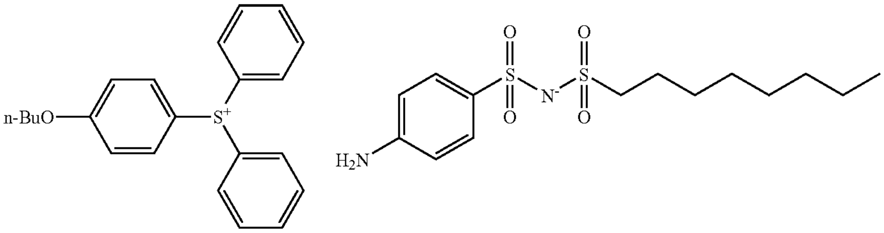
(PA-85)
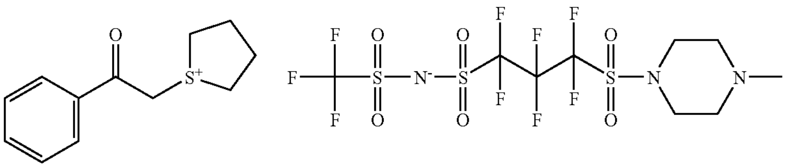
(PA-86)
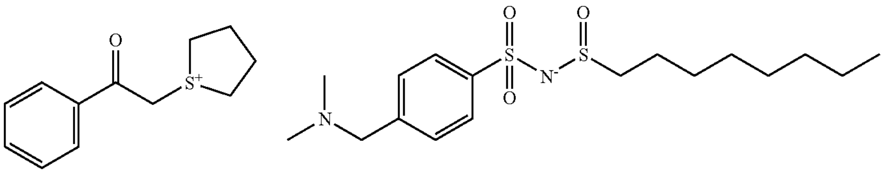

-continued
(PA-87)
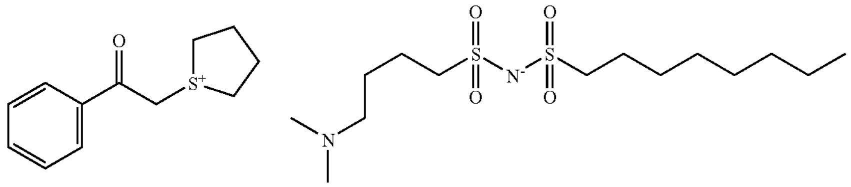
(PA-88)
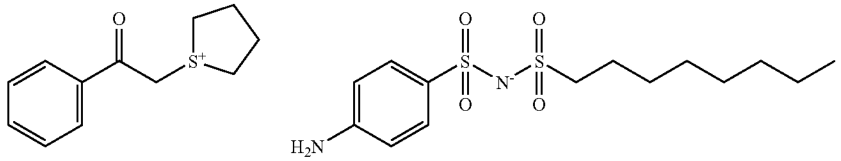
(PA-89)
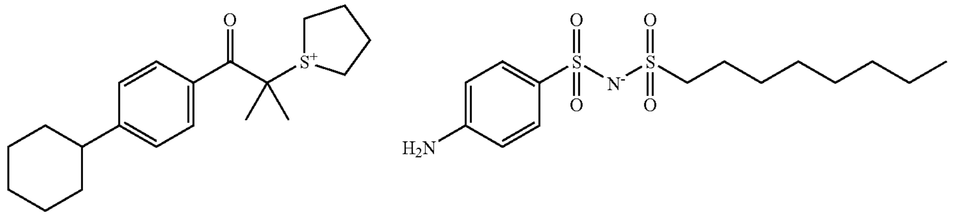
(PA-90)
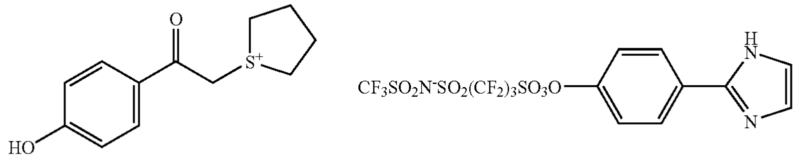
(PA-91)
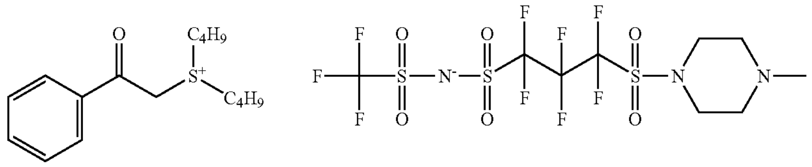
(PA-92)
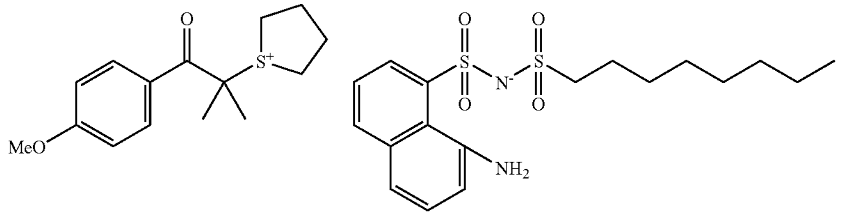
(PA-93)
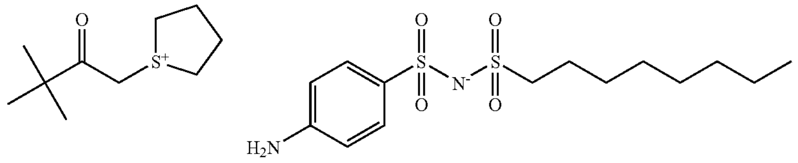
(PA-94)
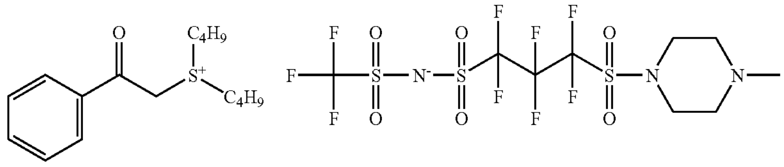

-continued
(PA-95)
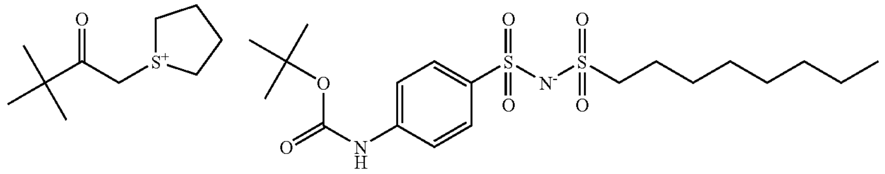
(PA-96)
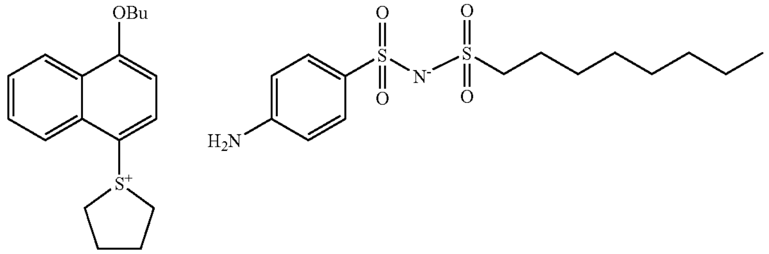
(PA-97)
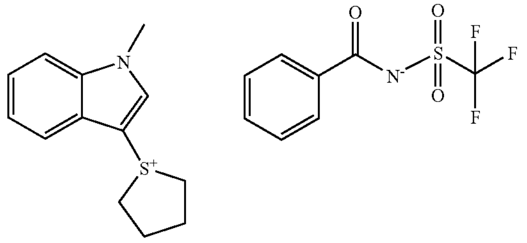
(PA-98)
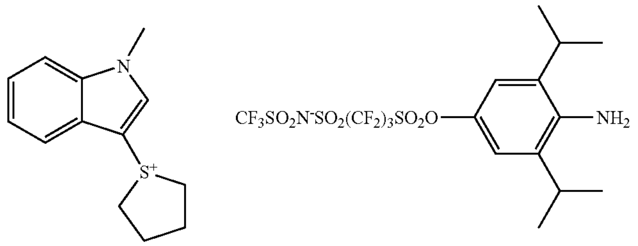
(PA-99)
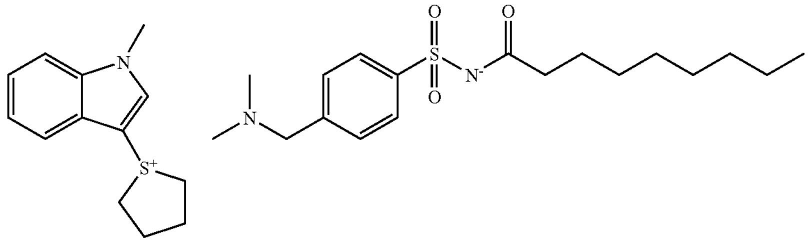
(PA-100)
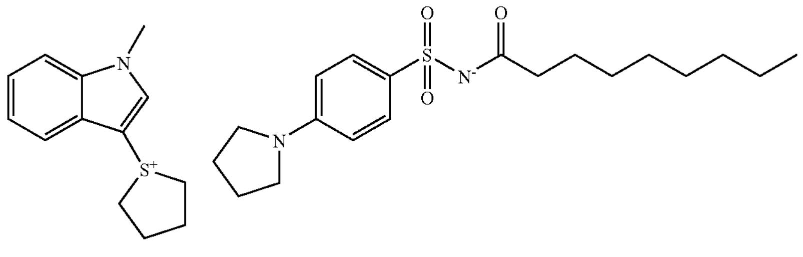
(PA-101)
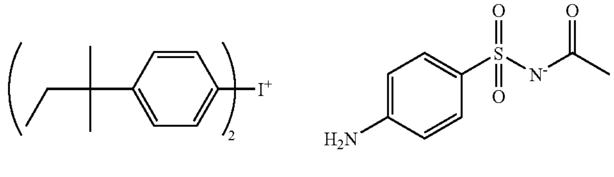

-continued (PA-102)

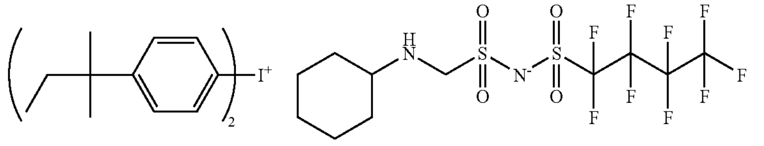

These compounds can be easily synthesized by using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) to form a sulfonamide bond or a sulfonic acid ester bond, and then hydrolyzing the other sulfonyl halide moiety, or a method of ring-opening a cyclic sulfonic anhydride with an amine or alcohol containing a partial structure represented by formula (PA-II). The amine or alcohol containing a partial structure represented by formula (PA-II) can be synthesized by reacting an amine or alcohol with an anhydride (e.g., $(R'O_2C)_2O$, $R'O_2CCl$) or an acid chloride compound under basic conditions.

The content of compound (PA) in the positive resist composition of the present invention is preferably from 0.1 to 20 mass %, more preferably from 0.1 to 10 mass %, based on the entire solid content of the composition.

[4] (C) Organic Basic Compound

The organic basic compound contained in the resist composition of the present invention is a compound having basicity stronger than that of phenol. The molecular weight of the organic basic compound is usually from 100 to 900, preferably from 150 to 800, more preferably from 200 to 700. In particular, a nitrogen-containing basic compound is preferred.

The nitrogen-containing basic compound preferred as the organic basic compound is preferably, in terms of the preferred chemical environment, a compound having a structure of one of the following formulae (A) to (E). Formulae (B) to (E) each may be a part of a ring structure.

(A)

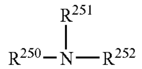

(B)

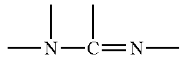

(C)

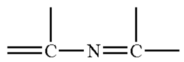

(D)

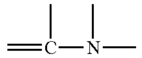

(E)

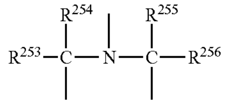

In these formulae, $R^{250}$, $R^{251}$ and $R^{252}$, which may be the same or different, each represents a hydrogen atom, an alkyl group (preferably having a carbon number of 1 to 20), a cycloalkyl group (preferably having a carbon number of 3 to 20), or an aryl group (preferably having a carbon number of 6 to 20), and $R^{251}$ and $R^{252}$ may combine with each other to form a ring.

The alkyl group may be unsubstituted or may have a substituent, and the alkyl group having a substituent is preferably an aminoalkyl group having a carbon number of 1 to 6, or a hydroxyalkyl group having a carbon number of 1 to 6.

$R^{253}$, $R^{254}$, $R^{255}$ and $R^{256}$, which may be the same or different, each represents an alkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen-containing ring structure, or a compound having an alkylamino group.

The nitrogen-containing basic compound may also be at least one kind of a nitrogen-containing compound selected from an amine compound having a phenoxy group, an ammonium salt compound having a phenoxy group, an amine compound having a sulfonic acid ester group, and an ammonium salt compound having a sulfonic acid ester group.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and the cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

The sulfonic acid ester group in the amine compound having a sulfonic acid ester group and the ammonium salt compound having a sulfonic acid ester group may be any of an alkylsulfonic acid ester, a cycloalkylsulfonic acid ester and an arylsulfonic acid ester. In the case of an alkylsulfonic acid ester, the alkyl group preferably has a carbon number of 1 to 20, in the case of a cycloalkylsulfonic acid ester, the cycloalkyl group preferably has a carbon number of 3 to 20, and in the case of an arylsulfonic acid ester, the aryl group preferably has a carbon number of 6 to 12. The akylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

Specific preferred examples of the compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds each may have a substituent, and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

More preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A tetraalkylammonium salt-type nitrogen-containing basic compound may also be used. Among such compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred.

One of these nitrogen-containing basic compounds may be used alone, or two or more kinds thereof may be used in combination.

As for the ratio between the acid generator and the organic basic compound used in the composition, the ratio of acid generator/organic basic compound (by mol) is preferably from 2.5 to 300. That is, the molar ratio is preferably 2.5 or more in view of sensitivity and resolution and is preferably 300 or less from the standpoint of preventing reduction in the resolution due to thickening of the resist pattern with aging after exposure until heat treatment. The ratio of acid generator/organic basic compound (by mol) is more preferably from 5.0 to 200, still more preferably from 7.0 to 150.

[5] Surfactants:

In the present invention, surfactants may be used and this is preferred in view of film-forming property, adhesion of pattern, reduction of development defects, and the like.

Specific examples of the surfactant include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing surfactant and a silicon-containing surfactant, such as EFtop EF301, EF303 and EF352 (produced by Shin-Akita Chemical Co., Ltd.), Megafac F171 and F173 (produced by Dainippon Ink & Chemicals, Inc.), Florad FC430 and FC431 (produced by Sumitomo 3M Inc.), Asahiguard AG710, Surflon S-382, SC101, SC102, SC103, SC104, SC105 and SC106 (produced by Asahi Glass Co., Ltd.), and Troysol S-366 (produced by Troy Chemical Industries, Inc.); an organosiloxane polymer, KP-341 (produced by Shin-Etsu Chemical Co., Ltd.); and acrylic acid-based or methacrylic acid-based (co)polymers Polyflow No. 75 and No. 95 (produced by Kyoeisha Yushi Kagaku Kogyo Co., Ltd.).

The amount of such a surfactant blended is usually 2 parts by mass or less, preferably 1 part by mass or less, per 100 parts by mass of the solid content in the composition of the present invention.

One of these surfactants may be used alone or several species thereof may be added in combination.

As for the surfactant, the composition preferably contains any one species of fluorine- and/or silicon-containing surfactants (a fluorine-containing surfactant, a silicon-containing surfactant or a surfactant containing both a fluorine atom and a silicon atom), or two or more species thereof.

Examples of these surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, a polysiloxane polymer KP-341 (produced by Shin-Etsu Chemical Co., Ltd.) may also be used as the silicon-containing surfactant.

Other than these known surfactants, a surfactant using a polymer having a fluoroaliphatic group derived from a fluoroaliphatic compound produced by a telomerization process (also called a telomer process) or an oligomerization process (also called an oligomer process) may be used. The fluoroaliphatic compound can be synthesized by the method described in JP-A-2002-90991.

The polymer having a fluoroaliphatic group is preferably a copolymer of a fluoroaliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoroaliphatic group-containing monomer with a (poly(oxyalkylene)) acrylate (or methacrylate) may be not only a binary copolymer but also a ternary or higher copolymer obtained by simultaneously copolymerizing two or more different fluoroaliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), and further include a copolymer of a $C_6F_{13}$ group-containing acrylate (or methacrylate) with a (poly(oxyalkylene))acrylate (or methacrylate), a copolymer of a $C_6F_{13}$ group-containing acrylate (or methacrylate) with (poly(oxyethylene))acrylate (or methacrylate) and (poly(oxy-propylene))acrylate (or methacrylate), a copolymer of a $C_8F_{17}$ group-containing acrylate (or methacrylate) with a (poly(oxyalkylene))acrylate (or methacrylate), and a copolymer of a $C_8F_{17}$ group-containing acrylate (or methacrylate) with (poly(oxyethylene))acrylate (or methacrylate) and (poly(oxypropylene))acrylate (or methacrylate).

The amount of the surfactant used is preferably from 0.0001 to 2 mass %, more preferably from 0.001 to 1 mass %, based on the entire amount of the positive resist composition (excluding the solvent).

[6] Other Components:

The positive resist composition of the present invention may further contain, if desired, a dye, a photobase generator and the like.

1. Dye

In the present invention, a dye may be used.

The suitable dye includes an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photobase Generator

Examples of the photobase generator which can be added to the composition of the present invention include compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photobase generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. Such a photobase generator is added for the purpose of improving the resist profile or the like.

3. Solvents

The resist composition of the present invention after dissolving the components described above in a solvent is coated on a support. Usually, the concentration is, in terms of the solid content concentration of all resist components, preferably from 2 to 30 mass %, more preferably from 3 to 25 mass %.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents is used alone, or several species thereof are mixed and used.

The positive resist composition of the present invention is coated on a substrate to form a thin film. The thickness of this coated film is preferably from 0.05 to 4.0 μm.

The composition of the present invention has an excellent effect that even when the composition is coated directly on a substrate having a high-reflection surface without applying an antireflection film, generation of standing waves is remarkably suppressed and a good pattern is obtained, but a good pattern can be formed also when an antireflection film is used.

The antireflection film used as the underlayer of the resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative/formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series and DUV-40 Series produced by Brewer Science, Inc.; and AR-2, AR-3 and AR-5 produced by Shipley Co., Ltd.

Also, an antireflection film may be used on an upper layer of the resist, if desired. Examples of the antireflection film include AQUATAR-II, AQUATAR-III and AQUATAR-VII produced by AZ Electronic Materials K.K.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon actinic rays or radiation such as KrF excimer laser light, electron beam or EUV light, and then subjecting the resist film to heating, development, rinsing and drying, whereby a good resist pattern can be formed.

The alkali developer which can be used in the development is an aqueous solution of alkalis (usually, 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline), and cyclic amines (e.g., pyrrole, piperidine). This aqueous solution of alkalis may be used after adding thereto alcohols such as isopropyl alcohol or a surfactant such as nonionic surfactant in an appropriate amount.

Among these developers, a quaternary ammonium salt is preferred, and tetramethylammonium hydroxide and choline are more preferred.

The pH of the alkali developer is usually from 10 to 15.

EXAMPLES

The present invention is described in greater detail below by referring to Examples, but the present invention should not be construed as being limited thereto.

Synthesis Example 1

Synthesis of Resin (J-1) with Terminal (M-14) and Main Chain (A-2):

In 50 mL of dry tetrahydrofuran, 204 mL of (4-phenyl) phenyl magnesium bromide (a 0.5M tetrahydrofuran solution) was added, and the resulting mixture was stirred and then cooled to 0° C. While keeping 0° C., 7.77 g of carbon disulfide was added over 15 minutes, and the resulting mixture was stirred at 0° C. for 1 hour. Subsequently, 15.86 g of benzyl bromide was added over 15 minutes, and the resulting mixture was stirred at room temperature for 1 hour. After adding 300 mL of ice water, the organic layer was extracted with 500 mL of ethyl acetate. Furthermore, the organic layer was washed with 300 mL of brine and dried over anhydrous magnesium sulfate. The anhydrous magnesium sulfate was removed by filtration, and the residual solvent was then removed. The residue was purified on silica gel (ethyl acetate/hexane solvent) to obtain benzyl (4-phenyl)dithiobenzoate (28.4 g, yield: 87%) (exchange-chain transfer type RAFT agent).

In a reaction vessel, 81.10 g of 4-acetoxystyrene, 5.76 g of polymerization initiator V-601 (produced by Wako Pure Chemical Industries, Ltd.) and 16.02 g of benzyl (4-phenyl) dithiobenzoate were dissolved in 460 g of ethylene glycol monoethyl ether acetate, and the resulting solution was added dropwise to a system at 80° C. over 4 hours in a nitrogen gas atmosphere. Subsequently to the dropwise addition, the system was stirred under heating for 2 hours, and the reaction solution was allowed to cool to room temperature and then added dropwise to 5 L of hexane, thereby precipitating a polymer. After dissolving the solid collected by filtration in 500 ml of acetone, the solution was again added dropwise to 5 L of hexane, and the solid was collected by filtration and dried under reduced pressure to obtain 64.78 g of a 4-acetoxystyrene polymer (with main chain terminal (M-14)). It was confirmed by NMR and absorption spectrum that (M-14) is introduced into the main chain terminal.

In a reaction vessel, 40.00 g of the polymer obtained above, 40 ml of methanol, 100 ml of 1-methoxy-2-propanol and 1.5 ml of concentrated hydrochloric acid were added, and the mixture was stirred for 5 hours under heating at 80° C. The reaction solution was allowed to cool to room temperature and then added dropwise to 3 L of distilled water. After dissolving the solid collected by filtration in 200 ml of acetone, the solution was again added dropwise to 3 L of distilled water, and the solid was collected by filtration and then dried under reduced pressure to obtain 29.31 g of a 4-hydroxystyrene polymer (with main chain terminal (M-14)). The weight average molecular weight by GPC was 2,000, and the molecular weight dispersity (Mw/Mn) was 1.10.

The obtained 4-hydroxystyrene polymer (20 g) was dissolved in 100 g of propylene glycol monomethyl ether acetate (PGMEA), and the resulting solution was depressurized to 20 mmHg at 60° C. to remove by distillation about 50 g of the solvent together with water remaining in the system. After cooling to 20° C., 7.20 g of ethyl vinyl ether and 0.10 g of p-toluenesulfonic acid were added thereto, and the resulting mixture was stirred at room temperature for 2 hours. Thereafter, 0.42 g of triethylamine was added to effect neutralization and then, a washing operation was performed three times by adding 300 g of ethyl acetate and 150 g of water. Subsequently, the amount of the solvent was adjusted to obtain a solution of Resin (J-1) at a concentration of 30 mass %. The weight average molecular weight by GPC was 2,800, the molecular weight dispersity was 1.10, and from the 1H— and 13C-NMR analyses, the acetal protection rate of phenolic OH was 50%.

Synthesis Example 2

Synthesis of Resin (J-5) with Terminal (M-30) and Main Chain (A-2):

In a reaction vessel, 81.10 g of 4-acetoxystyrene and 5.76 g of polymerization initiator V-601 (produced by Wako Pure Chemical Industries, Ltd.) were dissolved in 460 g of ethylene glycol monoethyl ether acetate, and the resulting solution was added dropwise to a system at 80° C. over 4 hours in a nitrogen gas atmosphere. Subsequently to the dropwise addition, the system was stirred under heating for 2 hours, and the reaction solution was allowed to cool to room temperature and then added dropwise to 5 L of hexane, thereby precipitating a polymer. After dissolving the solid collected by filtration in 500 ml of acetone, the solution was again added dropwise to 5 L of hexane, and the solid was collected by filtration and dried under reduced pressure to obtain 75.48 g of a 4-acetoxystyrene polymer (with a main chain terminal derived from V-601).

In a reaction vessel, 75.48 g of the obtained 4-acetoxystyrene polymer (with a main chain terminal derived from V-601), 3 L of an aqueous sodium hydroxide solution (0.1M) and 1 L of tetrahydrofuran were stirred for 5 hours at room temperature. Thereafter, 5 L of ethyl acetate was added and furthermore, 1,000 g of sodium chloride was added. After extracting the organic layer and removing the residual solvent, 120 g of dicyclohexylcarbodiimide, 3 g of 4-dimethylaminopyridine, 39.4 g of 4-phenylphenol and 5 L of dry tetrahydrofuran was added to the resulting solution, and this mixture was stirred overnight at room temperature in an argon atmosphere.

Subsequently, the solvent was removed, and the organic layer was extracted by adding 5 L of ethyl acetate and then added dropwise to 10 L of hexane, thereby precipitating a polymer. After dissolving the solid collected by filtration in 1 L of acetone, the solution was again added dropwise to 10 L of hexane, and the solid was collected by filtration and dried under reduced pressure to obtain 74.30 g of a 4-acetoxystyrene polymer (with main chain terminal (M-30)).

In a reaction vessel, 40.00 g of the obtained 4-acetoxystyrene polymer (with main chain terminal (M-30)), 40 ml of methanol, 100 ml of 1-methoxy-2-propanol and 1.5 ml of concentrated hydrochloric acid were added, and the mixture was stirred for 5 hours under heating at 80° C. The reaction solution was allowed to cool to room temperature and then added dropwise to 3 L of distilled water. After dissolving the solid collected by filtration in 200 ml of acetone, the solution was again added dropwise to 3 L of distilled water, and the solid was collected by filtration and then dried under reduced pressure to obtain 29.31 g of a 4-hydroxystyrene polymer (with main chain terminal (M-14)). The weight average molecular weight by GPC was 15,000, and the molecular weight dispersity (Mw/Mn) was 1.55.

The obtained 4-hydroxystyrene polymer (20 g) was dissolved in 100 g of propylene glycol monomethyl ether acetate (PGMEA), and the resulting solution was depressurized to 20 mmHg at 60° C. to remove by distillation about 50 g of the solvent together with water remaining in the system. After cooling to 20° C., 4.20 g of ethyl vinyl ether and 0.10 g of p-toluenesulfonic acid were added thereto, and the resulting mixture was stirred at room temperature for 2 hours. Thereafter, 0.42 g of triethylamine was added to effect neutralization and then, a washing operation was performed three times by adding 300 g of ethyl acetate and 150 g of water. Subsequently, the amount of the solvent was adjusted to obtain a solution of Resin (J-5) at a concentration of 30 mass %. The weight average molecular weight by GPC was 16,000, the molecular weight dispersity was 1.55, and from the 1H— and 13C-NMR analyses, the acetal protection rate of phenolic OH was 30%.

The resins synthesized each was measured for the absorption at 248 nm, as a result, the absorption at 248 nm was confirmed and the presence of the desired specific terminal group was confirmed.

Polymers shown in Table 2 were synthesized in the same manner as in Synthesis Example 1 except for changing the monomer, polymer, terminal group, vinyl ether and the like used.

Resins shown in Table 1, each having a structure exemplified above, were synthesized in the same manner as in Synthesis Example 1.

The compositional ratio (molar ratio of repeating units) of the resin is a ratio of repeating units starting from the left in the structure shown above.

TABLE 1

| | Terminal | Main Chain | Weight Average Molecular Weight | Compositional Ratio | Dispersity |
|---|---|---|---|---|---|
| J-1 | M-14 | A-2 | 2800 | 50/50 | 1.10 |
| J-2 | M-16 | A-11 | 6000 | 75/25 | 1.09 |
| J-3 | M-2 | A-1 | 18000 | 70/30 | 1.11 |
| J-4 | M-1 | A-27 | 9000 | 70/20/10 | 1.10 |
| J-5 | M-30 | A-2 | 16000 | 70/30 | 1.55 |
| J-6 | M-8 | A-5 | 10000 | 70/30 | 1.12 |
| J-7 | M-12 | A-17 | 4000 | 10/70/20 | 1.10 |
| J-8 | M-9 | A-36 | 18000 | 5/75/20 | 1.14 |
| J-9 | M-18 | A-21 | 19000 | 70/30 | 1.12 |
| J-10 | M-20 | A-8 | 18000 | 70/15/15 | 1.10 |
| J-11 | M-15 | A-60 | 6000 | 70/30 | 1.20 |
| J-12 | M-15 | A-5 | 10000 | 65/35 | 1.21 |
| J-13 | M-15 | A-41 | 8000 | 70/30 | 1.20 |
| J-14 | M-24 | A-12 | 23000 | 5/75/20 | 1.10 |
| J-15 | M-26 | A-13 | 14000 | 75/25 | 1.25 |
| J-16 | M-16 | A-2 | 9300 | 65/35 | 1.11 |
| J-17 | M-16 | A-90 | 20000 | 65/35 | 1.15 |
| J-18 | M-10 | A-96 | 20000 | 67/23/10 | 1.20 |
| J-19 | M-32 | A-97 | 23000 | 70/26/4 | 1.22 |
| J-20 | M-14 | A-120 | 18000 | 70/30 | 1.10 |
| J-21 | M-28 | A-132 | 15000 | 75/25 | 1.18 |

[Preparation of Resist Composition]

A resin, an acid generator, a proton acceptor-containing compound, a surfactant and a basic compound (when used in combination) were dissolved in propylene glycol monomethyl ether acetate to prepare a solution having a solid material concentration of 5.0 mass %, and the obtained solution was microfiltered through a membrane filter having a pore size of 0.1 μm to obtain a resist solution.

<Formulation of Resist Composition>

| | |
|---|---|
| Resin | 17.1653 g |
| Acid Generator | 0.1479 g |
| Basic compound or proton acceptor group-containing compound | 0.0393 g |
| Surfactant | 0.4020 g |

In the case of using a proton acceptor group-containing group and a basic compound in combination, the proton acceptor group-containing compound was 0.0196 g, and the basic compound was 0.0196 g.

[Production and Evaluation of Pattern (KrF)]

The positive resist solution prepared above was uniformly coated on a hexamethyldisilazane-treated silicon wafer by using a spin coater and dried under heating at 120° C. for 90 seconds to form a positive resist film having a thickness of 0.4 μm. This resist film was then pattern-exposed using a KrF excimer laser stepper (FPA3000EX-5, manufactured by Canon Inc., wavelength: 248 nm). After the irradiation, the resist film was baked at 110C for 90 seconds, dipped in an aqueous 2.38 mass % tetramethylammonium hydroxide (TMAH) solution for 60 seconds, rinsed with water for 30 seconds and dried. The obtained pattern was evaluated by the following methods.

The resist performances were evaluated as follows. The results are shown in Table 2.

[Remaining of Standing Wave]

The side wall of the resist pattern obtained using a 0.30-μm line-and-space mask pattern was observed through a scanning electron microscope and evaluated on the following 5-step scale.

A: Standing wave was not confirmed at all and the side wall of pattern was very clear.

B: Standing wave was slightly confirmed or the side wall of pattern was uneven.

C: Standing wave was apparently confirmed.

D: Slightly strong standing wave was confirmed.

E: Very strong standing wave was confirmed.

In Examples of the present invention, ratings of B to D were not applied.

[Profile]

The profile of the pattern obtained above was observed through a cross-sectional SEM and evaluated on the following 3-step scale.

1: The profile was rectangular.

2: The profile was nearly rectangular with almost no taper.

3: The profile was apparently tapered.

[Sensitivity]

The cross-sectional profile of the pattern obtained was observed using a scanning electron microscope (S-4300, manufactured by Hitachi, Ltd.). The minimum irradiation energy when resolving a 180-nm line (line:space=1:1) was taken as the sensitivity.

With respect to the compositions used in the comparative examples, since a 180-nm line (line:space=1:1) could not be resolved, the exposure amount when a patter (line:space=1:1) of the line width described in Table 2 was resolved was taken as the sensitivity by arbitrarily varying the size of a patter (line:space=1:1) and an exposure amount.

[Resolving Power]

The limiting resolving power (the line and the space were separated and resolved) with the irradiation dose giving the sensitivity above was taken as the resolving power.

The component (c) and other components used in Examples and the resins used in Comparative Examples are as follows.

[Organic Basic Compound]

D-1: Dicyclohexylmethylamine

D-2: 2,4,6-Triphenylimidazole

D-3: Tetra-(n-butyl)ammonium hydroxide

D-4: Compound shown below.

D-4

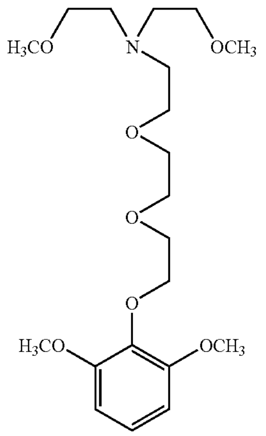

[Other Components (Surfactant)]

W-1: Fluorine-containing surfactant PF6320 (produced by OMNOVA)

W-2: Fluorine/silicon-containing surfactant Megafac R08 (produced by Dainippon Ink & Chemicals, Inc.)

W-3: Silicon-containing surfactant Polysiloxane Polymer KP-341 (produced by Shin-Etsu Chemical Co., Ltd.)

C-1

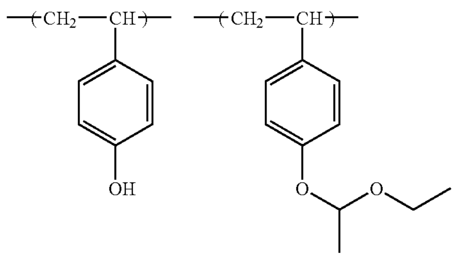

terminal:

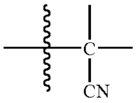

C-1: Compositional molar ratio: 65/35, weight average molecular weight: 9,500, and dispersity: 1.15.

C-2

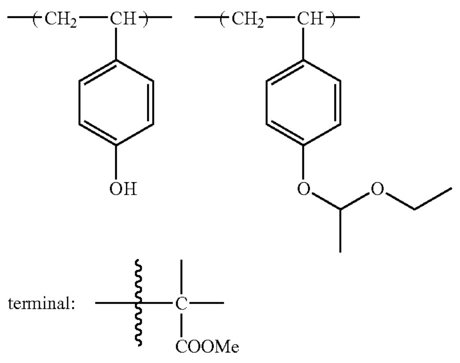

C-2: Compositional molar ratio: 65/35, weight average molecular weight: 9,000, and dispersity: 1.20.

It is seen from the results in Table 2 that even when the resist composition of the present invention is coated directly on a substrate having a high-reflection surface without applying an antireflection film, generation of standing waves is remarkably suppressed and the profile, sensitivity and resolving power all are excellent.

The positive resist composition of the present invention comprises a resin having at the main chain terminal thereof a group having absorption at 248 nm and by virtue of this construction, excellent effects, that is, substantially no generation of a standing wave, good profile, high sensitivity and high resolution, are provided.

The entire disclosure of each and every foreign patent application from which the benefit of foreign priority has been claimed in the present application is incorporated herein by reference, as if fully set forth.

TABLE 2

| | | Composition | | | | | Evaluation | | | |
|---|---|---|---|---|---|---|---|---|---|---|
| | | Resin | Acid Generator | Proton Acceptor Group-Containing Compound | Basic Compound | Surfactant | Sensitivity (mJ/cm$^2$) | Resolution (nm) | Remaining of Standing Wave | Pattern Profile |
| Example | 1 | J-1 | B-85 | PA-74 | none | W-1 | 18 | 110 | A | 1 |
| | 2 | J-2 | B-81 | PA-74 | none | W-2 | 18 | 110 | A | 1 |
| | 3 | J-3 | B-16 | PA-74 | none | W-3 | 20 | 110 | A | 1 |
| | 4 | J-4 | B-10 | PA-74 | none | W-1 | 19 | 120 | A | 1 |
| | 5 | J-5 | B-82 | PA-74 | none | W-2 | 18 | 110 | A | 1 |
| | 6 | J-6 | B-12 | PA-74 | D-1 | W-3 | 19 | 130 | A | 1 |
| | 7 | J-7 | B-48 | PA-74 | D-1 | W-1 | 20 | 120 | A | 1 |
| | 8 | J-8 | B-83 | PA-74 | D-1 | W-2 | 19 | 130 | A | 1 |
| | 9 | J-9 | B-17 | PA-74 | D-2 | W-3 | 20 | 130 | A | 1 |
| | 10 | J-10 | B-38 | PA-74 | D-3 | W-1 | 20 | 120 | A | 1 |
| | 11 | J-11 | B-69 | none | D-1 | W-2 | 16 | 100 | A | 1 |
| | 12 | J-12 | B-58 | none | D-1 | W-3 | 18 | 130 | A | 1 |
| | 13 | J-13 | B-84 | none | D-1 | W-1 | 16 | 100 | A | 1 |
| | 14 | J-14 | B-49 | none | D-2 | W-2 | 21 | 140 | A | 1 |
| | 15 | J-15 | B-23 | none | D-3 | W-3 | 20 | 130 | A | 1 |
| | 16 | J-16 | B-86 | PA-73 | D-1 | W-1 | 18 | 110 | A | 1 |
| | 17 | J-2 | B-87 | PA-50 | D-1 | W-2 | 19 | 120 | A | 1 |
| | 18 | J-4 | B-88 | PA-56 | D-1 | W-3 | 20 | 110 | A | 1 |
| | 19 | J-6 | B-89 | PA-64 | D-2 | W-1 | 20 | 130 | A | 1 |
| | 20 | J-8 | B-90 | PA-94 | D-3 | W-2 | 19 | 120 | A | 1 |
| | 21 | J-10 | B-91 | PA-66 | D-1 | W-3 | 17 | 120 | A | 1 |
| | 22 | J-11 | B-78 | PA-68 | D-1 | W-1 | 21 | 110 | A | 1 |
| | 23 | J-12 | B-80 | PA-72 | D-1 | W-2 | 18 | 100 | A | 1 |
| | 24 | J-14 | B-79 | PA-32 | D-2 | W-3 | 18 | 120 | A | 1 |
| | 25 | J-16 | B-84 | PA-8 | D-1 | W-1 | 19 | 110 | A | 1 |
| | 26 | J-1 | B-92 | none | D-4 | W-1 | 19 | 120 | A | 1 |
| | 27 | J-6 | B-93 | none | D-1 | W-2 | 20 | 120 | A | 1 |
| | 28 | J-7 | B-94 | none | D-4 | W-1 | 20 | 110 | A | 1 |
| | 29 | J-2 | B-95 | none | D-2 | W-1 | 19 | 120 | A | 1 |
| | 30 | J-7 | B-96 | none | D-3 | W-1 | 19 | 110 | A | 1 |
| | 31 | J-6 | B-97 | PA-74 | D-4 | W-3 | 19 | 130 | A | 1 |
| | 32 | J-2 | B-98 | PA-73 | D-1 | W-1 | 20 | 120 | A | 1 |
| | 33 | J-1 | B-99 | PA-66 | D-4 | W-1 | 19 | 130 | A | 1 |
| | 34 | J-17 | B-92 | none | D-4 | W-1 | 20 | 120 | A | 1 |
| | 35 | J-18 | B-84 | none | D-1 | W-1 | 21 | 120 | A | 1 |
| | 36 | J-19 | B-90 | none | D-4 | W-1 | 21 | 110 | A | 1 |
| | 37 | J-20 | B-58 | none | D-1 | W-1 | 22 | 100 | A | 1 |
| | 38 | J-21 | B-99 | none | D-1 | W-1 | 20 | 110 | A | 1 |
| Comparative | 1 | C-1 | B-84 | PA-8 | D-1 | W-1 | 40 | 230 | E | 3 |
| Example | 2 | C-1 | B-84 | none | D-1 | W-1 | 42 | 250 | E | 3 |
| | 3 | C-1 | B-84 | PA-8 | none | W-1 | 41 | 240 | E | 3 |
| | 4 | C-2 | B-84 | PA-8 | D-1 | W-1 | 39 | 230 | E | 3 |
| | 5 | C-2 | B-84 | none | D-1 | W-1 | 39 | 250 | E | 3 |
| | 6 | C-2 | B-84 | PA-8 | none | W-1 | 40 | 240 | E | 3 |

What is claimed is:

1. A positive resist composition, comprising:

(A) a resin that has a group having absorption at 248 nm at a main chain terminal of the resin (A), the main chain terminal of the resin (A) being represented by formula (M'-1):

(M'-1)

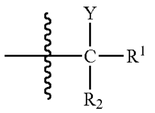

wherein $R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Y represents a group having absorption at 248 nm and comprises:

(i) at least a hetero ring; or (ii) two or more benzene rings, wherein the resin (A) decomposes under an action of an acid to increase a solubility of the resin (A) in an alkali developer.

2. The positive resist composition according to claim 1, which further comprises:

(C) an organic basic compound.

3. The positive resist composition according to claim 1, which further comprises:

(D) a surfactant.

4. The positive resist composition according to claim 1, which further comprises:

a solvent.

5. The positive resist composition according to claim 1, which is exposed by an irradiation with KrF, electron beam, X-ray or EUV.

6. A positive resist composition, comprising:

(A) a resin that has a group having absorption at 248 nm at a main chain terminal of the resin (A), the main chain terminal of the resin (A) being represented by formula (M'-1):

(M'-1)

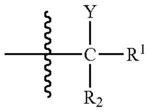

wherein $R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Y represents a group having absorption at 248 nm and comprises:

(i) at least a hetero ring; or (ii) two or more benzene rings;

wherein the resin (A) contains at least one of a repeating unit represented by formula (A1) and a repeating unit represented by formula (A2):

(A1)

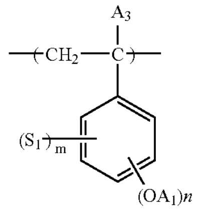

(A2)

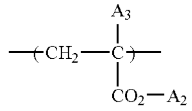

wherein in formula (A1), n represents an integer of 0 to 5, m represents an integer of 0 to 5, provided that m+n<5;

$A_1$ represents a hydrogen atom or a group containing a group capable of decomposing under an action of an acid, and when a plurality of $A_1$'s are present, the plurality of $A_1$'s may be the same or different; and $S_1$ represents a substituent, and when a plurality of $S_1$'s are present, the plurality of $S_1$'s may be the same or different;

in formula (A2), $A_2$ represents a group containing a group capable of decomposing under an action of an acid; and in formulae (A1) and (A2), $A_3$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

7. A positive resist composition, comprising:

(A) a resin that has a group having absorption at 248 nm at a main chain terminal of the resin (A), the main chain terminal of the resin (A) being represented by formula (M'-1):

(M'-1)

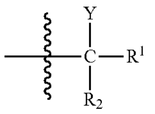

wherein $R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Y represents a group having absorption at 248 nm and comprises:

at least a hetero ring; or (ii) two or more benzene rings; and (B) a compound capable of generating an acid upon irradiation with actinic rays or radiation.

8. A positive resist composition, comprising:

(A) a resin that has a group having absorption at 248 nm at a main chain terminal of the resin (A), the main chain terminal of the resin (A) being represented by formula (M'-1):

(M'-1)

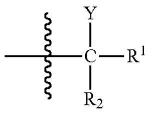

wherein $R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Y represents a group having absorption at 248 nm and comprises:

(i) at least a hetero ring; or (ii) two or more benzene rings; and a compound having a proton acceptor functional group and undergoing decomposition upon irradiation with actinic rays or radiation to generate a compound reduced in or deprived of a proton acceptor property or changed to be acidic from being proton acceptor-functioning.

9. A pattern forming method, comprising:

forming a resist film from a positive resist composition, comprising:

(A) a resin that has a group having absorption at 248 nm at a main chain terminal of the resin (A), the main chain terminal of the resin (A) being represented by formula (M'-1):

(M'-1)

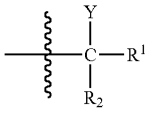

wherein $R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group,a carboxyl group, an alkyloxycarbonyl group, an alkylcarbonyloxy group or an aralkyl group; and Y represents a group having absorption at 248 nm and comprises:

(i) at least a hetero ring; or (ii) two or more benzene rings; and exposing and developing the resist film.

10. A positive resist composition, comprising:

(A) a resin that has a group having absorption at 248 nm at a main chain terminal of the resin (A), the main chain terminal of the resin (A) being represented by formula (M'-1):

(M'-1)

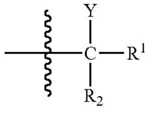

wherein $R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Y represents a group having absorption at 248 nm and comprises:

two or more benzene rings and the structure of two or more benzene rings is selected from the group consisting of naphthalene, anthracene, a biphenyl structure, a diphenylether structure and a terphenyl structure.

11. A positive resist composition, comprising:

(A) a resin that has a group having absorption at 248 nm at a main chain terminal of the resin (A), the main chain terminal of the resin (A) being represented by formula (M'-2):

(M'-2)

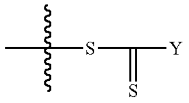

wherein Y represents a group having absorption at 248 nm and comprises:

(i) at least one benzene ring having a substituent represented by any one of formulae (a), (b) and (e):

(a)

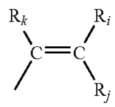

(b)

$—C≡C—R_i$ (e)

$—NO_2$ wherein,$R_i$, $R_j$, $R_k$, and $R_l$ which may be the same or different and may have a substituent, each represents an alkyl group, an alkoxy group, an acyl group, an acyloxy group, an aryl group, an aryloxy group, an aralkyl group, an aralkyloxy group, a hydroxy group, a halogen atom, a cyano group, a nitro group, a sulfonylamino group, an alkylthio group, an arylthio group, or an aralkylthio group; or (ii) anthracene, or a terphenyl structure;

wherein the resin (A) decomposes under an action of an acid to increase a solubility of the resin (A) in an alkali developer.

12. The positive resist composition according to claim 11, wherein Y comprises (i) at least one benzene ring having a substituent represented by any one of the formulae (a), (b) and (e):

(a)

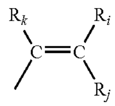

(b)

$—C≡C—R_i$

-continued (e)

$-NO_2$ wherein, $R_i$, $R_j$, $R_k$, and $R_l$ which may be the same or different and may have a substituent, each represents an alkyl group, an alkoxy group, an acyl group, an acyloxy group, an aryl group, an aryloxy group, an aralkyl group, an aralkyloxy group, a hydroxy group, a halogen atom, a cyano group, a nitro group, a sulfonylamino group, an alkylthio group, an arylthio group, or an aralkylthio group.

13. The positive resist composition according to claim 12, wherein the resin (A) contains at least one of a repeating unit represented by formula (A1) and a repeating unit represented by formula (A2):

(A1)

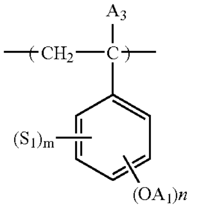

(A2)

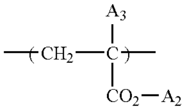

wherein in formula (A1), n represents an integer of 0 to 5, m represents an integer of 0 to 5, provided that m+n<5;

$A_1$ represents a hydrogen atom or a group containing a group capable of decomposing under an action of an acid, and when a plurality of $A_1$'s are present, the plurality of $A_1$'s may be the same or different; and $S_1$ represents a substituent, and when a plurality of $S_1$'s are present, the plurality of $S_1$'s may be the same or different;

in formula (A2), $A_2$ represents a group containing a group capable of decomposing under an action of an acid; and in formulae (A1) and (A2), $A_3$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

14. The positive resist composition according to claim 12, which further comprises:

(B) a compound capable of generating an acid upon irradiation with actinic rays or radiation.

15. The positive resist composition according to claim 12, which further comprises:

a compound having a proton acceptor functional group and undergoing decomposition upon irradiation with actinic rays or radiation to generate a compound reduced in or deprived of a proton acceptor property or changed to be acidic from being proton acceptor-functioning.

16. A pattern forming method, comprising:

forming a resist film from the positive resist composition according to claim 12; and exposing and developing the resist film.

17. A positive resist composition, comprising:

(A) a resin that has a group having absorption at 248 nm at a main chain terminal of the resin (A), the main chain terminal of the resin (A) being represented by any of formulae (M'-3) to (M'-5):

(M'-3)

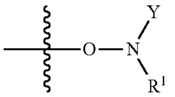

(M'-4)

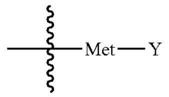

(M'-5)

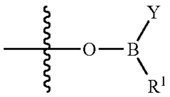

wherein Y represents a group having absorption at 248 nm;

$R^1$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Met represents a metal atom.

18. A pattern forming method, comprising:

forming a resist film from the positive resist composition according to claim 17; and exposing and developing the resist film.

19. A positive resist composition, comprising:

(A) a resin that has a group having absorption at 248 nm at a main chain terminal of the resin (A), the main chain terminal of the resin (A) being represented by formula (M'-1):

(M'-1)

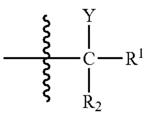

wherein $R^1$ and $R^2$ each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group; and Y represents a group having absorption at 248 nm and comprises:

at least one benzene ring having a substituent represented by any one of formulae (a) to (e):

(a)

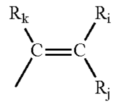

(b)

$-C\equiv C-R_l$

-continued (c)

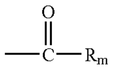

(d)

—CN (e)

—$NO_2$ wherein, $_i$, $R_j$, $R_k$, $R_l$ and $R_m$, which may be the same or different and may have a substituent, each represents an alkyl group, an alkoxy group, an acyl group, an acyloxy group, an aryl group, an aryloxy group, an aralkyl group, an aralkyloxy group, a hydroxy group, a halogen atom, a cyano group, a nitro group, a sulfonylamino group, an alkylthio group, an arylthio group, or an aralkylthio group, wherein the resin (A) decomposes under an action of an acid to increase a solubility of the resin (A) in an alkali developer.

20. The positive resist composition according to claim 19, wherein the resin (A) contains at least one of a repeating unit represented by formula (A1) and a repeating unit represented by formula (A2):

(A1)

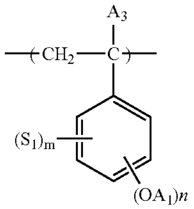

-continued (A2)

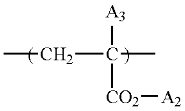

wherein in formula (A1), n represents an integer of 0 to 5, m represents an integer of 0 to 5, provided that m+n ≦5;

$A_1$ represents a hydrogen atom or a group containing a group capable of decomposing under an action of an acid, and when a plurality of $A_1$'s are present, the plurality of $A_1$'s may be the same or different; and $S_1$ represents a substituent, and when a plurality of $S_1$'s are present, the plurality of $S_1$'s may be the same or different;

in formula (A2), $A_2$ represents a group containing a group capable of decomposing under an action of an acid; and in formulae (A1) and (A2), $A_3$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

21. A pattern forming method, comprising:

forming a resist film from the positive resist composition according to claim 19; and exposing and developing the resist film.

* * * * *